(12) United States Patent
Matsushita et al.

(10) Patent No.: US 7,863,119 B2
(45) Date of Patent: Jan. 4, 2011

(54) SEMICONDUCTOR DEVICE AND METHOD FOR MANUFACTURING THE SAME

(75) Inventors: Daisuke Matsushita, Hiratsuka (JP); Yuuichiro Mitani, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 155 days.

(21) Appl. No.: 12/200,467

(22) Filed: Aug. 28, 2008

(65) Prior Publication Data
US 2009/0184401 A1 Jul. 23, 2009

(30) Foreign Application Priority Data
Jan. 22, 2008 (JP) .............................. 2008-011308

(51) Int. Cl.
*H01L 21/00* (2006.01)
(52) U.S. Cl. ..................................... 438/162
(58) Field of Classification Search ............... None
See application file for complete search history.

(56) References Cited

U.S. PATENT DOCUMENTS

| | | | |
|---|---|---|---|
| 6,087,229 A | 7/2000 | Aronowitz et al. | |
| 6,261,976 B1 | 7/2001 | Dong | |
| 7,091,110 B2 * | 8/2006 | Ohnuma | 438/471 |
| 7,183,229 B2 * | 2/2007 | Yamanaka | 438/795 |
| 7,232,715 B2 * | 6/2007 | Arao et al. | 438/166 |
| 7,442,592 B2 * | 10/2008 | Ichijo et al. | 438/162 |
| 2007/0018231 A1 | 1/2007 | Mitani et al. | |

FOREIGN PATENT DOCUMENTS

| | | |
|---|---|---|
| JP | 2007-059872 | 3/2007 |
| JP | 2007-123825 | 5/2007 |

OTHER PUBLICATIONS

Office Action issued by the Chinese Patent Office on Feb. 5, 2010, for Chinese Application No. 200910004862.0 and English translation thereof.

* cited by examiner

*Primary Examiner*—Charles D Garber
*Assistant Examiner*—Andre' C Stevenson
(74) *Attorney, Agent, or Firm*—Finnegan, Henderson, Farabow, Garrett & Dunner, L.L.P.

(57) ABSTRACT

It is made possible to provide a method for manufacturing a semiconductor device that has a high-quality insulating film in which defects are not easily formed, and experiences less leakage current. A method for manufacturing a semiconductor device, includes: forming an amorphous silicon layer on an insulating layer; introducing oxygen into the amorphous silicon layer; and forming a silicon oxynitride layer by nitriding the amorphous silicon layer having oxygen introduced thereinto.

11 Claims, 35 Drawing Sheets

SEMICONDUCTOR DEVICE AND METHOD FOR MANUFACTURING THE SAME

CROSS-REFERENCE TO RELATED APPLICATION

This application is based upon and claims the benefit of priority from prior Japanese Patent Application No. 2008-11308 filed on Jan. 22, 2008 in Japan, the entire contents of which are incorporated herein by reference.

BACKGROUND OF THE INVENTION

1. Field of the Invention

The present invention relates to a semiconductor device and a method for manufacturing the semiconductor device.

2. Related Art

Flash memories that are nonvolatile memories, especially NAND flash memories, have been vigorously developed as still-image recording media and high-quality audio recording media, since such flash memories can be readily made smaller in size, and can be provided with a large amount of memory at low costs. Furthermore, such flash memories are shock-resistant. As a result, there is now a big market for flash memories.

Each memory cell used in a NAND flash memory has a gate structure on a semiconductor substrate. In this gate structure, a tunnel insulating film, a charge storage film, an interelectrode insulating film, and a control electrode are stacked in this order. The gate structure may be of a floating gate type (FG type) having a floating gate electrode made of polysilicon to be the charge storage film on the tunnel insulating film, a MONOS (Metal-Oxide-Nitride-Oxide-Silicon) type having a charge trapping film made of silicon nitride to be the charge storage film, or a SONOS (Silicon-Oxide-Nitride-Oxide-Silicon) type having the charge storage film made of a nitride and the control electrode made of silicon.

The threshold voltage of each memory cell can be varied in the following manner. By controlling the voltage (control voltage) to be applied to the control electrode formed on the floating gate or the charge trapping film via the interelectrode insulating film, electrons are injected (written) from the substrate into the floating gate electrode or the charge trapping film via the tunnel insulating film through FN (Fowler-Nordheim) tunneling, or electrons are pulled out of the floating gate electrode via the tunnel insulating film (erasing in the FG, MONOS, or SONOS type). Also, holes are injected into the charge trapping film, so that the holes and electrons annihilate each other (auxiliary erasing in the MONOS/SONOS type). However, as the tunnel insulating film has become thinner in the trend of miniaturization, attention is now drawn to one serious problem.

To achieve a larger amount of memory, reducing the device size (the memory cell size) is the most effective, but the tunnel insulating film needs to be thinner at the same time. $SiO_2$ film that is widely used as the tunnel insulating film characteristically experiences more leakage current particularly in a low-field region, called SILC (stress Induced Leakage Current), via the trapping center existing in the $SiO_2$ film, due to application of a stress voltage as well as the smaller film thickness. As a result, the amount of charges passing through the $SiO_2$ film increases, and the data retention properties are degraded. The time elapsed before the charge amount reaches a destructive value becomes shorter accordingly, or the rewriting performance is degraded. The SILC hinders a reduction of the $SiO_2$ film thickness, and deteriorates the reliability, resulting in great difficulties in miniaturization. Unless this trapping center is reduced, a larger amount of memory cannot be expected by reducing the film thickness of the $SiO_2$ film.

As described above, as a known cause of degradation of the characteristics of the $SiO_2$ film, an interface layer made of $SiO_2$ in an amorphous state is formed between the semiconductor substrate and the $SiO_2$ film, and oxygen defects always exist in the amorphous $SiO_2$. This results in various traps and leakage sites.

Dangling bond of Si at $SiO_2$/Si interface is normally terminated with hydrogen. However, the hydrogen is detached from the dangling bond of Si by electrons or holes during a rewriting operation, and does not provide a fundamental solution. It has been known that terminating a dangling bond of Si with deuterium is effective, but it remains unclear whether the use of deuterium is effective at the $SiO_2$/Si interface.

As a solution to the problem, the following method has been suggested. Nitrogen is introduced into the $SiO_2$ film to be the tunnel insulating film, so as to increase the dielectric constant and the physical film thickness, and reduce the leakage current. However, the effect of this method is not sufficient, and the thinnest possible film thickness is not as thin as expected. This is because the defect formation due to the insufficient Si—N network is not appropriately restricted.

To counter this problem, there has been a structure in which a three-layer structure having a high-quality silicon nitride film interposed between silicon oxide films is used as the tunnel insulating film that does not easily allow defect formation, and the silicon nitride film has three-coordinate nitrogen bonds (see JP-A 2007-059872(KOKAI)). To form the insulating film having the stacked structure formed with a $SiO_2$ layer, a SiN layer, and a $SiO_2$ layer, the following method is known. After a $SiO_2$ layer is formed on a Si substrate, amorphous Si is deposited and is nitrided to form a nitride layer made of SiN. The nitride layer is then oxidized, or an oxide layer is deposited by CVD.

However, as a result of a study made by the inventor, the following problems were found with the above method. 1) If nitridation is performed at a high temperature, the amorphous Si is crystallized and agglomerated to form a grain boundary, and the layer thickness of the Si layer fluctuates. 2) The concentration of hydrogen remaining in the amorphous Si might become high. In the case of the problem 1), if the $SiO_2$ layers are thin, nitrogen penetrates through the lower $SiO_2$ film, and defects are formed at the interface between the $SiO_2$ layer and the Si substrate. When a current flows from the Si substrate to the control electrode, not only the amount of current in the low electric field or the medium electric field increases, but also the insulating properties are severely degraded due to a local decrease in the layer thickness of the nitride layer in a worst case scenario. In the case of the problem 2), the reliability deteriorates.

SUMMARY OF THE INVENTION

The present invention has been made in view of these circumstances, and an object thereof is to provide a semiconductor device that has a high-quality insulating film in which defects are not easily formed, and experiences less leakage current. Another object is to provide a method for manufacturing such a semiconductor device.

A method for manufacturing a semiconductor device according to a first aspect of the present invention, includes: forming an amorphous silicon layer on an insulating layer; introducing oxygen into the amorphous silicon layer; and forming a silicon oxynitride layer by nitriding the amorphous silicon layer having oxygen introduced thereinto.

A semiconductor device according to a second aspect of the present invention, includes an insulating film, the insulating film including: a first silicon oxide layer formed on a silicon substrate; a silicon oxynitride layer formed on the first silicon oxide layer and having average oxygen concentration in the range of 10 atomic % to 30 atomic %; and a second silicon oxide layer formed on the silicon oxynitride layer.

A semiconductor device according to a third aspect of the present invention, includes an insulating film, the insulating film including: a first silicon oxynitride layer formed on a silicon substrate and having average nitrogen concentration higher than 0 atomic % but not higher than 10 atomic %; a second silicon oxynitride layer formed on the first silicon oxynitride layer and having average oxygen concentration in the range of 10 atomic % to 30 atomic %; and a silicon oxide layer formed on the second silicon oxynitride layer.

BRIEF DESCRIPTION OF THE DRAWINGS

FIGS. 1(a) to 4(b) are cross-sectional views illustrating procedures for manufacturing a semiconductor device according to a first embodiment;

FIGS. 12(a) to 15(b) are cross-sectional views illustrating the procedures for manufacturing a semiconductor device according to a second embodiment;

FIGS. 18(a) to 21(b) are cross-sectional views illustrating the procedures for manufacturing a semiconductor device according to a third embodiment;

FIGS. 23(a) to 26(b) are cross-sectional views illustrating the procedures for manufacturing a semiconductor device according to a fourth embodiment;

FIGS. 29(a) to 32(b) are cross-sectional views illustrating the procedures for manufacturing a semiconductor device according to a fifth embodiment;

DETAILED DESCRIPTION OF THE INVENTION

Figure 1:
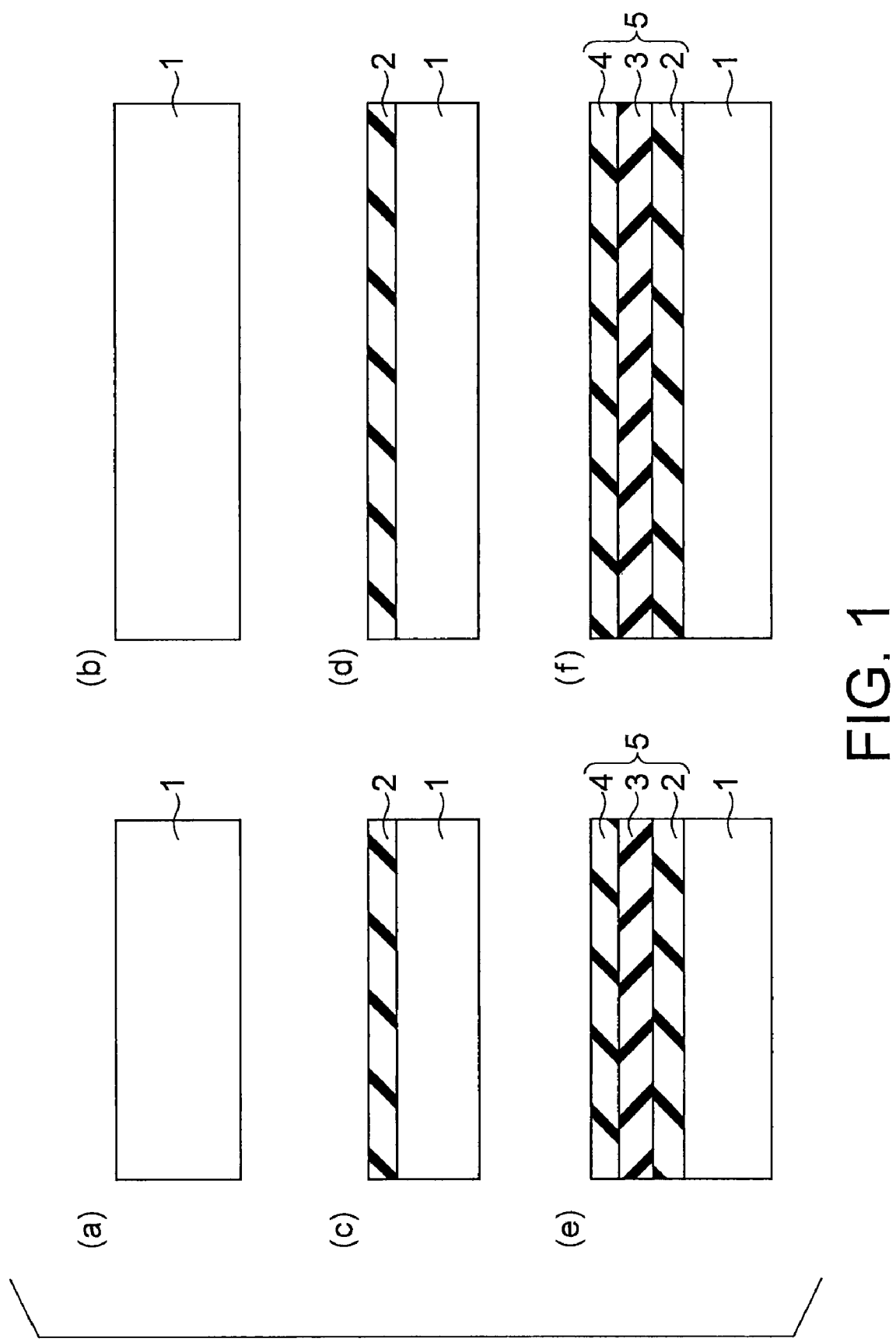
Figure 2:
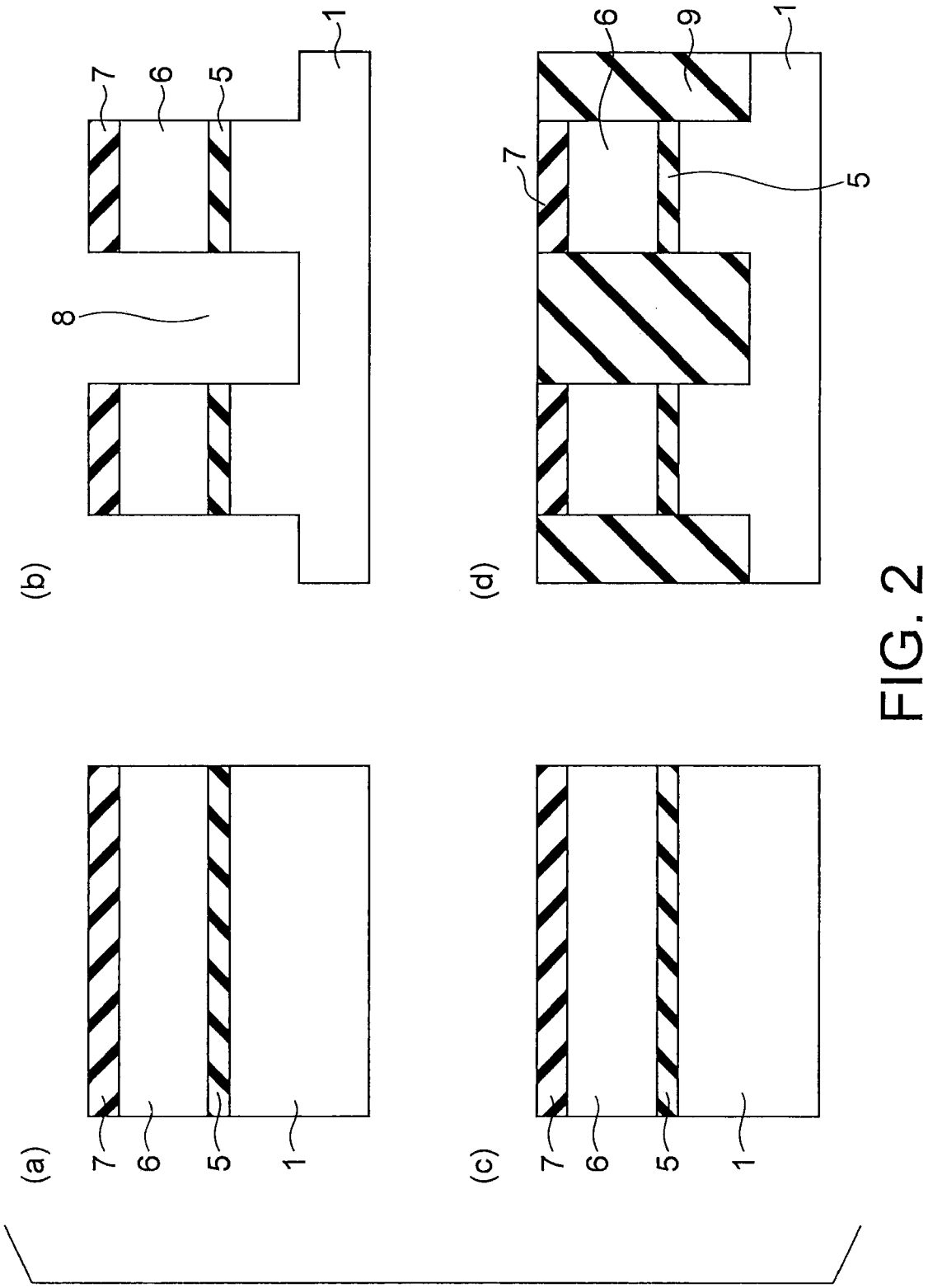
Figure 3:
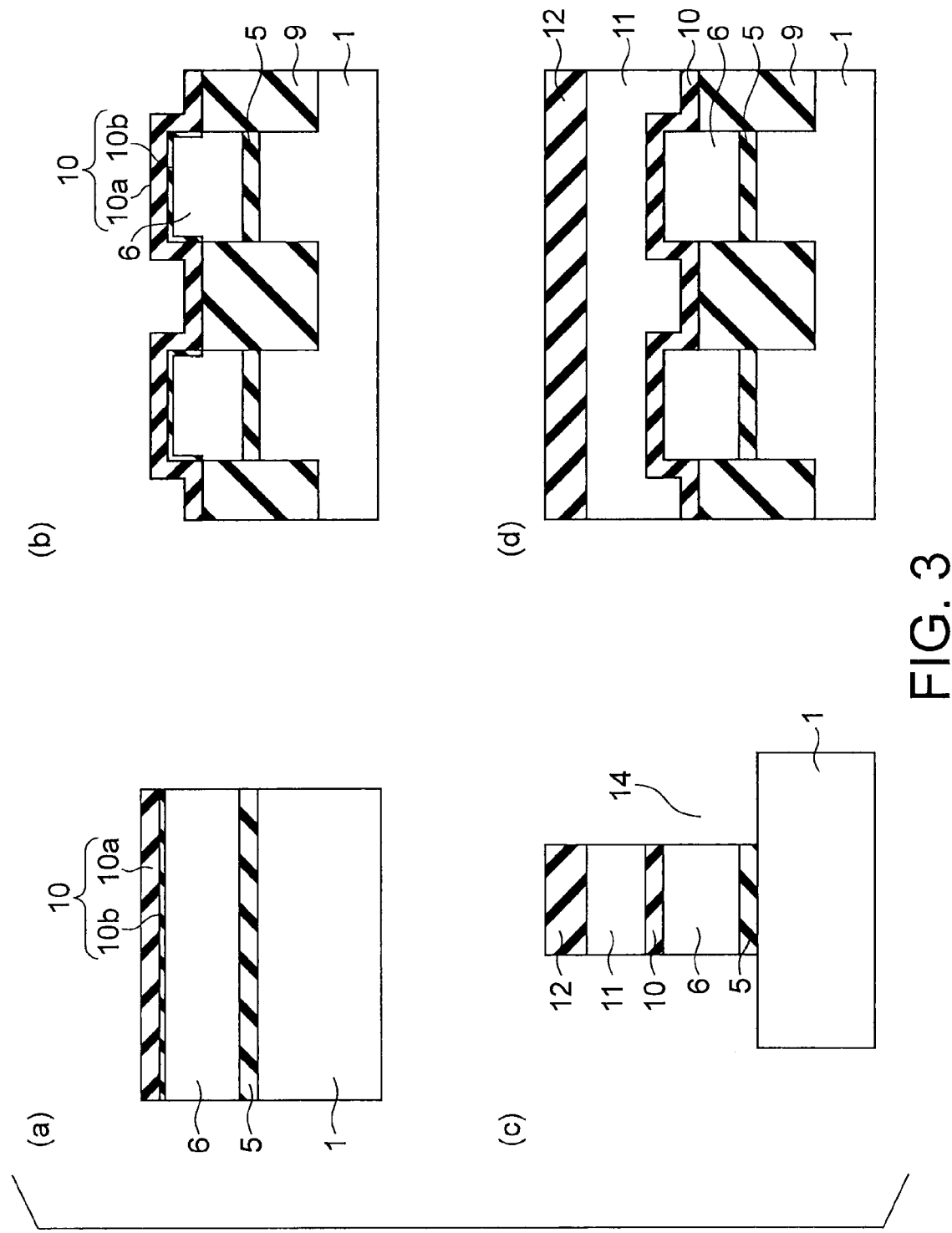
Figure 4:
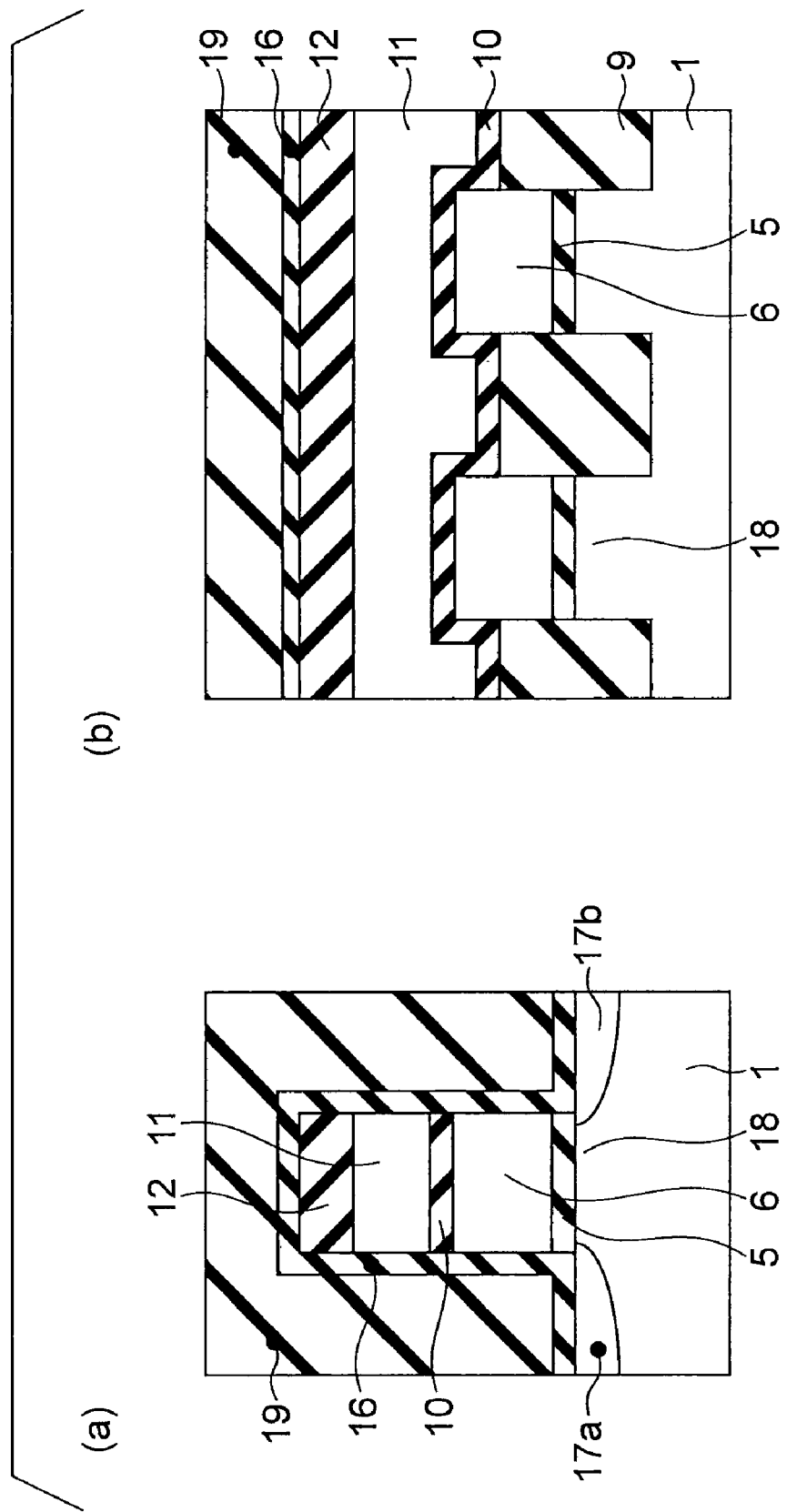

The following is a description of embodiments of the present invention, with reference to the accompanying drawings.

First Embodiment

Referring to FIGS. 1(a) to 4(b), a method for manufacturing a semiconductor device in accordance with a first embodiment of the present invention is described. FIGS. 1(a), 1(c), 1(e), 2(a), 2(c), 3(a), 3(c), and 4(a) are cross-sectional views that are taken perpendicularly to the cross-sectional views of FIGS. 1(b), 1(d), 1(f), 2(b), 2(d), 3(b), 3(d), and 4(b).

A semiconductor device manufactured by the manufacturing method in accordance with this embodiment is a FG (floating gate) nonvolatile semiconductor memory that includes memory cells arranged in a matrix fashion. As shown in FIGS. 4(a) and 4(b), each of the memory cells includes: source and drain regions 17a and 17b that are formed at a distance from each other on a silicon substrate 1; a tunnel insulating film 5 that is formed on a region 18 of the silicon substrate 1 located between the source region 17a and the drain region 17b to be channel; a floating gate electrode 6 that is formed on the tunnel insulating film 5 and serves as a charge storage film having charges stored therein; an interelectrode insulating film 10 that is formed on the floating gate electrode 6; and a control gate electrode 11 that is formed on the interelectrode insulating film 10.

Next, the method for manufacturing the semiconductor device in accordance with this embodiment is described.

First, as shown in FIGS. 1(a) and 1(b), the silicon substrate 1 doped with desired impurities is subjected to diluted hydrofluoric acid treatment, so as to terminate the surface of the silicon substrate 1 with hydrogen. After that, the silicon substrate 1 is left in the chamber of a film forming device (not shown). The chamber is filled only with a gas (such as a nitrogen gas) that does not react with or etch silicon during the manufacturing process. The temperature of the silicon substrate 1 is then heated to 700° C., so as to completely detach the hydrogen from the silicon substrate 1.

The chamber is then filled with a $N_2$ gas having a partial pressure of 30 Torr and an $O_2$ gas having a partial pressure of 3 Torr, for example. The surface of the silicon substrate 1 is heated to 1050° C., and is maintained at that temperature for ten seconds. In this manner, a silicon oxide layer 2 is formed on the silicon substrate 1, as shown in FIGS. 1(c) and 1(d).

An amorphous silicon layer of 2 nm in thickness is then deposited on the silicon oxide layer 2 with the use of a disilane gas. It is preferable that the temperature of the silicon substrate 1 at this point is 550° C. or lower. The atmosphere at the time of deposition of the amorphous silicon layer 3 may contain oxygen, NO, or $N_2O$. If the atmosphere contains NO or $N_2O$ in this case, the resultant amorphous silicon layer contains a small amount of nitrogen. The temperature of the silicon substrate 1 is set at 750° C., and the atmosphere in the chamber is changed to a $N_2$ gas having a partial pressure of 30 Torr and an $O_2$ gas having a partial pressure of 3 Torr, for example. These conditions are maintained for ten seconds. In this manner, a small amount of oxygen is added to the amorphous silicon layer, and an oxygen-added amorphous silicon layer is formed. After that, the atmosphere in the chamber is changed to a $N_2$ gas having a partial pressure of 30 Torr and a $NH_3$ gas having a partial pressure of 0.03 Torr, for example. The surface of the silicon substrate 1 is then set at 750° C., and is maintained at that temperature for 400 seconds. In this manner, the amorphous silicon layer is nitrided to form a silicon oxynitride layer 3 (see FIGS. 1(e) and 1(f)). By the manufacturing method in accordance with this embodiment, a nitrogen gas $NH_3$ diluted with a $N_2$ gas is used to form the silicon oxynitride layer 3. By diluting the nitrogen gas $NH_3$ with a dilution gas $N_2$, a high-quality silicon oxynitride layer having few defects can be formed. This nitriding technique using $NH_3$ was invented by the inventor of the present invention, and a patent application covering this technique was filed (see JP-A 2007-123825(KOKAI)).

The temperature of the silicon substrate 1 is then set at 750° C. or higher, and a 5-nm thick silicon oxide layer 4 is deposited on the silicon oxynitride layer 3 by the HTO (High Temperature Oxidation) technique. By doing so, the tunnel insulating film 5 including the silicon oxide layer 2, the silicon oxynitride layer 3, and the silicon oxide layer 4 is formed as shown in FIGS. 1(e) and 1(f). It should be noted here that, in the drawings illustrating the manufacturing procedures carried out after this procedure, the tunnel insulating film 5 including the silicon oxide layer 2, the silicon oxynitride layer 3, and the silicon oxide layer 4 is shown as a single-layer tunnel insulating film 5.

A 60-nm thick, phosphorus-doped polycrystalline silicon film 6 to be the floating gate electrode, and a mask material 7 for device isolation are then deposited in this order by the CVD (Chemical Vapor Deposition) technique. After that, etching is performed on the mask material 7, the polycrystalline silicon film 6, and the tunnel insulating film 5 in this order by the RIE (Reactive Ion Etching) technique with the use of a resist mask (not shown). Etching is further performed on the exposed regions of the silicon substrate 1, so as to form device isolation grooves 8 of 100 nm in depth (see FIGS. 2(a) and 2(b)).

A silicon oxide film 9 for device isolation is then deposited on the entire surface, so as to completely fill the device isolation grooves 8. After that, the portion of the silicon oxide film 9 on the surface is removed by the CMP (Chemical Mechanical Polishing) technique, so that the surface is flattened. At this point, the mask material 7 is exposed (see FIGS. 2(c) and 2(d)).

The exposed mask material 7 is selectively removed by etching, and the exposed surface portions of the silicon oxide film 9 are removed by etching with the use of a diluted hydrofluoric acid solution. In this manner, side faces 6a of the polycrystalline silicon film 6 are partially exposed. After that, a 15-nm thick alumina layer 10a is formed on the entire surface by the ALD (Atomic Layer Deposition) technique. Due to the oxidizing agent used in the film formation by ALD, a very thin silicon oxide layer 10b is formed at the interface between the alumina layer 10a and the polycrystalline silicon film 6. As a result, a 16-nm thick interelectrode insulating film 10 having a two-layer structure consisting of the alumina layer 10a and the silicon oxide layer 10b is formed (see FIGS. 3(a) and 3(b)). In FIGS. 3(a) and 3(b), the interelectrode insulating film 10 having the two-layer structure of the silicon oxide layer 10b and the alumina layer 10a is shown as a single-layer interelectrode insulating film 10, instead of a two-layer stacked structure.

A polycrystalline silicon layer is then formed on the interelectrode insulating film 10 by CVD. After that, a tungsten layer is formed on this polycrystalline silicon layer, and a heat treatment is carried out to turn the tungsten layer into a tungsten silicide layer. In this manner, a 100-nm thick conductive film 11 having a two-layer structure consisting of the polycrystalline silicon layer and the tungsten silicide layer is formed (see FIGS. 3(c) and 3(d)). This conductive film 11 serves as the control gate electrode 11. A mask material 12 for RIE is then deposited on the entire surface by CVD. Etching is performed by RIE on the mask material 12, the conductive film 11, the interelectrode insulating film 10, the polycrystalline silicon film 6, and the tunnel insulating film 5 in this order, so as to form the gate having a stacked structure. In this manner, the shape of the gate having the stacked structure is defined, and grooves 14 extending in the word-line direction (the direction in which the control gate electrode 11 extends) are formed on the side of this gate having the stacked structure (see FIGS. 3(c) and 3(d)).

As shown in FIGS. 4(a) and 4(b), a silicon oxide film 16 is then formed on the side faces and the upper face of the gate having the stacked structure by a thermal oxidation technique. After that, the source and drain regions 17a and 17b are formed by an ion injection technique. The region of the silicon substrate 1 located between the source region 17a and the drain region 17b is the channel region 18. Further, an interlayer insulating film 19 is formed to cover the entire surface by CVD. After that, a wiring layer and the likes are formed by known techniques, so as to complete the nonvolatile semiconductor memory (see FIGS. 4(a) and 4(b)).

Figure 5:
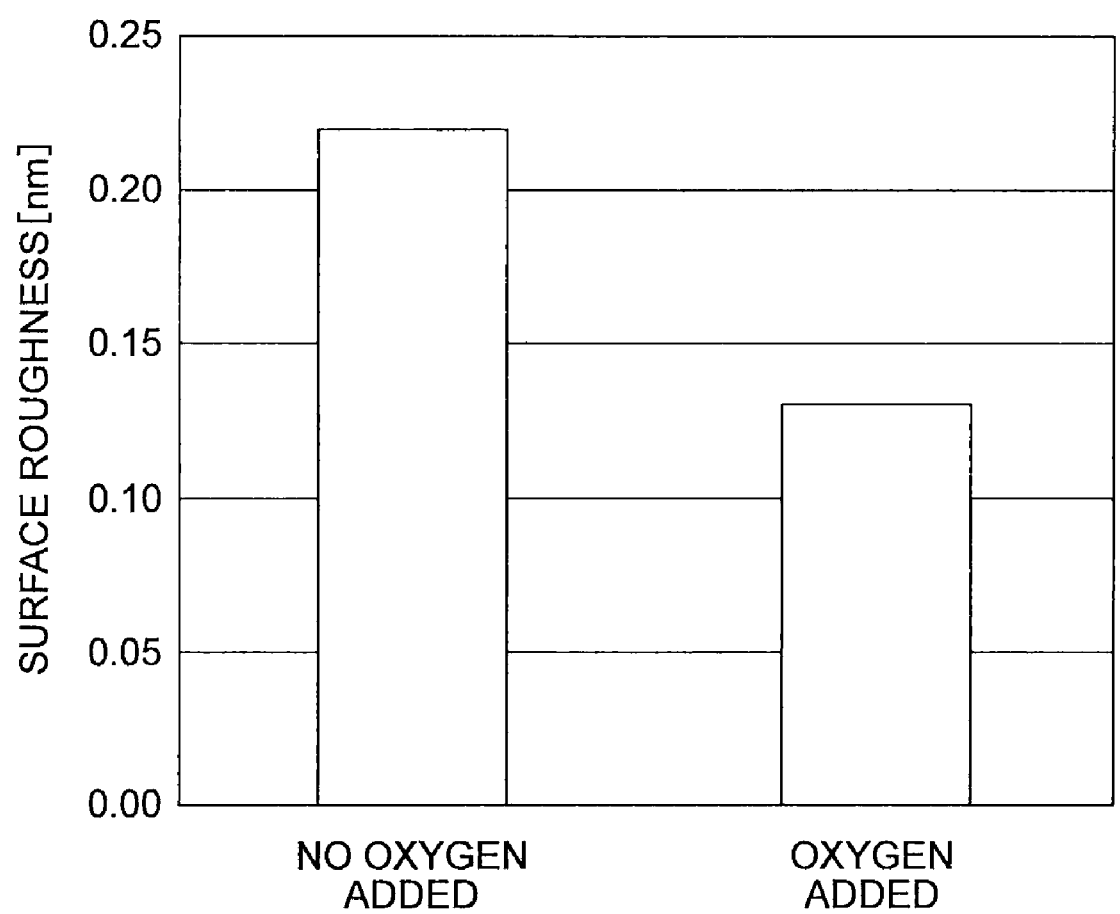
FIG. 5 shows the variations in the surface roughness after the amorphous silicon layer is nitrided in the first embodiment with respect to a case where oxygen is added and a case where oxygen is not added.
Figure 6:
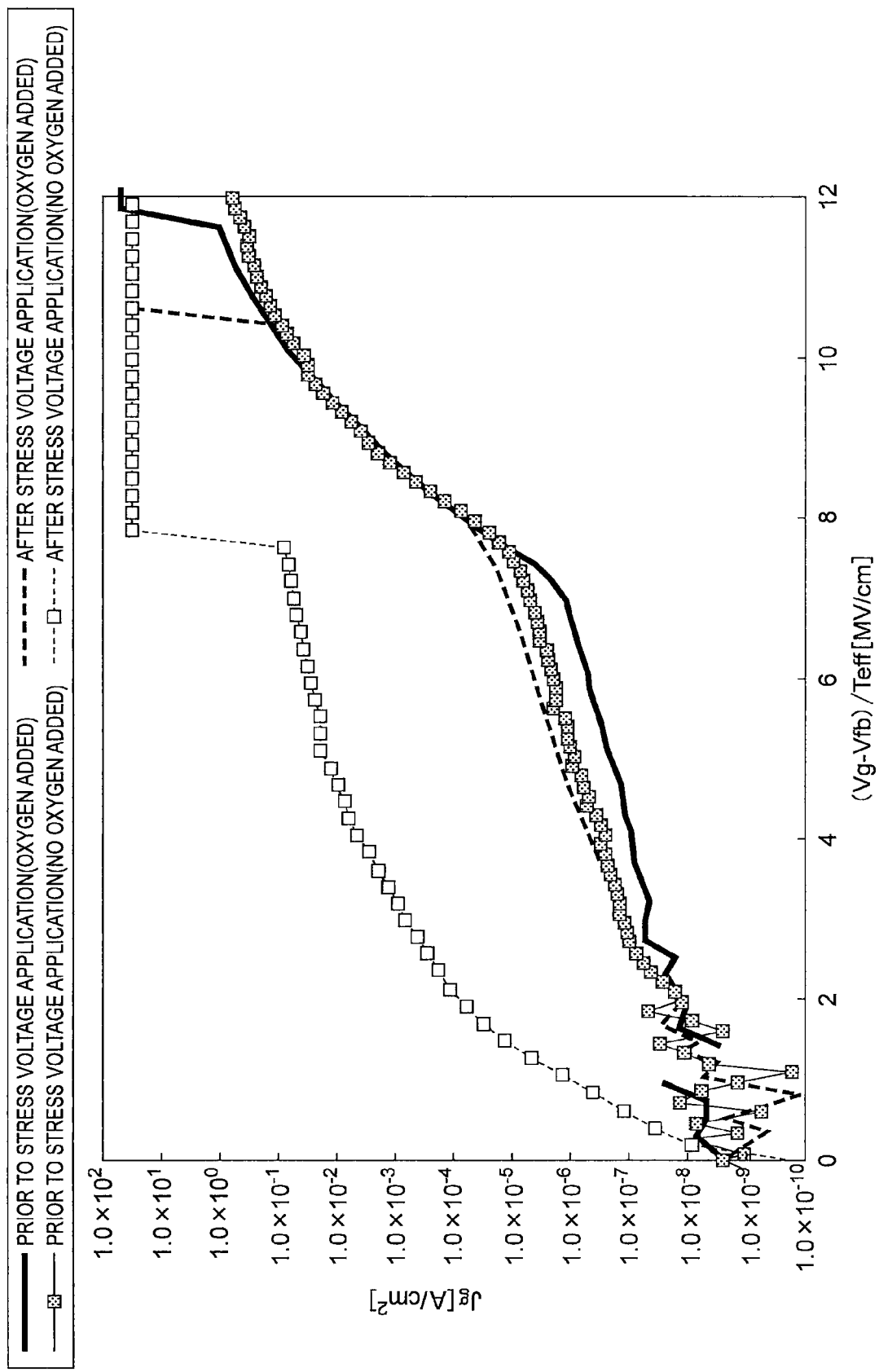
FIG. 6 shows the results of a comparison made on the SILC properties of the stacked structure insulating film formed with a $SiO_2$ layer, a SiON layer, and a $SiO_2$ layer in a case where oxygen is added and a case where oxygen is not added.

The silicon oxynitride layer in the tunnel insulating film 5 formed by performing nitridation after oxygen is added to the amorphous silicon layer has higher flatness and fewer hydrogen radicals. Thus, improvement of not only the charge retention properties but also the reliability can be expected. For example, FIG. 5 shows the variation in the surface roughness under different conditions for forming the silicon oxynitride layer. FIG. 6 shows the variation in the SILC (Stress Induced Leakage Current) properties. More specifically, FIG. 5 shows the surface roughness observed where a silicon nitride layer is formed by performing nitridation directly on an amorphous silicon layer, and the surface roughness observed where a silicon oxynitride layer is formed by performing nitridation after oxygen is added to an amorphous silicon layer. As can be seen from FIG. 5, the surface roughness is reduced by performing the nitridation after oxygen is added to the amorphous silicon. This indicates that agglomeration of the amorphous silicon layer at the time of nitridation is prevented by adding oxygen to the amorphous silicon layer, and the flatness of the silicon oxynitride layer is increased accordingly.

FIG. 6 shows the results of comparisons of SILC properties between a MOS transistor having a gate insulating film of a stacked structure formed with $SiO_2$, SiON, and $SiO_2$, and a MOS transistor having a gate insulating film of a stacked structure formed with $SiO_2$, SiN, and $SiO_2$. As can be seen from FIG. 6, the SILC is reduced by performing the nitridation after oxygen is added to the amorphous silicon layer. This indicates that, as the flatness and the insulation quality are improved, the hydrogen radicals in the amorphous silicon layer are substituted with the oxygen, and the amount of hydrogen radial becomes smaller. In other words, the reliability is improved by performing the nitridation after oxygen is added to the amorphous silicon layer. In FIG. 6, the ordinate axis indicates the leakage current $J_g$, and the abscissa axis indicates the value obtained by dividing the difference between the gate voltage $V_g$ and the flat-band voltage $V_{fb}$ by the electrically effective film thickness $T_{eff}$ of the transistor. This value indicated by the abscissa axis represents the electric field induced in the insulating film. This arrangement is made to eliminate the influence of the fixed charges in the insulating film, and compare the insulating properties at the intensity of the electric field induced in the insulating film. This is because, since the flat-band voltage $V_{fb}$ shifts in accordance with the amount of fixed charges in the film, the electric field induced in the insulating film is wrongly estimated when a comparison is made only in terms of the gate voltage $V_g$. The electrically effective film thickness $T_{eff}$ of the transistor includes not only the electrically effective film thickness of the gate insulating film but also the thickness of the depletion layer in the polysilicon electrode and the thickness of the inversion layer on the side of the semiconductor substrate. When a voltage is applied to a MOS structure, the voltage is applied not only to the gate insulating film but also to the gate electrode and the semiconductor substrate. With the voltage, an inversion layer is formed on the semiconductor substrate side, and a depletion layer is formed on the gate electrode side. These layers are connected as capacitances in series to the capacitance of the gate insulating film. Those series-connected capacitances function as the electrically effective film thickness when the transistor is on.

When oxygen is added to the amorphous silicon layer, it is necessary to pay attention to the temperature, the oxygen partial pressure, the time, the heating-up time, and the timing for introducing oxygen. It is preferable that the temperature is 700° C. or higher, at which hydrogen is detached from the amorphous silicon layer. However, the temperature cannot be too high, and should preferably be 800° C. or lower. Furthermore, it is preferable to supply oxygen while the temperature is rising. This is because movement of the silicon is limited by the oxygen entering the amorphous silicon layer and being coupled with the silicon. This is also because, when the amorphous silicon layer is heated in a vacuum containing no oxygen at a high temperature, agglomeration is formed as the weak bonds in the amorphous silicon layer turn into stable bonds and crystals that lead to an increase in the roughness.

The oxygen partial pressure should preferably be low so as to reduce the oxidation speed and increase the controllability. More preferably, the oxygen partial pressure should be 50 Torr or lower. However, the oxygen partial pressure cannot be too low. If it is too low, an active oxidation region is formed where silicon etching is caused by the oxygen with the low partial pressure. The oxygen partial pressure should preferably be $10^{-4}$ Torr or higher, which is a passive oxidation region where oxidation is caused at 700° C. to 800° C.

The time required for the temperature rise to a point between 700° C. and 800° C. should preferably be 10 seconds or less. If the temperature rise takes long while oxygen is being supplied, the 2-nm thick amorphous silicon layer is completely oxidized before the temperature reaches the target temperature, and a $SiO_2$ layer in which nitrogen is easily diffused is readily formed. Because of this, a large amount of nitrogen penetrates through the amorphous silicon oxide layer and the $SiO_2$ layer below the amorphous silicon oxide layer due to the nitridation caused after that. The Si substrate is then nitrided, and many interface states are formed. Ideally, while oxygen is being supplied, it is preferable that the time required for the temperature to reach a point between 700° C. and 800° C. is ten seconds or less, and the oxidation time at a temperature between 700° C. and 800° C. is ten seconds or less. Within this time limit, the 2-nm thick amorphous silicon layer is not completely oxidized, and nitridation can be performed on the amorphous silicon layer while nitrogen is restrained from penetrating through the amorphous silicon layer.

Further, to prevent complete oxidation of the amorphous silicon layer, and to oxidize the interface at a low temperature so as not to increase the interface state density, oxygen should not be supplied while the temperature is dropping.

Referring now to FIGS. 7 to 11, the relationship between the conditions for adding oxygen to the amorphous silicon layer deposited on the $SiO_2$ layer and the electrical characteristics is described. The silicon nitride layer of the transistor having the stack gate structure consisting of a Si layer, $SiO_2$ layer, the silicon nitride layer, and an Au layer each having substantially the same capacitance C was formed by several different methods, and the electrical characteristics were examined. More specifically, the electrical characteristics were examined with respect to the case where the silicon nitride layer was formed by performing the nitridation after oxygen was added to the amorphous silicon layer at the oxidation temperature of 750° C. and in the oxidation time of ten seconds (in this case, the silicon nitride layer was a silicon oxynitride layer (SiON layer)) as in this embodiment, the case as Comparative Example 1 where the silicon nitride layer was formed by performing the nitridation without oxygen added to the amorphous silicon layer, and the case as Comparative Example 2 where the silicon nitride layer was formed in the same manner as in this embodiment, except that the oxidation temperature was as high as 850° C.

Figure 7:
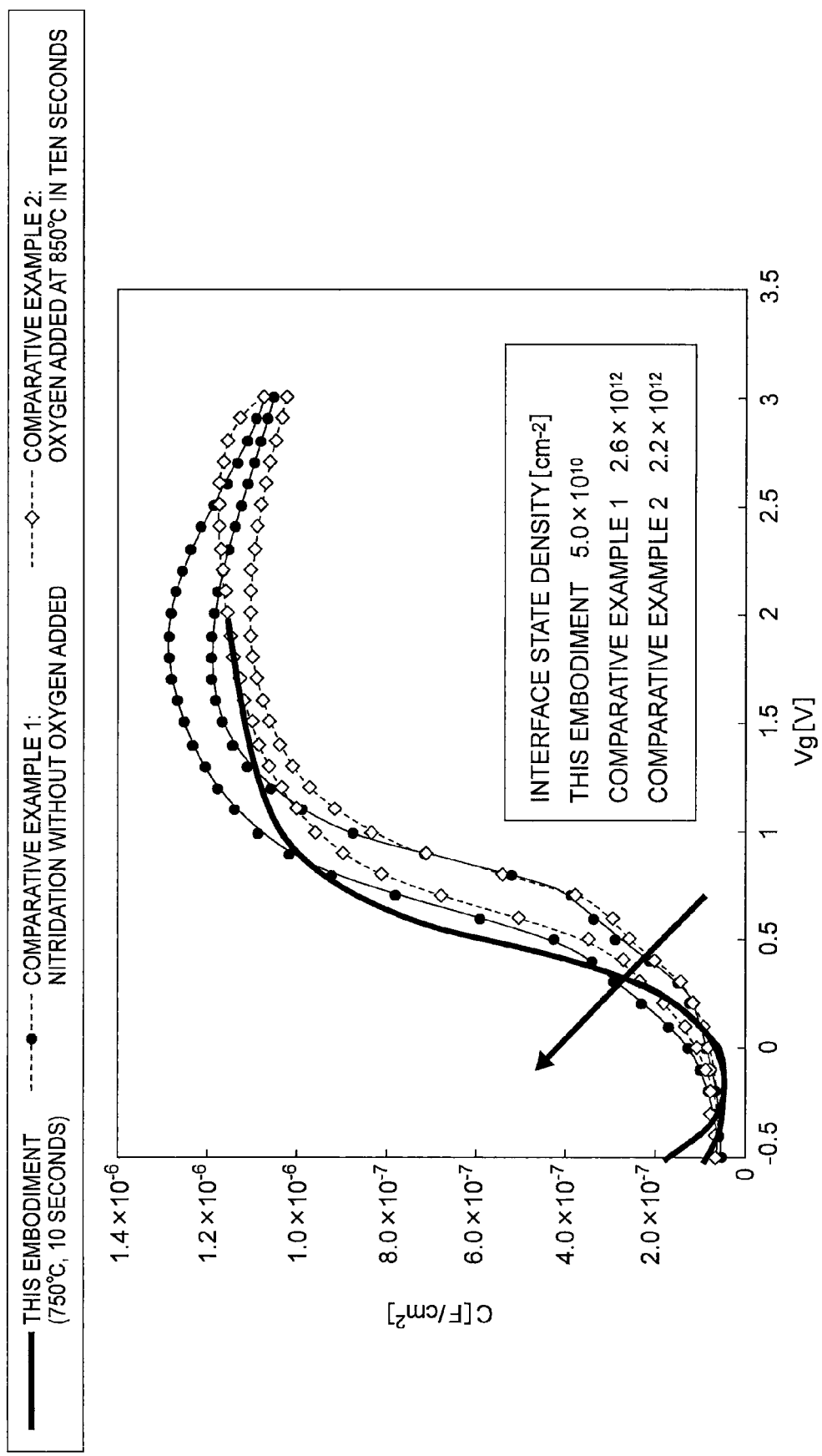
FIG. 7 shows the relationship between the conditions for adding oxygen to the amorphous silicon layer and the C-V characteristics.
Figure 8:
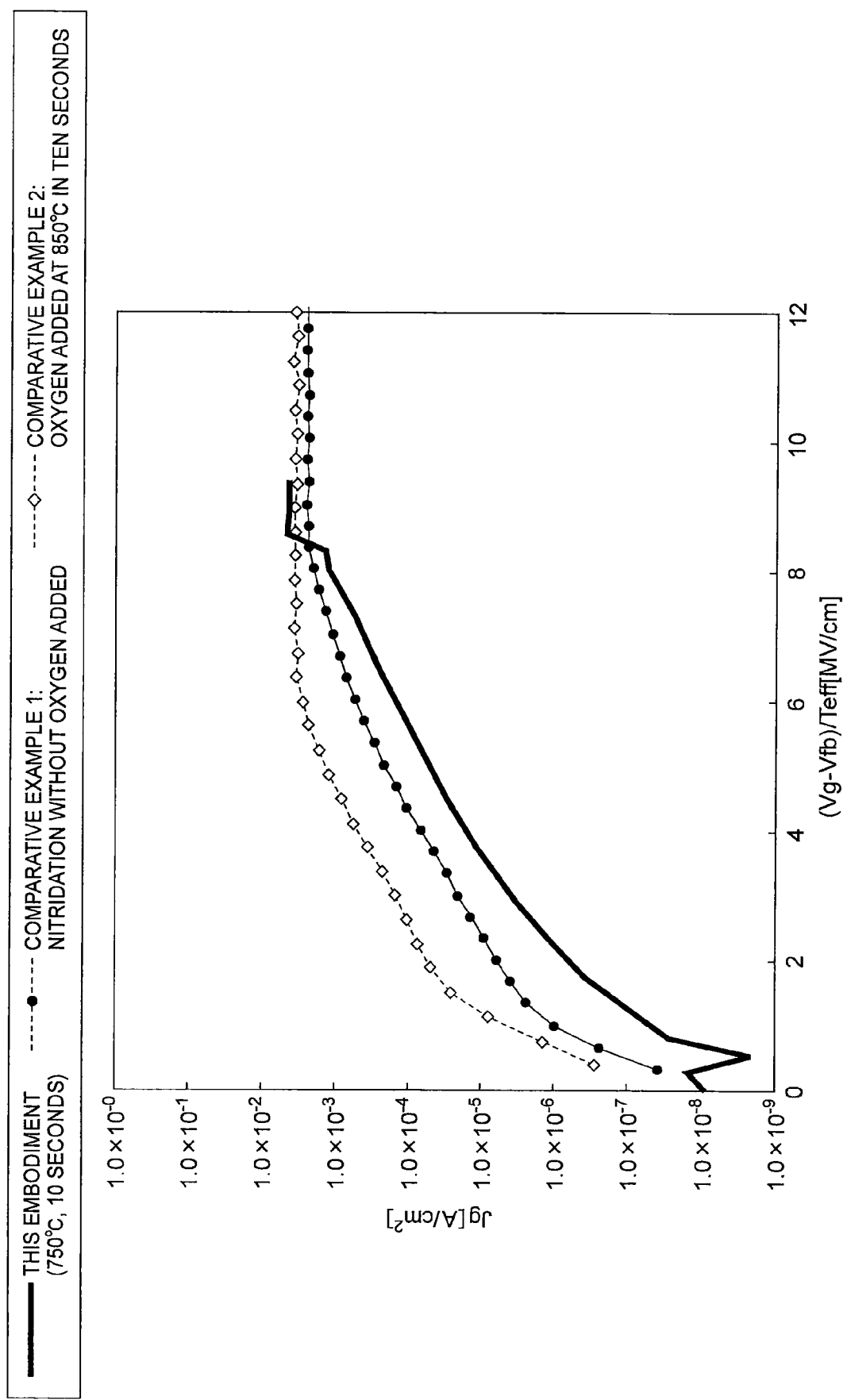
FIG. 8 shows the relationship between the conditions for adding oxygen to the amorphous silicon layer and the leakage current.

FIG. 7 shows the results of examinations conducted on the dependence of the capacitance C on the gate voltage $V_g$, or the C-V characteristics. FIG. 8 shows the results of examinations conducted on the dependence of the leakage current $J_g$ on the intensity of the electric field induced in the insulating film $(=(V_g-V_{fb})/T_{eff})$. As can be seen from these graphs, in Comparative Example 1, or in a case where the oxidation time is ten seconds as in this embodiment but the oxidation temperature is as high as 850° C. as in Comparative Example 2, hysteresis occurs in the C-V characteristics, and the interface state density and the leakage current are higher than in this embodiment. These facts indicate that, since oxygen was not added to the amorphous silicon layer in Comparative Example 1, the amorphous silicon layer was agglomerated at the time of the nitridation at 700° C., irregularity was caused in the layer thickness, the nitridation became uneven to leave non-nitrided portions (to be more specific, Si dangling bonds), and the nitrogen penetrated through the $SiO_2$ layer below the amorphous silicon layer. The above facts also indicate that, since the oxidation temperature was high in Comparative example 2, the amorphous silicon layer was agglomerated, irregularity was caused in the layer thickness, the nitridation became uneven to leave non-nitrided portions, and the nitrogen penetration occurred.

Figure 9:
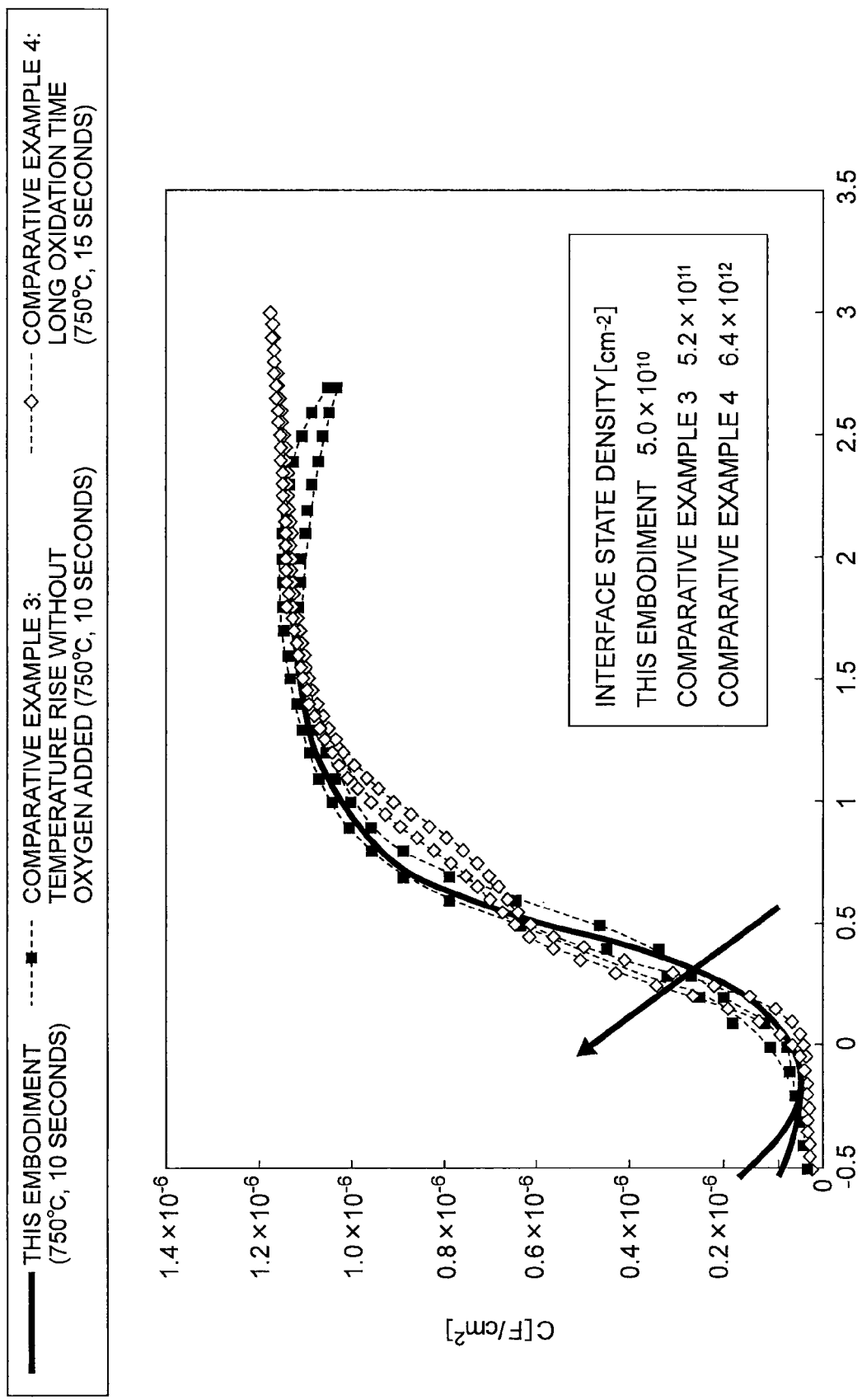
FIG. 9 shows the relationship between the conditions for adding oxygen to the amorphous silicon layer and the C-V characteristics.
Figure 10:
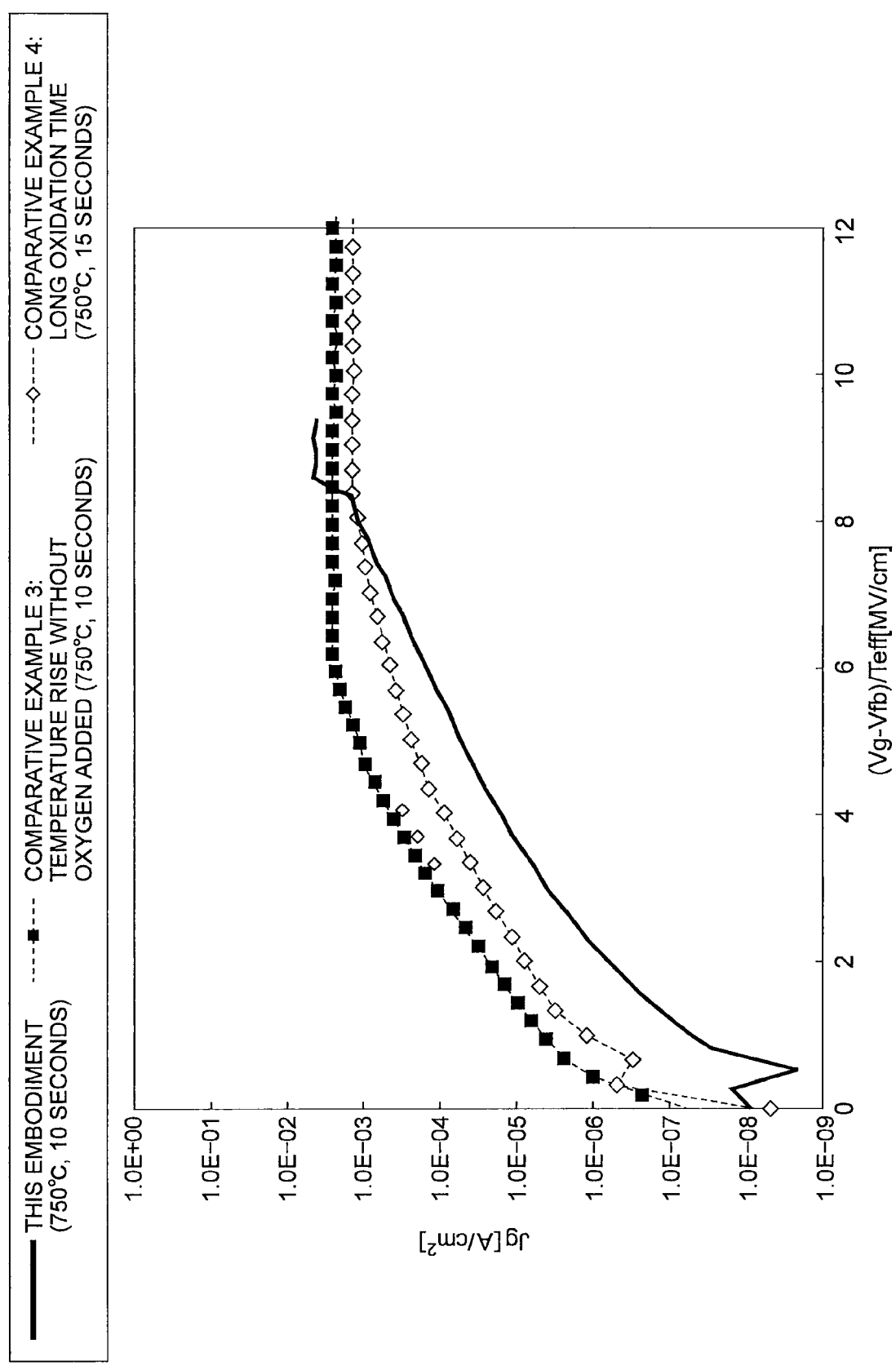
FIG. 10 shows the relationship between the conditions for adding oxygen to the amorphous silicon layer and the leakage current.

Next, electrical characteristics were also examined with respect to a case as Comparative Example 3 where the oxidation temperature and the oxidation time were the same as those in this embodiment (750° C., ten seconds) but oxygen was not supplied while oxygen was added, and a case as Comparative Example 4 where the oxygen temperature was the same as that in this embodiment but the oxidation time was 15 seconds. FIG. 9 shows the results of examinations conducted on the dependence of the capacitance C on the gate voltage $V_g$, or the C-V characteristics. FIG. 10 shows the results of examinations conducted on the dependence of the leakage current $J_g$ on the intensity of the electric field induced in the insulating film ($=(V_g-V_{fb})/T_{eff}$).

As can be seen from these graphs, in both Comparative Examples 3 and 4, large hysteresis occurred in the C-V characteristics, and the interface state density and the leakage current became higher than in this embodiment. These facts indicate that, since there was no oxygen while the temperature was rising in Comparative Example 3, the amorphous silicon layer was agglomerated, irregularity was caused in the layer thickness, the nitridation became uneven to leave non-nitrided portions, and the nitrogen penetration occurred. These facts also indicate that, since the oxidation time was long in Comparative example 4, the amorphous silicon layer was completely oxidized to form a $SiO_2$ layer, the nitrogen penetrated through the $SiO_2$ layer, and the Si substrate was nitrided.

Figure 11:
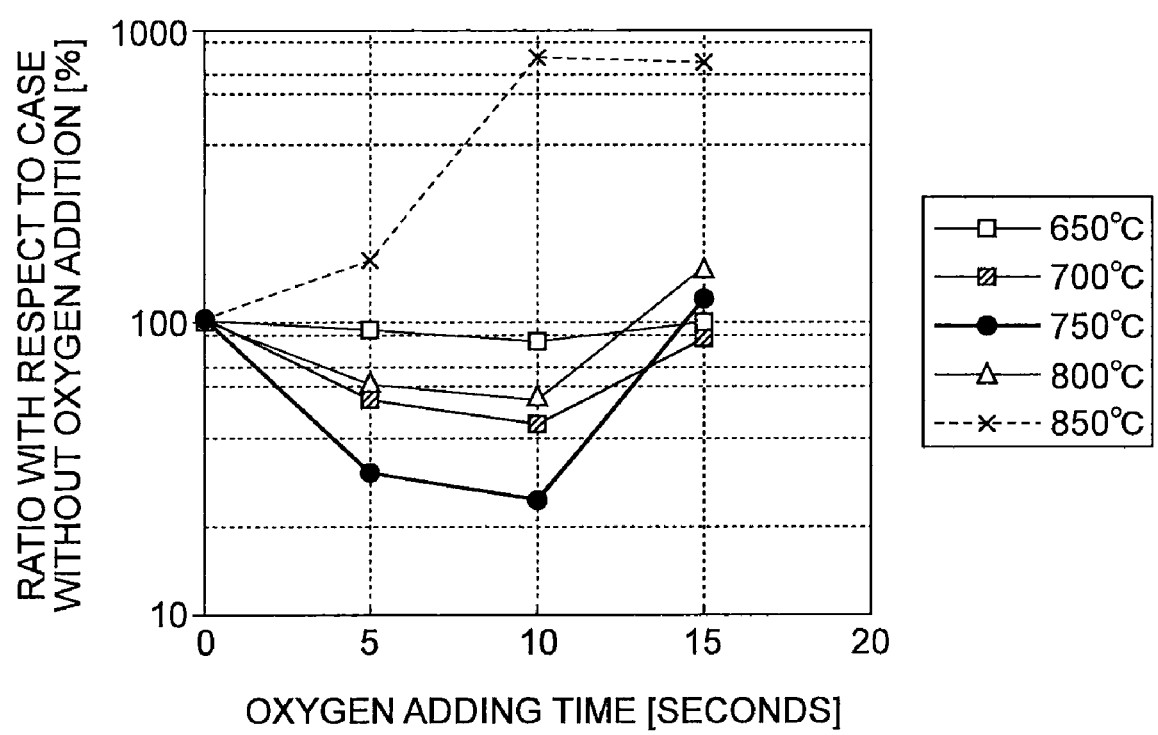
FIG. 11 shows the variation in leakage current observed where the applied voltage was 4 MV/cm.
Figure 12:
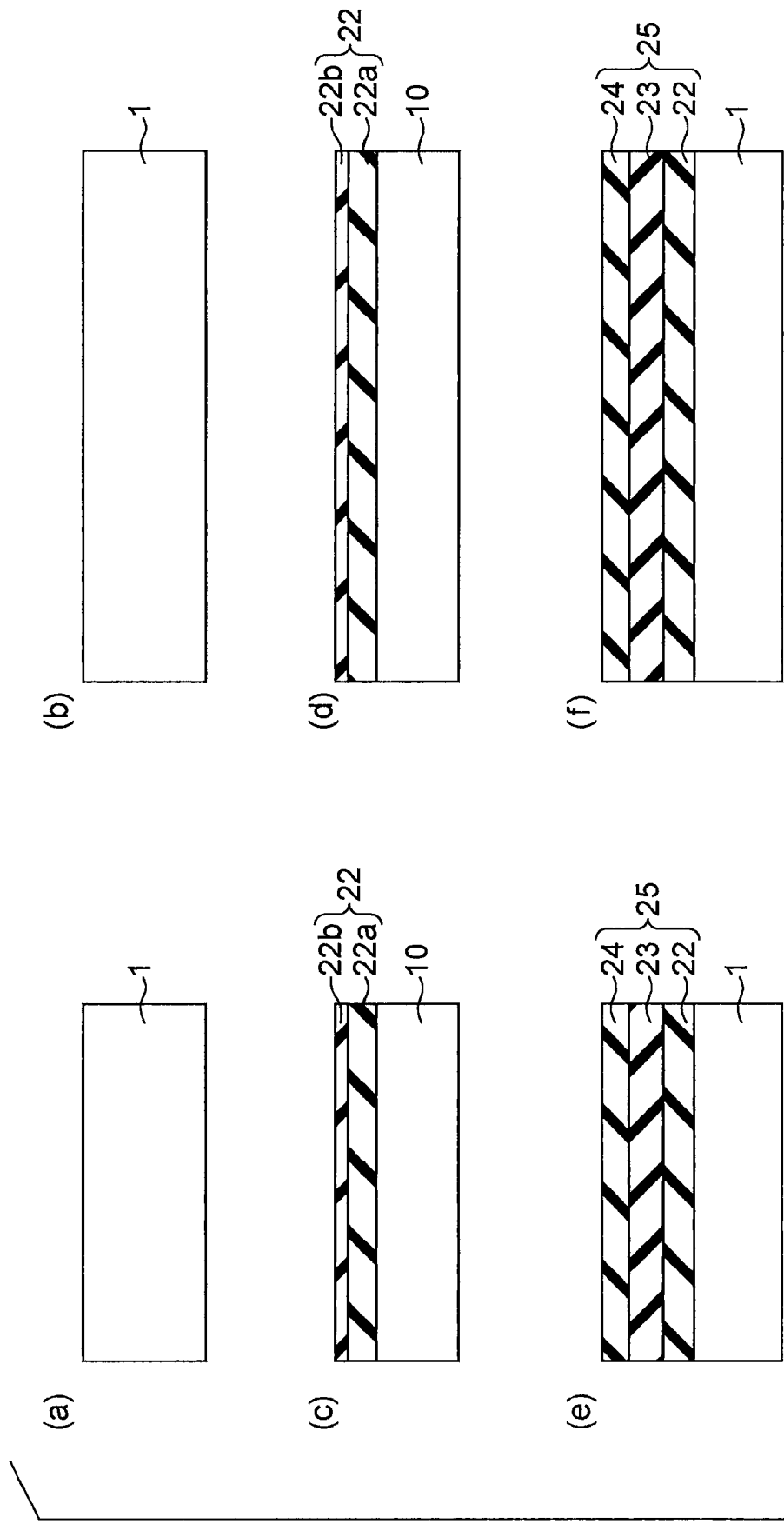
Figure 13:
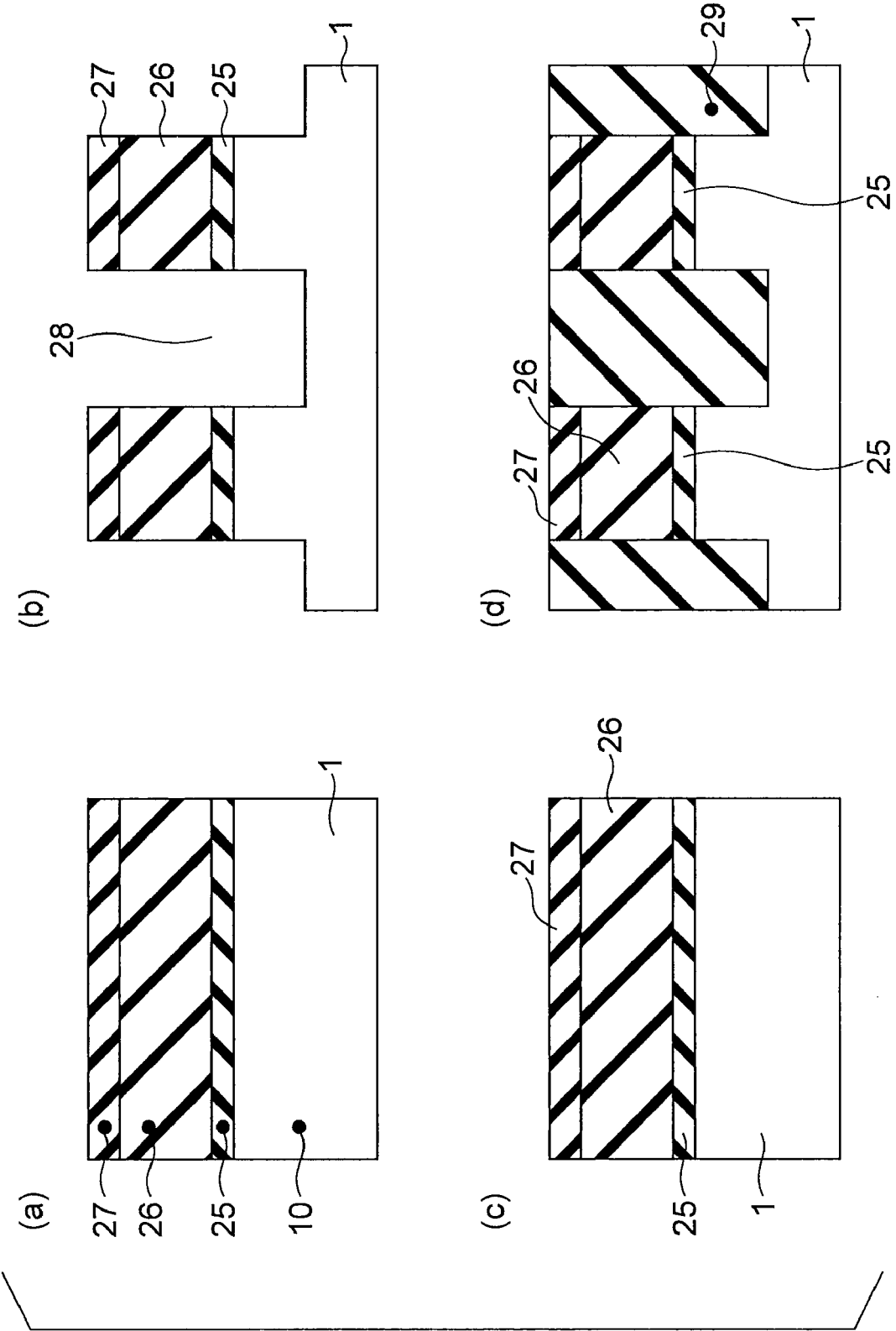
Figure 14:
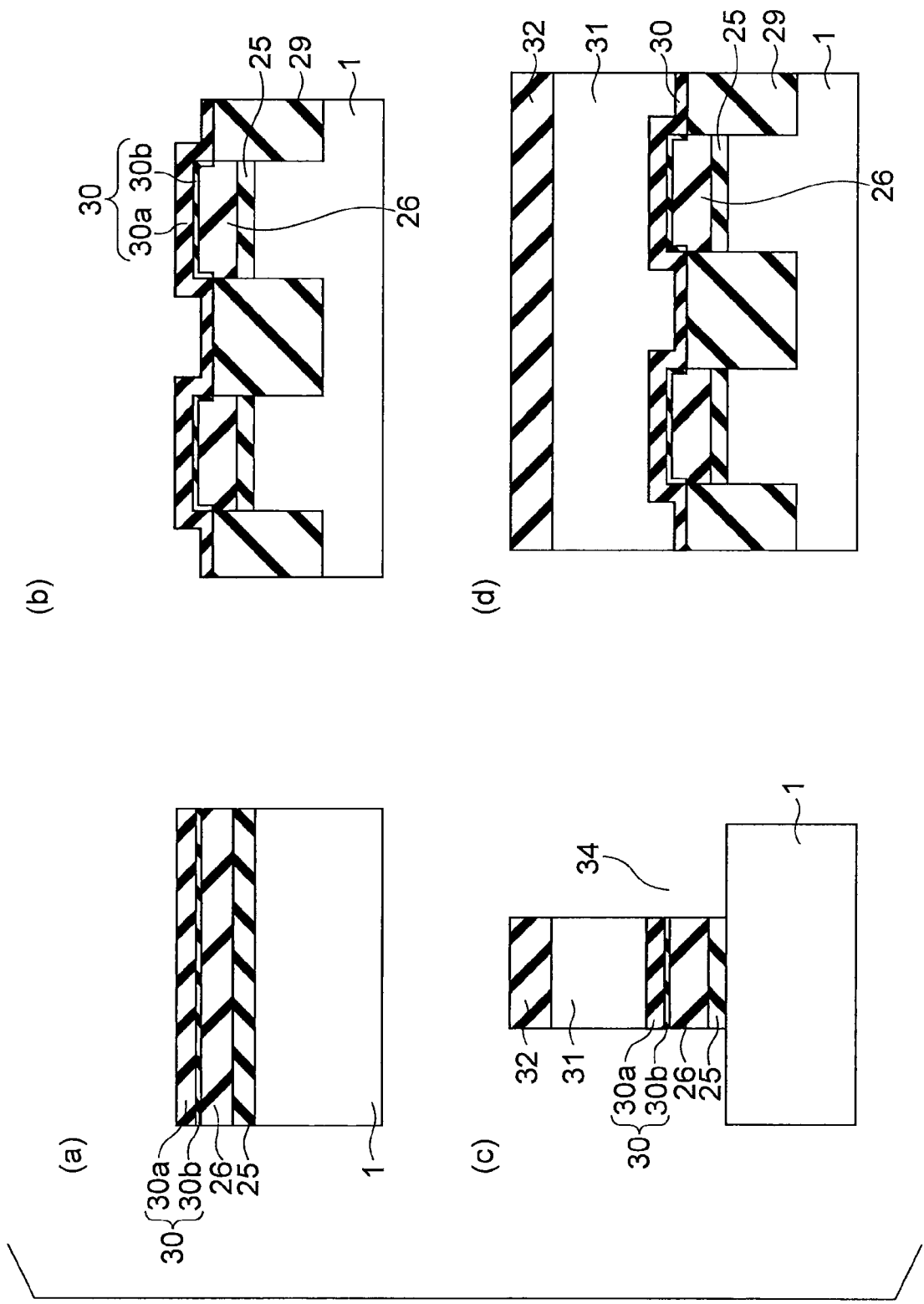
Figure 15:
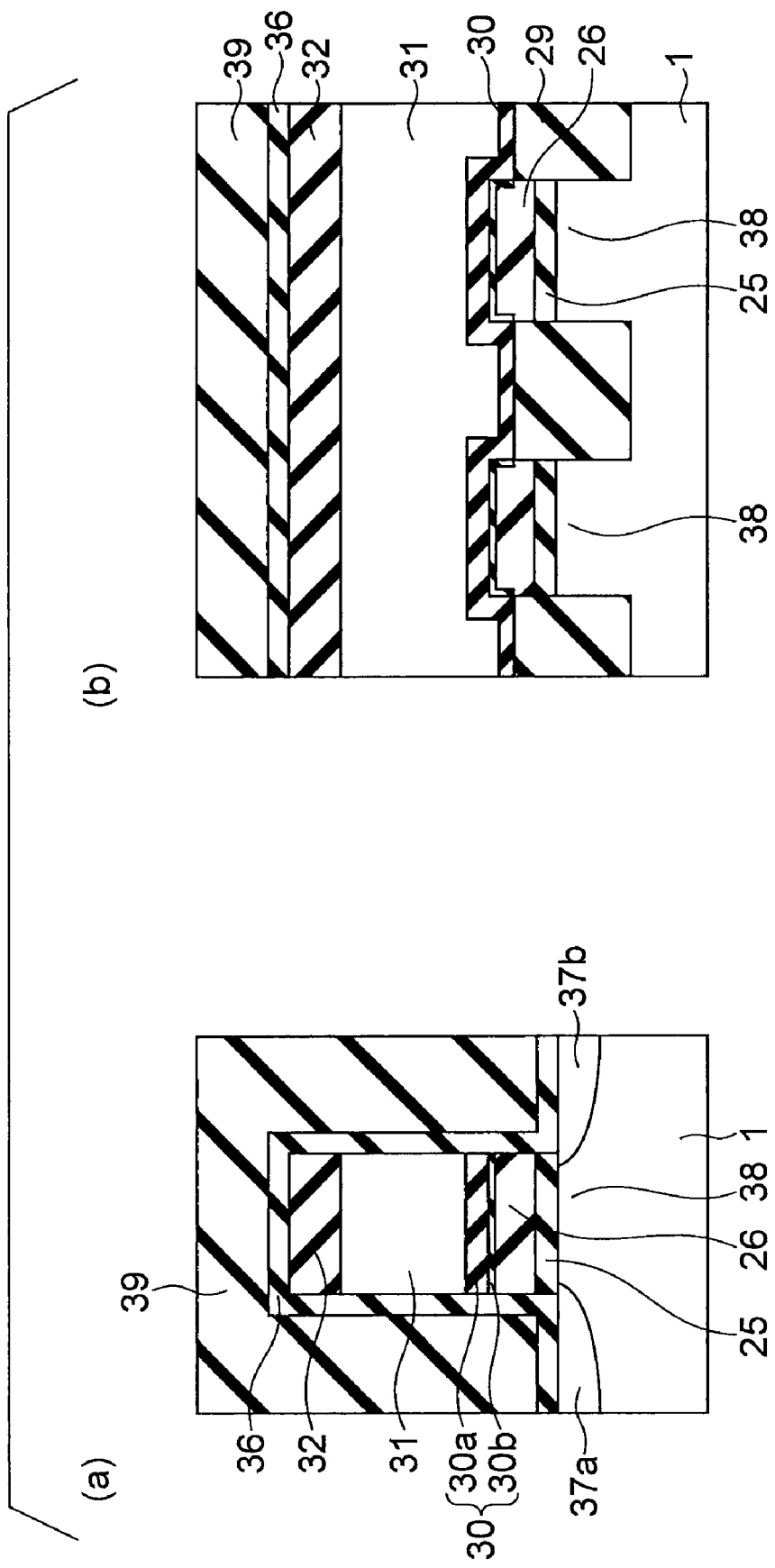

FIG. 11 shows the variation in leakage current observed where the applied voltage was 4 MV/cm, and the oxidation conditions were varied. FIG. 11 shows the ratio between the leakage current value observed where the nitridation was performed without the oxygen addition, and the leakage current value observed where the nitridation was performed after oxygen was added. For example, the ratio of 50% indicates that the leakage current was reduced by half where oxygen was added. As is apparent from the results shown in FIG. 11, the leakage current can be very effectively reduced by adding oxygen at a temperature between 700° C. to 800° C. in ten seconds or less. The reasons for this are as described above.

In this manner, a high-quality tunnel insulating film having a stacked structure formed with a $SiO_2$ layer, a SiON layer, and a $SiO_2$ layer can be realized by adding oxygen to the amorphous silicon layer under appropriate conditions.

The silicon oxynitride layer 3 has a layer thickness of 1.5 nm to 2.5 nm, and nitrogen concentration of 20 atomic % to 47 atomic %. In other words, 10 atomic % to 30 atomic % of oxygen is contained in the silicon oxynitride layer 3, and at least one of the second nearest neighbor atoms of the silicon is nitrogen. This is because oxygen is added to the amorphous silicon layer. In the silicon oxide layer 2, a small amount of nitrogen is diffused when the amorphous silicon layer is nitrided. Therefore, an average of 10 atomic % of nitrogen is contained at a maximum.

Although an $O_2$ gas is used when oxygen is added to the amorphous silicon layer in this embodiment, the gas used at the time of adding oxygen is not limited to an $O_2$ gas, and it is possible to use any oxidizing gas such as NO, $N_2O$, $O_3$, O radicals, or O plasma. However, those gases differ from $O_2$ in oxidation power. Therefore, when one of those gases is used, it is necessary to adjust the oxygen adding conditions in such a manner that the oxygen concentration in the amorphous silicon oxynitride layer 3 is in the range of 10 atomic % to 30 atomic %.

Although a $NH_3$ gas is used when the amorphous silicon layer is nitrided in this embodiment, the gas used at the time of nitridation is not limited to a $NH_3$ gas, and it is possible to use any nitriding gas such as NO, N radicals, NH radicals, $N_2$ radicals, N plasma, NH plasma, or $N_2$ plasma.

Although HTO is used in the process for forming the $SiO_2$ layer 4 in this embodiment, some other technique such as CVD or ALD may be used, as long as the $SiO_2$ layer 4 can be properly deposited.

As described so far, this embodiment can provide a semiconductor device that has a high-quality tunnel insulating film in which defects are not easily formed. This semiconductor device experiences less leakage current.

Second Embodiment

Referring to FIGS. 12(a) to 15(b), a method for manufacturing a semiconductor device in accordance with a second embodiment of the present invention is described. FIGS. 12(a), 12(c), 12(e), 13(a), 13(c), 14(a), 14(c), and 15(a) are cross-sectional views that are taken perpendicularly to the cross-sectional views of FIGS. 12(b), 12(d), 12(f), 13(b), 13(d), 14(b), 14(d), and 15(b).

A semiconductor device manufactured by the manufacturing method in accordance with this embodiment is a MONOS (Metal-Oxide-Nitride-Oxide-Si) nonvolatile semiconductor memory that includes memory cells arranged in a matrix fashion. As shown in FIGS. 15(a) and 15(b), each of the memory cells includes: source and drain regions 37a and 37b that are formed at a distance from each other on a silicon substrate 1; a tunnel insulating film 25 that is formed on a region 38 of the silicon substrate 1 located between the source region 37a and the drain region 37b to be channel; a charge storage film 26 that is formed on the tunnel insulating film 25 and is made of an insulating material in which charges can be stored; an interelectrode insulating film 30 that is formed on the charge storage film 26; and a control gate electrode 31 that is formed on the interelectrode insulating film 30.

Next, the method for manufacturing the semiconductor device in accordance with this embodiment is described. The manufacturing method in accordance with this embodiment differs from the manufacturing method in accordance with the first embodiment, in further including the procedure for nitriding the silicon oxide layer serving as the base layer of the amorphous silicon layer before the amorphous silicon layer is formed.

First, as shown in FIGS. 12(a) and 12(b), the silicon substrate 1 doped with desired impurities is subjected to diluted hydrofluoric acid treatment, so as to terminate the surface of the silicon substrate 1 with hydrogen. After that, the silicon substrate 1 is placed in the chamber of a film forming device (not shown). The chamber is filled only with a gas (such as a nitrogen gas) that does not react with or etch silicon during the manufacturing process. The temperature of the silicon substrate 1 is then heated to 700° C., so as to completely detach the hydrogen from the silicon substrate 1.

The chamber is then filled with a $N_2$ gas having a partial pressure of 30 Torr and an $O_2$ gas having a partial pressure of 3 Torr, for example. The surface of the silicon substrate 1 is heated to 1050° C., and is maintained at that temperature for ten seconds. In this manner, a silicon oxide layer 22a is formed on the silicon substrate 1, as shown in FIGS. 12(c) and 12(d). The procedures described so far are the same procedures carried out in the first embodiment. Radical nitridation or plasma nitridation is then performed on the surface of the silicon oxide layer 22a. By doing so, a nitrogen-containing layer 22b is formed on the surface of the silicon oxide layer 22a, and nitrogen is introduced into the silicon oxide layer 22a so that the peak concentration in the profile becomes 10 atomic % or lower (see FIGS. 12(c) and 12(d)). In this manner, a nitrogen-added silicon oxide layer 22 having a two-layer structure consisting of the silicon oxide layer 22a and the nitrogen-containing layer 22b is formed. In this nitriding procedure, this embodiment differs from the first embodiment. Through this nitriding procedure, the hole injecting efficiency in each memory cell is increased, as will be described later. It should be noted here that, in the drawings illustrating the manufacturing procedures carried out after this nitriding procedure, the silicon oxide layer 22 having the two-layer structure consisting of the silicon oxide layer 22a and the nitrogen-containing layer 22b is shown as a single-layer silicon oxide layer 22.

An amorphous silicon layer of 2 nm in thickness is then deposited on the silicon oxide layer 22 with the use of a disilane gas. It is preferable that the temperature of the silicon substrate 1 at this point is 550° C. or lower. The atmosphere at the time of deposition of the amorphous silicon layer may contain oxygen, NO, or $N_2O$. If the atmosphere contains NO or $N_2O$ in this case, the resultant amorphous silicon layer contains a small amount of nitrogen. The temperature of the silicon substrate 1 is set at 750° C., and the atmosphere in the chamber is changed to a $N_2$ gas having a partial pressure of 30 Torr and an $O_2$ gas having a partial pressure of 3 Torr, for example. These conditions are maintained for ten seconds. In this manner, a small amount of oxygen is added to the amorphous silicon layer, and an oxygen-added amorphous silicon layer is formed. As in the first embodiment, the oxidizing temperature at this point should preferably be 700° C. or higher, at which the hydrogen in the amorphous silicon layer is detached. However, the oxidizing temperature cannot be too high, and should preferably be 800° C. or lower. Furthermore, it is preferable to supply oxygen while the temperature is rising. Also, as in the first embodiment, the time required for the temperature to rise to a point between 700° C. and 800° C. should preferably be ten seconds or less. Ideally, while oxygen is being supplied, the heating-up time is ten seconds or less, and the oxidation time is ten seconds or less. After that, the atmosphere in the chamber is changed to a $N_2$ gas having a partial pressure of 30 Torr and a $NH_3$ gas having a partial pressure of 0.03 Torr, for example. The surface of the silicon substrate 1 is then set at 750° C., and is maintained at that temperature for 400 seconds. In this manner, the amorphous silicon layer is nitrided to form a silicon oxynitride layer 23 (see FIGS. 12(e) and 12(f)). As described in the first embodiment, the silicon oxynitride layer 23 formed by the manufacturing method in accordance with this embodiment is a high-quality silicon oxynitride layer having few defects.

The temperature of the silicon substrate 1 is then set at 750° C. or higher, and a 2.5-nm thick silicon oxide layer 24 is deposited on the silicon oxynitride layer 23 by HTO. By doing so, the tunnel insulating film 25 including the silicon oxide layer 22, the silicon oxynitride layer 23, and the silicon oxide layer 24 is formed as shown in FIGS. 12(e) and 12(f). It should be noted here that, in the drawings illustrating the manufacturing procedures carried out after this procedure, the tunnel insulating film 25 having the three-layer structure consisting of the silicon oxide layer 22, the silicon oxynitride layer 23, and the silicon oxide layer 24 is shown as a single-layer tunnel insulating film 25.

A 6-nm thick nitride film 26 to be the charge storage film such as a $Si_3N_4$ film is then deposited on the tunnel insulating film 25 by CVD, and a mask material 27 for device isolation is deposited by CVD. After that, etching is performed on the mask material 27, the nitride film 26, and the tunnel insulating film 25 in this order by RIE with the use of a resist mask (not shown). Etching is further performed on the exposed regions of the silicon substrate 1, so as to form device isolation grooves 28 of 100 nm in depth (see FIGS. 13(a) and 13(b)).

A silicon oxide film 29 for device isolation is then deposited on the entire surface, so as to completely fill the device isolation grooves 28. After that, the portion of the silicon oxide film 29 on the surface is removed by CMP, so that the surface is flattened. At this point, the mask material 27 is exposed (see FIGS. 13(c) and 13(d)).

The exposed mask material 27 is selectively removed by etching, and the exposed surface portions of the silicon oxide film 29 are removed by etching with the use of a diluted hydrofluoric acid solution. After that, a 15-nm thick alumina layer 30a to be the interelectrode insulating film is formed on the entire surface by ALD. Due to the oxidizing agent used in the film formation by ALD, a very thin silicon oxide layer 30b is formed at the interface between the alumina layer 30a and the nitride film 26. As a result, a 16-nm thick interelectrode insulating film 30 having a two-layer structure consisting of the alumina layer 30a and the silicon oxide layer 30b is formed (see FIGS. 14(a) and 14(b)). It should be noted here that, in the drawings illustrating the manufacturing procedures carried out after this procedure, the interelectrode insulating film 30 having the two-layer structure of the silicon oxide layer 30b and the alumina layer 30a is shown as a single-layer interelectrode insulating film 30.

A 100-nm thick conductive film 31 having a two-layer structure consisting of a polycrystalline silicon layer and a tungsten silicide layer is formed to be the control gate electrode on the interelectrode insulating film 30 in the same manner as in the first embodiment. Further, a mask material 32 for RIE is deposited by CVD. After that, etching is performed by RIE with the use of a resist mask (not shown) on the mask material 32, the conductive film 31, the interelectrode insulating film 30, the charge storage film 26, and the tunnel insulating film 25 in this order, so as to form the gate having a stacked structure. In this manner, the shape of the gate having the stacked structure is defined, and grooves 34 extending in the word-line direction (the direction in which the control gate electrode 31 extends) are formed on the side of this gate having the stacked structure (see FIGS. 14(c) and 14(d)).

As shown in FIGS. 15(a) and 15(b), a silicon oxide film 36 is then formed on the side faces and the upper face of the gate having the stacked structure by a thermal oxidation technique. After that, the source and drain regions 37a and 37b are formed by an ion injection technique. The region of the silicon substrate 1 located between the source region 37a and the drain region 37b is the channel region 38. Further, an interlayer insulating film 39 is formed to cover the entire surface by CVD. After that, a wiring layer and the likes are formed by known techniques, so as to complete the nonvolatile semiconductor memory (see FIGS. 15(a) and 15(b)).

Figure 16:
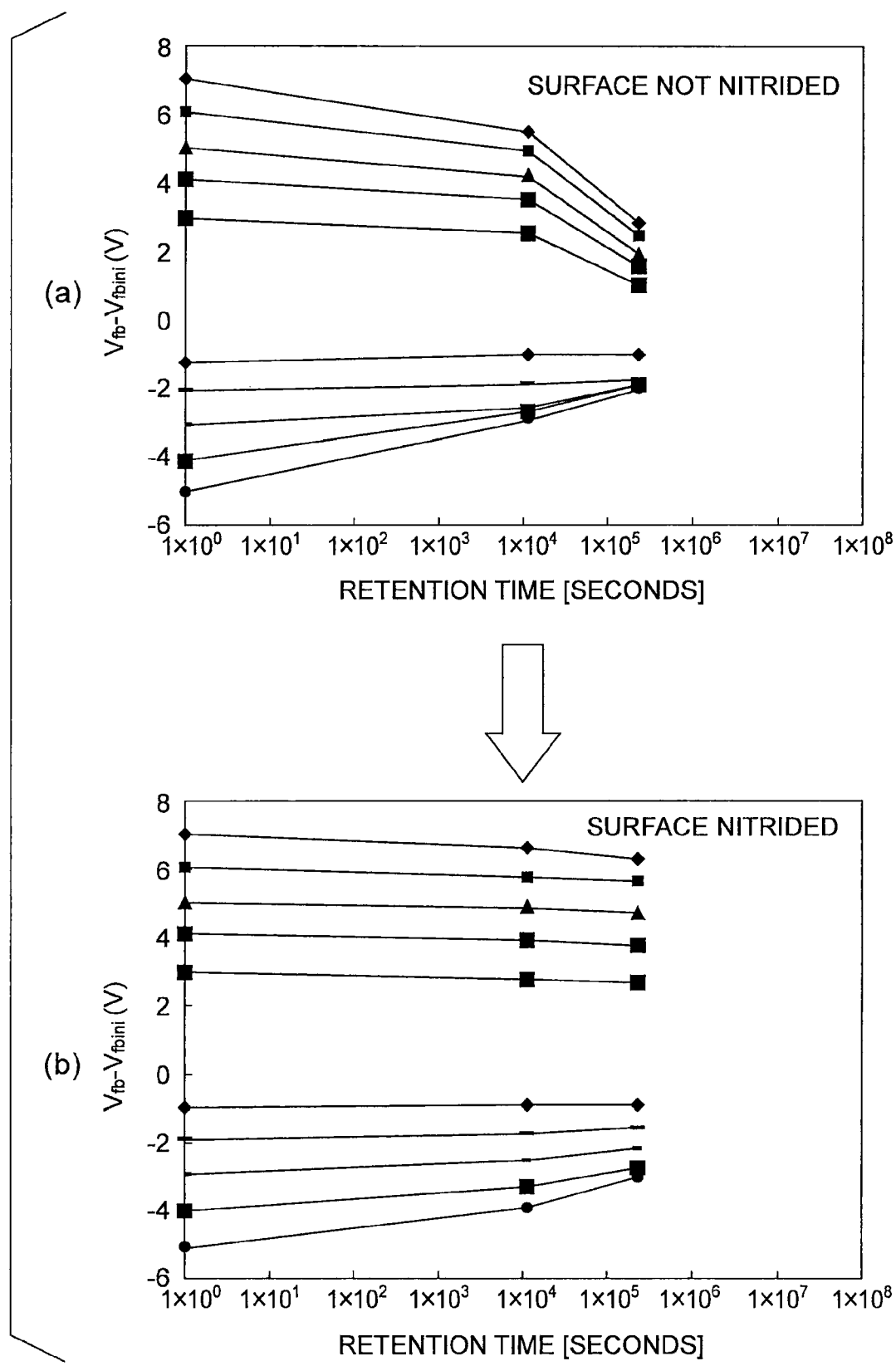
FIGS. 16(a) and 16(b) show the differences in erase characteristics between a case where surface nitridation is performed and a case where surface nitridation is not performed.
Figure 17:
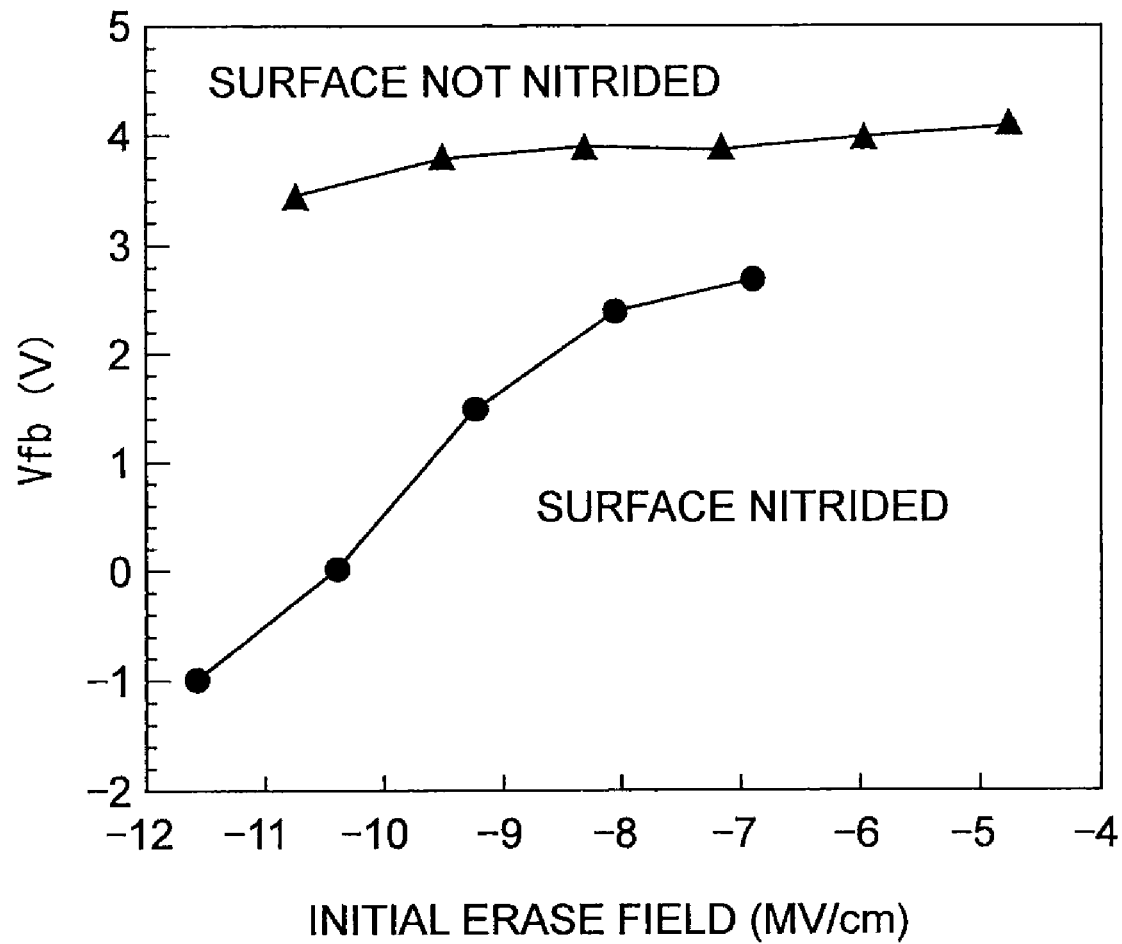
FIG. 17 shows the differences in charge retention properties between a case where surface nitridation is performed and a case where surface nitridation is not performed.
Figure 18:
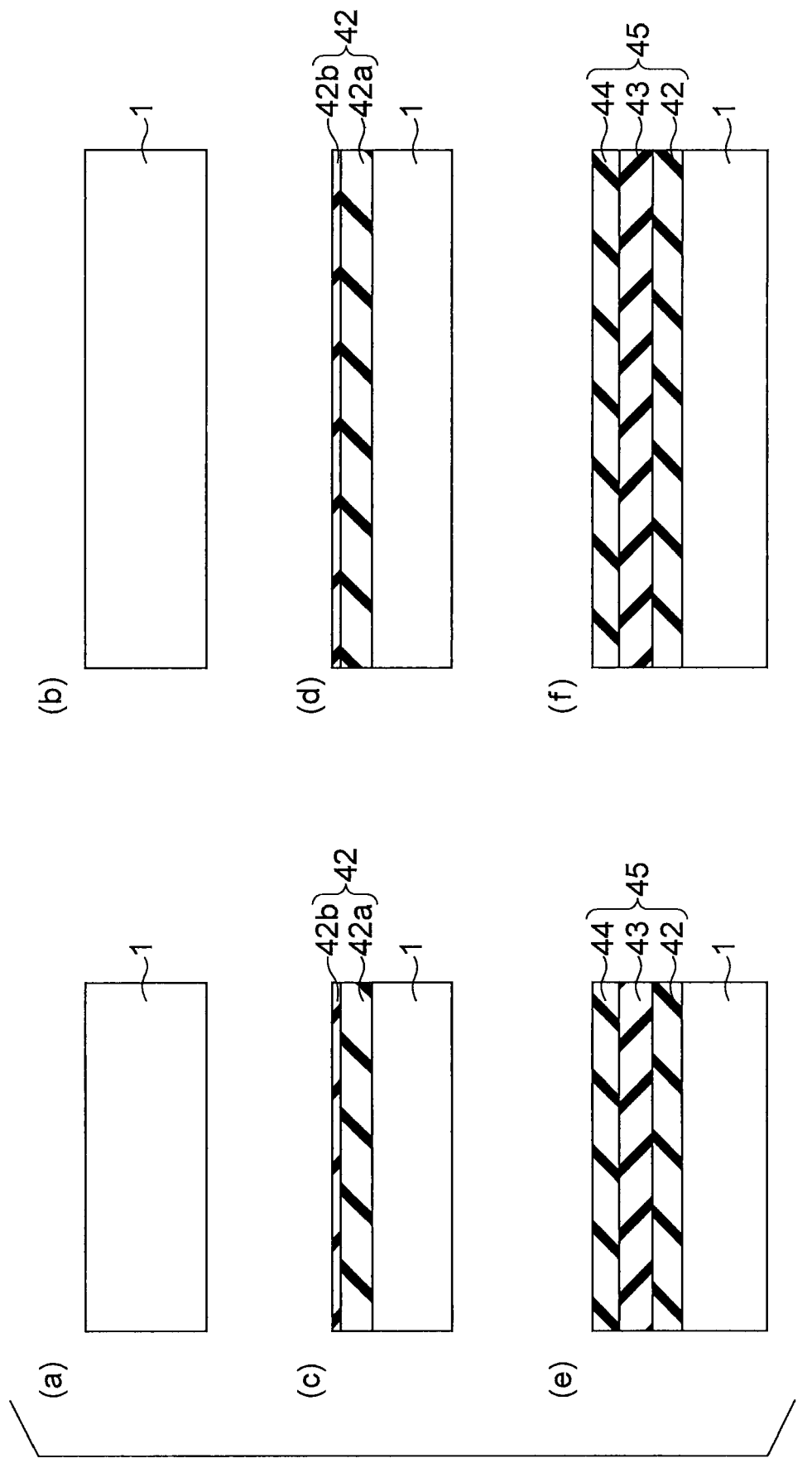
Figure 19:
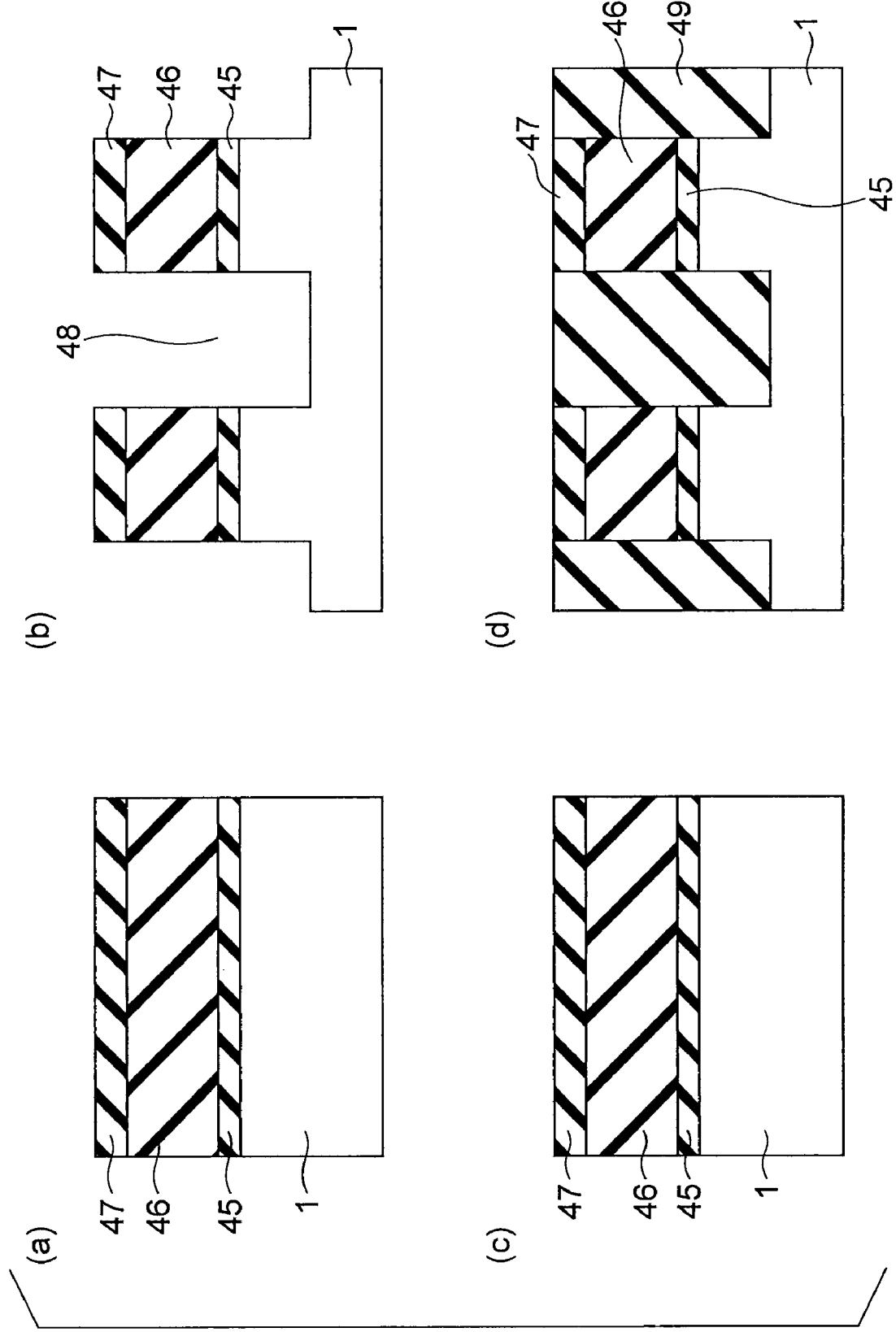
Figure 20:
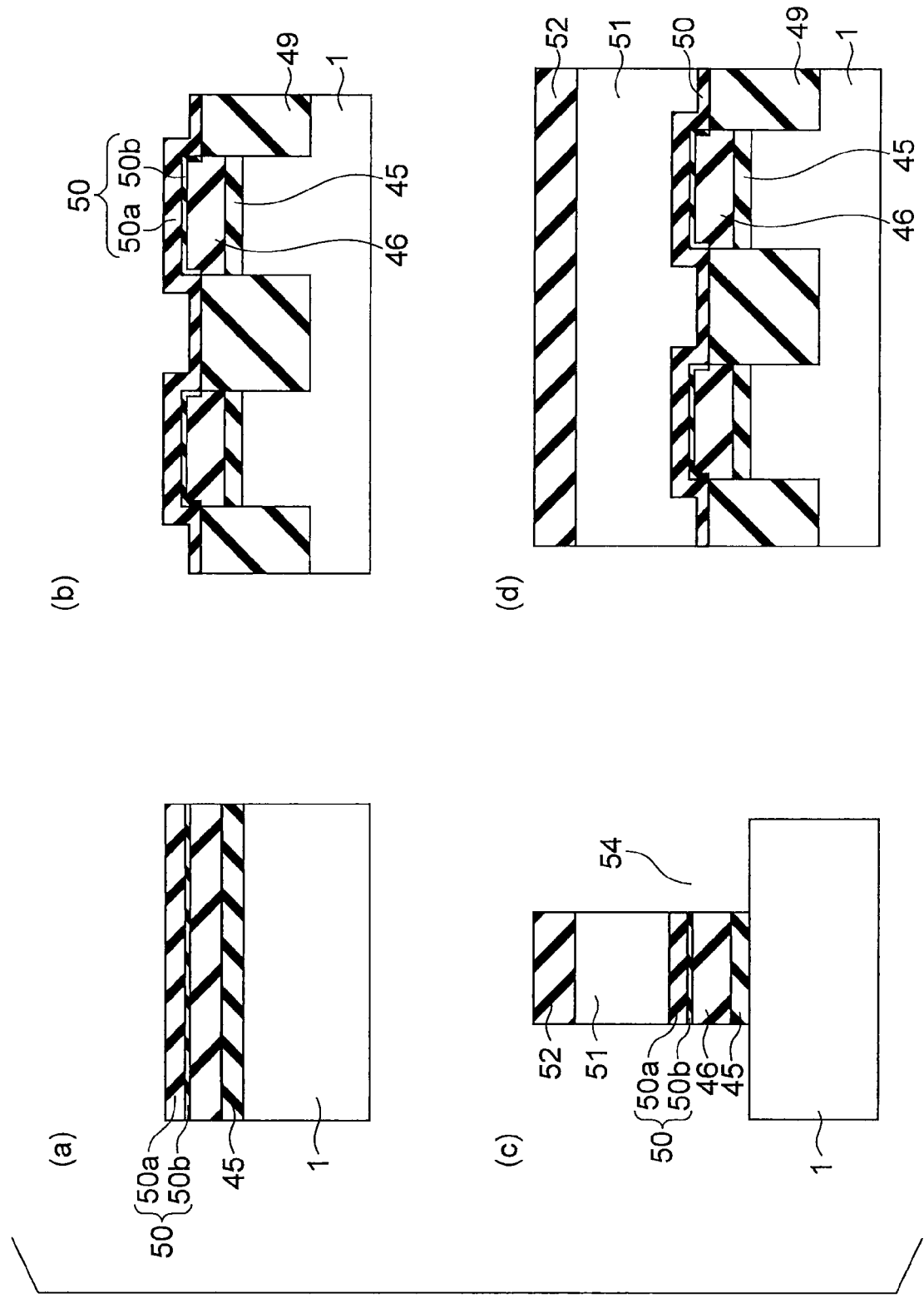
Figure 21:
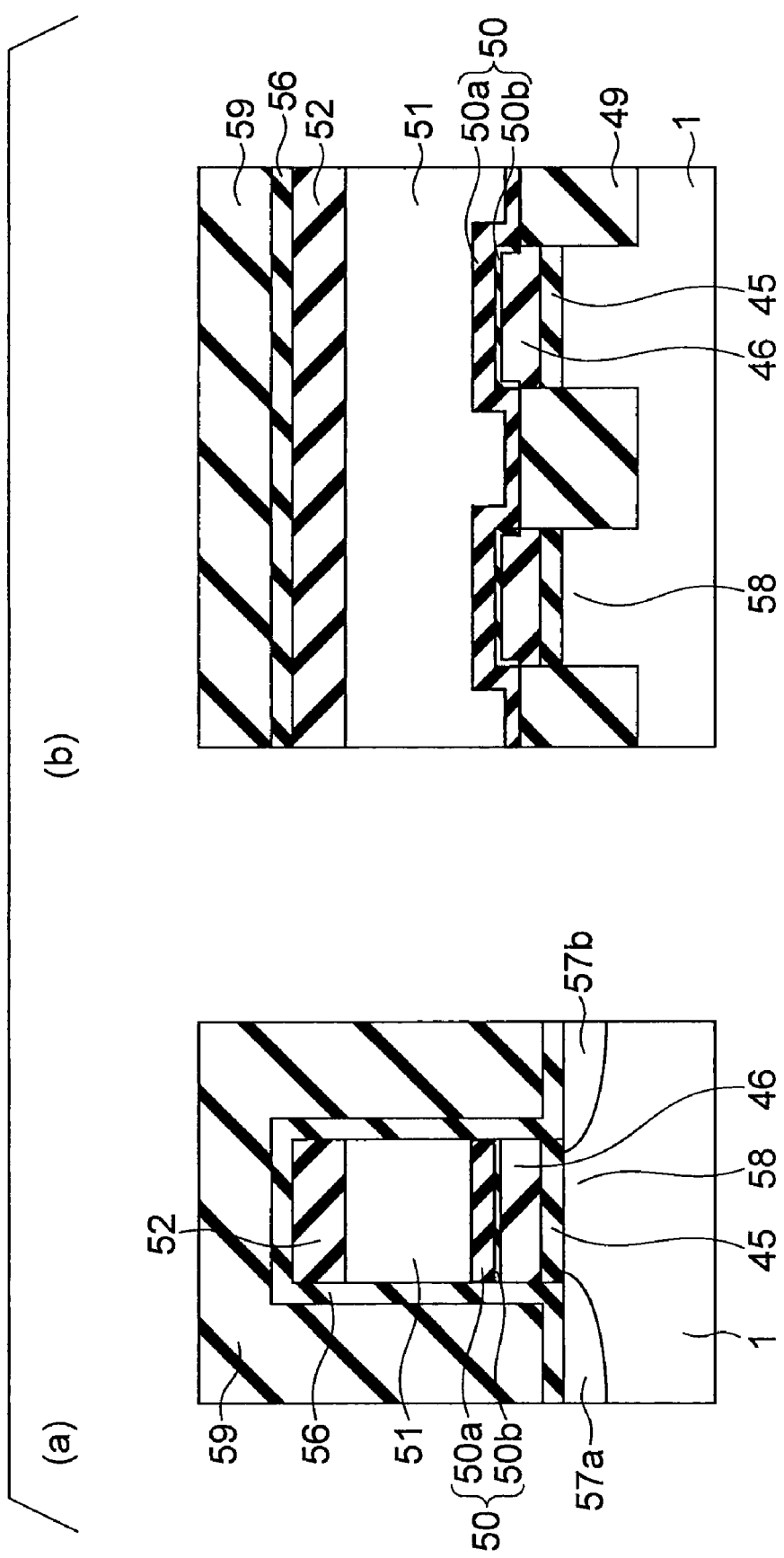

By performing nitridation on the surface of the $SiO_2$ layer before the deposition of the amorphous silicon layer in the above described manner, the charge retention properties and the reliability described in the first embodiment can be further improved, and an increase in erasing efficiency can be expected. FIGS. 16(a) and 16(b) show the differences in the charge retention properties between a case with the surface nitridation and a case without the surface nitridation. FIG. 17 shows the differences in the erase characteristics. In FIGS. 16(a) and 16(b), the abscissa axis indicates the charge retention time, and the ordinate axis indicates the difference between the flat-band voltage $V_{fb}$ and the initial flat-band voltage $V_{fbini}$. In FIG. 17, the abscissa axis indicates the initial erase field, and the ordinate axis indicates the flat-band voltage. As can be seen from FIGS. 16(a), 16(b), and 17, by performing nitridation on the surface of the $SiO_2$ layer before the amorphous silicon layer is deposited, the retention properties and the erase characteristics are both improved. The retention properties are improved, because dangling bonds are formed on the surface of the $SiO_2$ layer, and the flatness of the amorphous silicon layer formed on the $SiO_2$ layer is increased. Accordingly, the insulating properties are further improved. Also, diffusion of nitrogen into the $SiO_2$ layer is prevented by introducing nitrogen into the surface of the SiO$_2$ layer, and nitriding species are prevented from penetrating through the SiO$_2$ layer and nitriding the Si substrate when the amorphous silicon layer is later nitrided. As a result, formation of interface states to be the origin of low-field leakage current is restricted. The erase characteristics are improved because, as nitrogen is introduced into the SiO$_2$ layer, the hole barrier of the SiO$_2$ layer becomes smaller, and the density of hole current tunneling from the substrate side to the charge storage film side becomes higher. As a result, the erasing efficiency of the electrons in the charge storage film becomes higher.

In this manner, a high-quality tunnel insulating film having a three-layer stacked structure formed with a SiO$_2$ layer, a SiON layer, and a SiO$_2$ layer can be realized by nitriding the surface of the lower SiO$_2$ layer before the amorphous silicon layer is deposited.

The silicon oxynitride layer 23 has a layer thickness of 1.5 nm to 2.5 nm, and nitrogen concentration of 20 atomic % to 47 atomic %. In other words, 10 atomic % to 30 atomic % of oxygen is contained in the silicon oxynitride layer 23, and at least one of the second nearest neighbor atoms of the silicon is nitrogen. This is because oxygen is added to the amorphous silicon layer 22. In the silicon oxide layer 22, a small amount of nitrogen is diffused when the amorphous silicon layer is nitrided. Therefore, an average of 10 atomic % of nitrogen is contained at a maximum.

In this embodiment, radical nitridation or plasma nitridation is performed on the surface of the silicon oxide layer 22. However, to prevent nitrogen from penetrating through the silicon oxide layer 22 and nitriding the silicon substrate, it is not necessary to perform radical nitridation or plasma nitridation, and NH$_3$ or NO may be used instead.

Although an O$_2$ gas is used when oxygen is added to the amorphous silicon layer in this embodiment, the gas used at the time of adding oxygen is not limited to an O$_2$ gas, and it is possible to use any oxidizing gas such as NO, N$_2$O, O$_3$, O radicals, or O plasma. However, those gases differ from O$_2$ in oxidation power. Therefore, when one of those gases is used, it is necessary to adjust the oxygen adding conditions in such a manner that the oxygen concentration in the silicon oxynitride layer 23 is in the range of 10 atomic % to 30 atomic %.

Although a NH$_3$ gas is used when the amorphous silicon layer is nitrided in this embodiment, the gas used at the time of nitridation is not limited to a NH$_3$ gas, and it is possible to use any nitriding gas such as NO, N radicals, NH radicals, N$_2$ radicals, N plasma, NH plasma, or N$_2$ plasma.

Although HTO is used in the process for forming the SiO$_2$ layer 24 in this embodiment, some other technique such as CVD or ALD may be used, as long as the SiO$_2$ layer 24 can be properly deposited.

As described so far, this embodiment can provide a semiconductor device that has a high-quality tunnel insulating film in which defects are not easily formed. This semiconductor device experiences less leakage current.

Third Embodiment

Referring now to FIGS. 18(a) to 21(b), a method for manufacturing a semiconductor device in accordance with a third embodiment of the present invention is described. FIGS. 18(a), 18(c), 18(e), 19(a), 19(c), 20(a), 20(c), and 21(a) are cross-sectional views that are taken perpendicularly to the cross-sectional views of FIGS. 18(b), 18(d), 18(f), 19(b), 19(d), 20(b), 20(d), and 21(b).

A semiconductor device in accordance with this embodiment is a MONOS nonvolatile semiconductor memory that includes memory cells arranged in a matrix fashion. As shown in FIGS. 21(a) and 21(b), each of the memory cells includes: source and drain regions 57a and 57b that are formed at a distance from each other on a silicon substrate 1; a tunnel insulating film 45 that is formed on a region 58 of the silicon substrate 1 located between the source region 57a and the drain region 57b; a charge storage film 46 that is formed on the tunnel insulating film 45 and is made of an insulating material in which charges can be stored; an interelectrode insulating film 50 that is formed on the charge storage film 46; and a control gate electrode 51 that is formed on the interelectrode insulating film 50.

Next, the method for manufacturing the semiconductor device in accordance with this embodiment is described. The manufacturing method in accordance with this embodiment differs from the manufacturing method in accordance with the second embodiment, in further including the procedure for oxidizing a silicon oxynitride layer before a silicon oxide layer is formed on the silicon oxynitride layer.

First, as shown in FIGS. 18(a) and 18(b), the silicon substrate 1 doped with desired impurities is subjected to diluted HF treatment, so as to terminate the surface of the silicon substrate 1 with hydrogen. After that, the silicon substrate 1 is placed in the chamber of a film forming device. The chamber is filled only with a gas (such as a nitrogen gas) that does not react with or etch silicon during the manufacturing process. The temperature of the silicon substrate 1 is then heated to 700° C., so as to completely detach the hydrogen from the silicon substrate 1.

The chamber is then filled with a N$_2$ gas having a partial pressure of 30 Torr and an O$_2$ gas having a partial pressure of 3 Torr, for example. The surface of the silicon substrate 1 is heated to 1050° C., and is maintained at that temperature for ten seconds. In this manner, a silicon oxide layer 42a is formed on the silicon substrate 1, as shown in FIGS. 18(c) and 18(d). Radical nitridation or plasma nitridation is then performed on the surface of the silicon oxide layer 42a. By doing so, a nitrogen-containing layer 42b is formed on the surface of the silicon oxide layer 42a, and nitrogen is introduced into the silicon oxide layer 42a so that the peak concentration in the profile becomes 10 atomic % or lower (see FIGS. 18(c) and 18(d)). In the same manner as in the second embodiment, a nitrogen-added silicon oxide layer 42 having a two-layer structure consisting of the silicon oxide layer 42a and the nitrogen-containing layer 42b is formed. Through this nitriding procedure, the hole injecting efficiency in each memory cell is increased. It should be noted here that, in the drawings illustrating the manufacturing procedures carried out after this nitriding procedure, the silicon oxide layer 42 having the two-layer structure consisting of the silicon oxide layer 42a and the nitrogen-containing layer 42b is shown as a single-layer silicon oxide layer 42.

An amorphous silicon layer of 2 nm in thickness is then deposited on the silicon oxide layer 42 with the use of a disilane gas. It is preferable that the substrate temperature at this point is 550° C. or lower. The atmosphere at the time of deposition of the amorphous silicon layer may contain oxygen, NO, or N$_2$O. If the atmosphere contains NO or N$_2$O in this case, the resultant amorphous silicon layer contains a small amount of nitrogen. The temperature of the silicon substrate 1 is set at 750° C., and the atmosphere in the chamber is changed to a N$_2$ gas having a partial pressure of 30 Torr and an O$_2$ gas having a partial pressure of 3 Torr, for example. These conditions are maintained for ten seconds. In this manner, a small amount of oxygen is added to the amorphous silicon layer, and an oxygen-added amorphous silicon layer is formed. As in the first embodiment, the oxidizing temperature at this point should preferably be 700° C. or higher, at which the hydrogen in the amorphous silicon layer is detached. However, the oxidizing temperature cannot be too high, and should preferably be 800° C. or lower. Furthermore, it is preferable to supply oxygen while the temperature is rising. Also, the time required for the temperature to rise to a point between 700° C. and 800° C. should preferably be ten seconds or less. Ideally, while oxygen is being supplied, the heating-up time is ten seconds or less, and the oxidation time is ten seconds or less. After that, the atmosphere in the chamber is changed to a $N_2$ gas having a partial pressure of 30 Torr and a $NH_3$ gas having a partial pressure of 0.03 Torr, for example. The surface of the silicon substrate 1 is then set at 750° C., and is maintained at that temperature for 400 seconds. In this manner, the amorphous silicon layer is nitrided to form a silicon oxynitride layer 43 (see FIGS. 18(e) and 18(f)). As described in the first embodiment, the silicon oxynitride layer 43 formed by the manufacturing method in accordance with this embodiment is a high-quality silicon oxynitride layer having few defects.

The temperature of the silicon substrate 1 is then set at 800° C., and the atmosphere in the chamber is changed to a $N_2$ gas having a partial pressure of 30 Torr and an $O_2$ gas having a partial pressure of 0.03 Torr. These conditions are maintained for 100 seconds. As a result, the Si—N—H in the silicon oxynitride layer 43 is oxidized, and the hydrogen radicals are reduced. Thus, a high-quality silicon oxynitride layer 43 having high reliability can be formed. This procedure is not carried out in the first and second embodiments.

The temperature of the silicon substrate 1 is then set at 750° C. or higher, and a 2.5-nm thick silicon oxide layer 44 is deposited on the silicon oxynitride layer 43 by HTO. By doing so, the tunnel insulating film 45 including the silicon oxide layer 42, the silicon oxynitride layer 43, and the silicon oxide layer 44 is formed as shown in FIGS. 18(e) and 18(f). It should be noted here that, in the drawings illustrating the manufacturing procedures carried out after this procedure, the tunnel insulating film 45 having the three-layer structure consisting of the silicon oxide layer 42, the silicon oxynitride layer 43, and the silicon oxide layer 44 is shown as a single-layer tunnel insulating film 45.

A 6-nm thick nitride film to be the charge storage film 46 such as a $Si_3N_4$ film is then deposited on the tunnel insulating film 45 by CVD, and a mask material 47 for device isolation is deposited by CVD. After that, etching is performed on the mask material 47, the nitride film (the charge storage film) 46, and the tunnel insulating film 45 in this order by RIE with the use of a resist mask (not shown). Etching is further performed on the exposed regions of the silicon substrate 1, so as to form device isolation grooves 48 of 100 nm in depth, as shown in FIGS. 19(a) and 19(b).

A silicon oxide film 49 for device isolation is then deposited on the entire surface, so as to completely fill the device isolation grooves 48. After that, the portion of the silicon oxide film 49 on the surface is removed by CMP, so that the surface is flattened. At this point, the mask material 47 is exposed (see FIGS. 19(c) and 19(d)).

The exposed mask material 47 is selectively removed by etching, and the exposed surface portions of the silicon oxide film 49 are removed by etching with the use of a diluted hydrofluoric acid solution. After that, a 15-nm thick alumina layer 50a to be the interelectrode insulating film is formed on the entire surface by ALD. Due to the oxidizing agent used in the film formation by ALD, a very thin silicon oxide layer 50b is formed at the interface between the alumina layer 50a and the nitride film (the charge storage film) 46. As a result, a 16-nm thick interelectrode insulating film 50 having a two-layer structure consisting of the alumina layer 50a and the silicon oxide layer 50b is formed (see FIGS. 20(a) and 20(b)).

A 100-nm thick conductive film 51 having a two-layer structure consisting of a polycrystalline silicon layer and a tungsten silicide layer is formed to be the control gate electrode on the interelectrode insulating film 50 in the same manner as in the first embodiment. Further, a mask material 52 for RIE is deposited by CVD. After that, etching is performed by RIE with the use of a resist mask (not shown) on the mask material 52, the conductive film 51, the interelectrode insulating film 50, the charge storage film 56, and the tunnel insulating film 55 in this order, so as to form the gate having a stacked structure. In this manner, the shape of the gate having the stacked structure is defined, and grooves 54 extending in the word-line direction (the direction in which the control gate electrode 51 extends) are formed on the side of this gate having the stacked structure (see FIGS. 20(c) and 20(d)).

As shown in FIGS. 21(a) and 21(b), a silicon oxide film 56 is then formed on the side faces and the upper face of the gate having the stacked structure by a thermal oxidation technique. After that, the source and drain regions 57a and 57b are formed by an ion injection technique. The region of the silicon substrate 1 located between the source region 57a and the drain region 57b is the channel region 58. Further, an interlayer insulating film 59 is formed to cover the entire surface by CVD. After that, a wiring layer and the likes are formed by known techniques, so as to complete the nonvolatile semiconductor memory (see FIGS. 21(a) and 21(b)).

Figure 22:
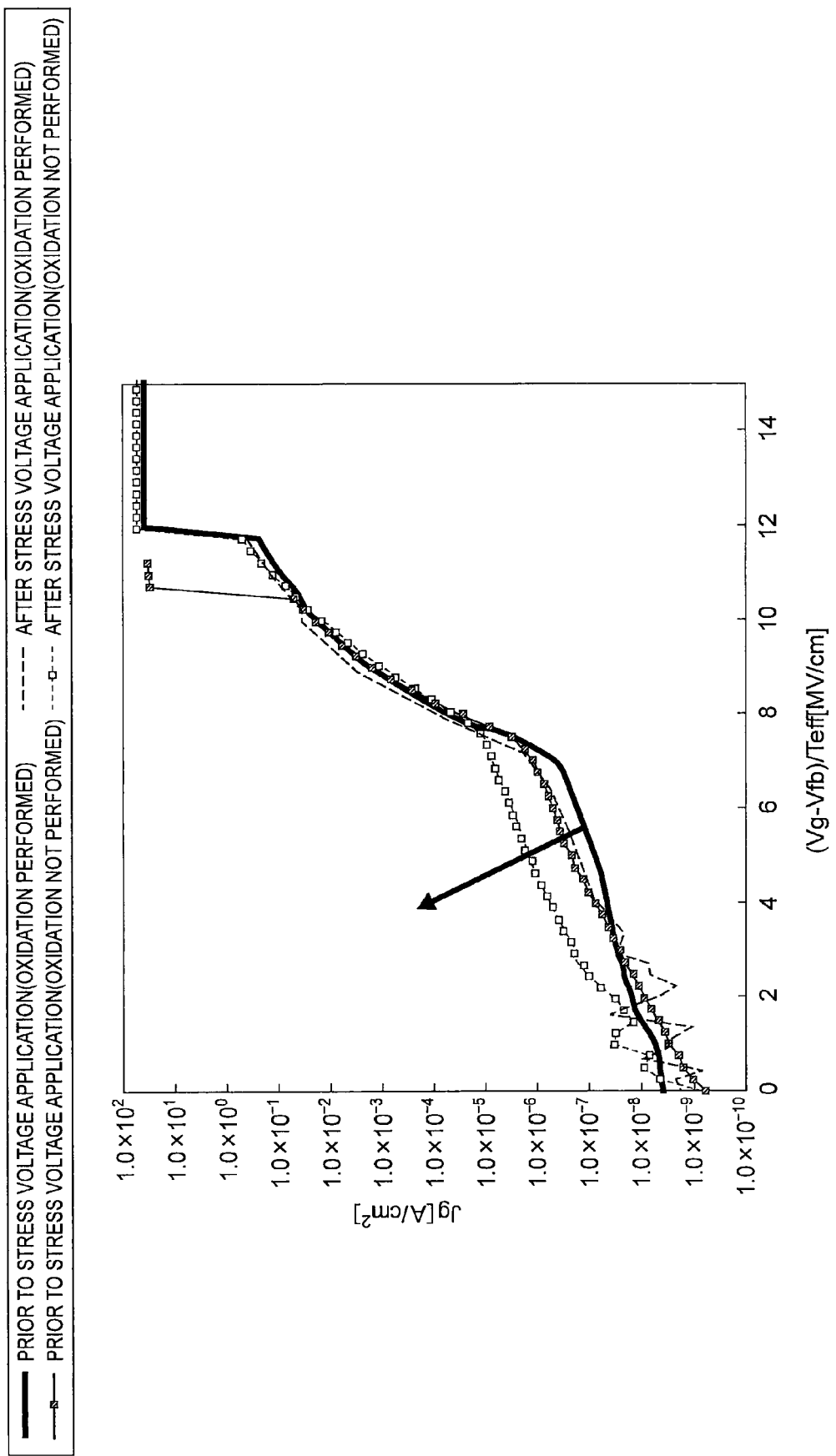
FIG. 22 shows the differences in reliability between a case where a heat treatment is carried out in an oxidizing atmosphere after nitridation and a case where the heat treatment is not carried out.
Figure 23:
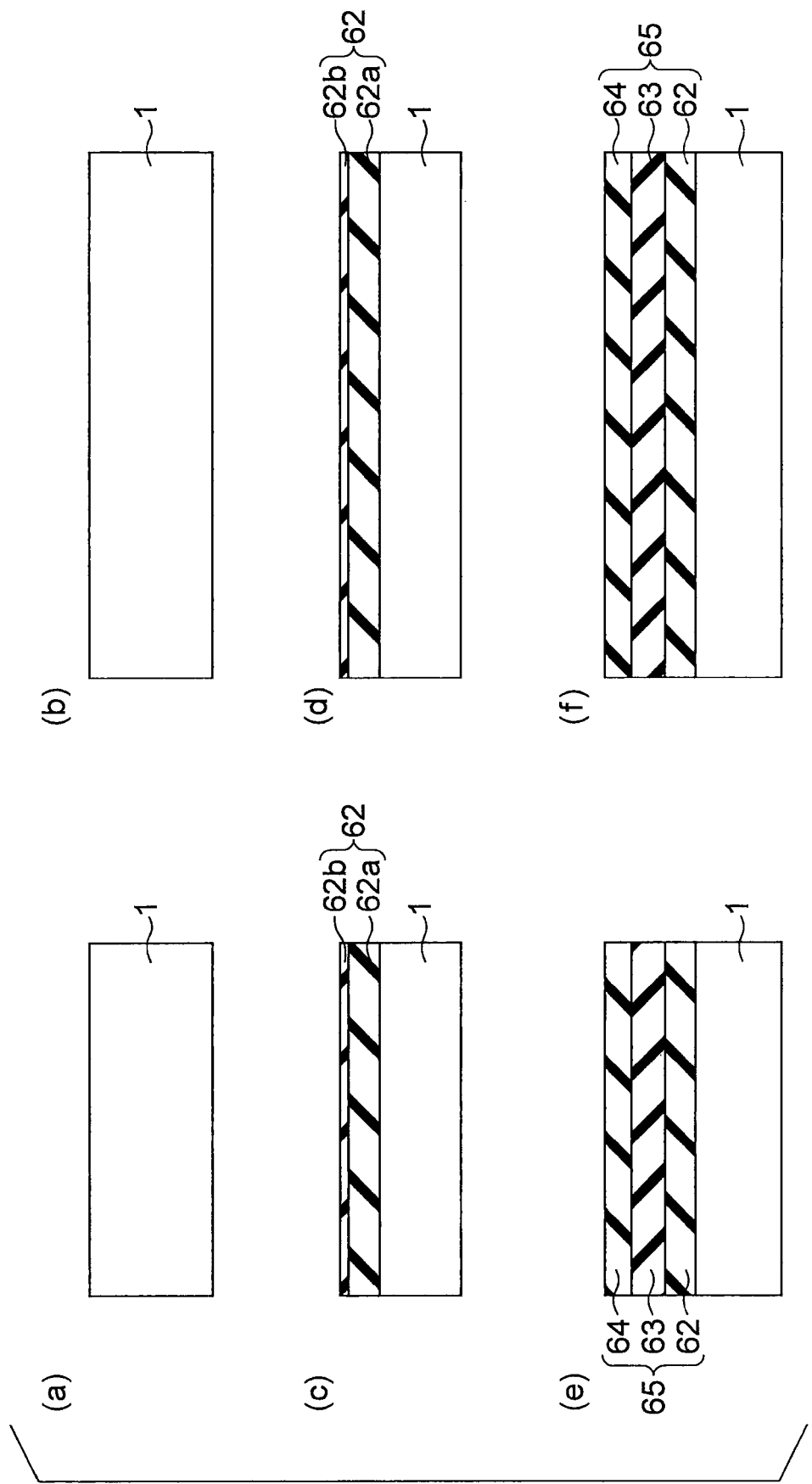
Figure 24:
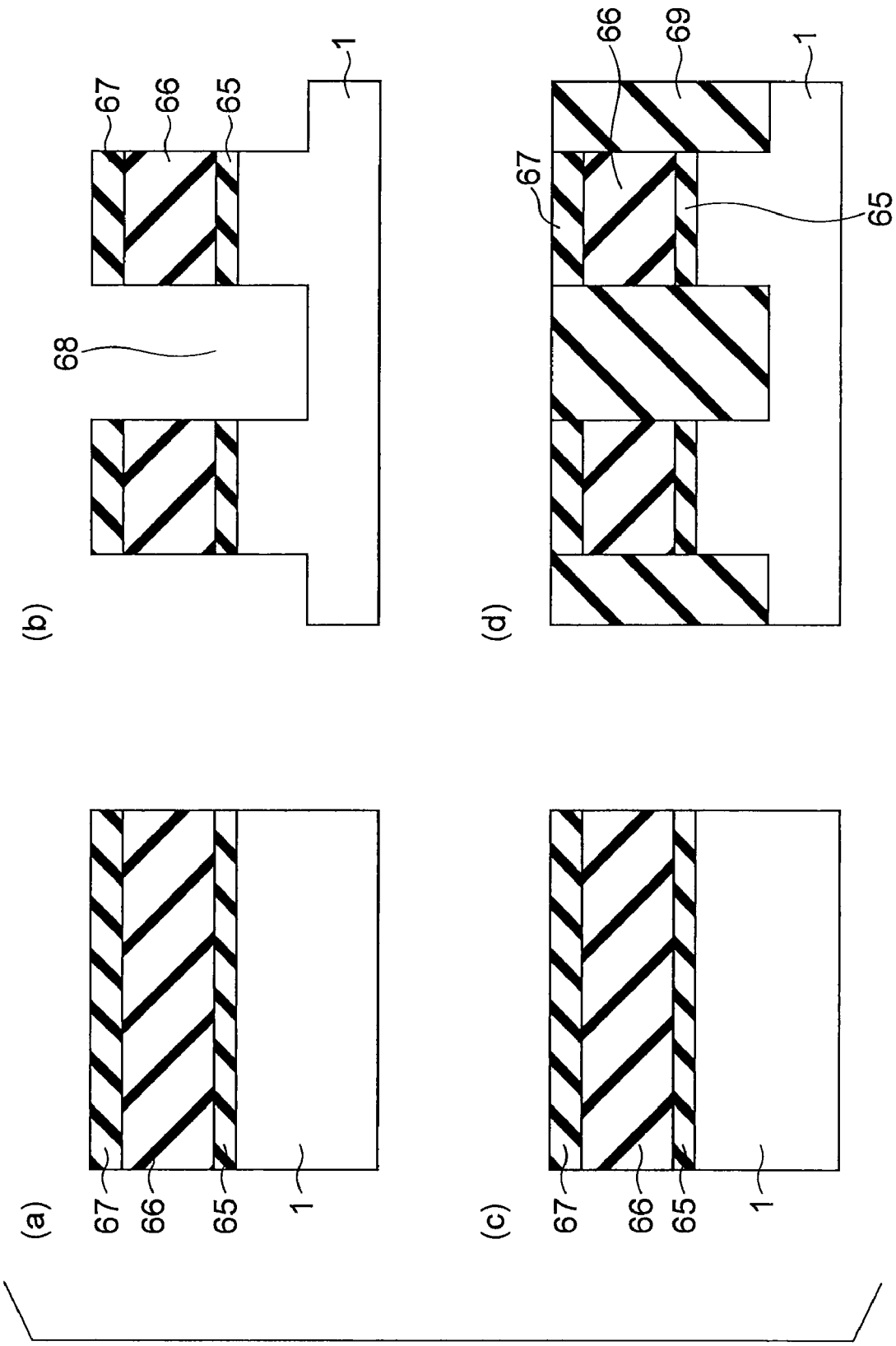
Figure 25:
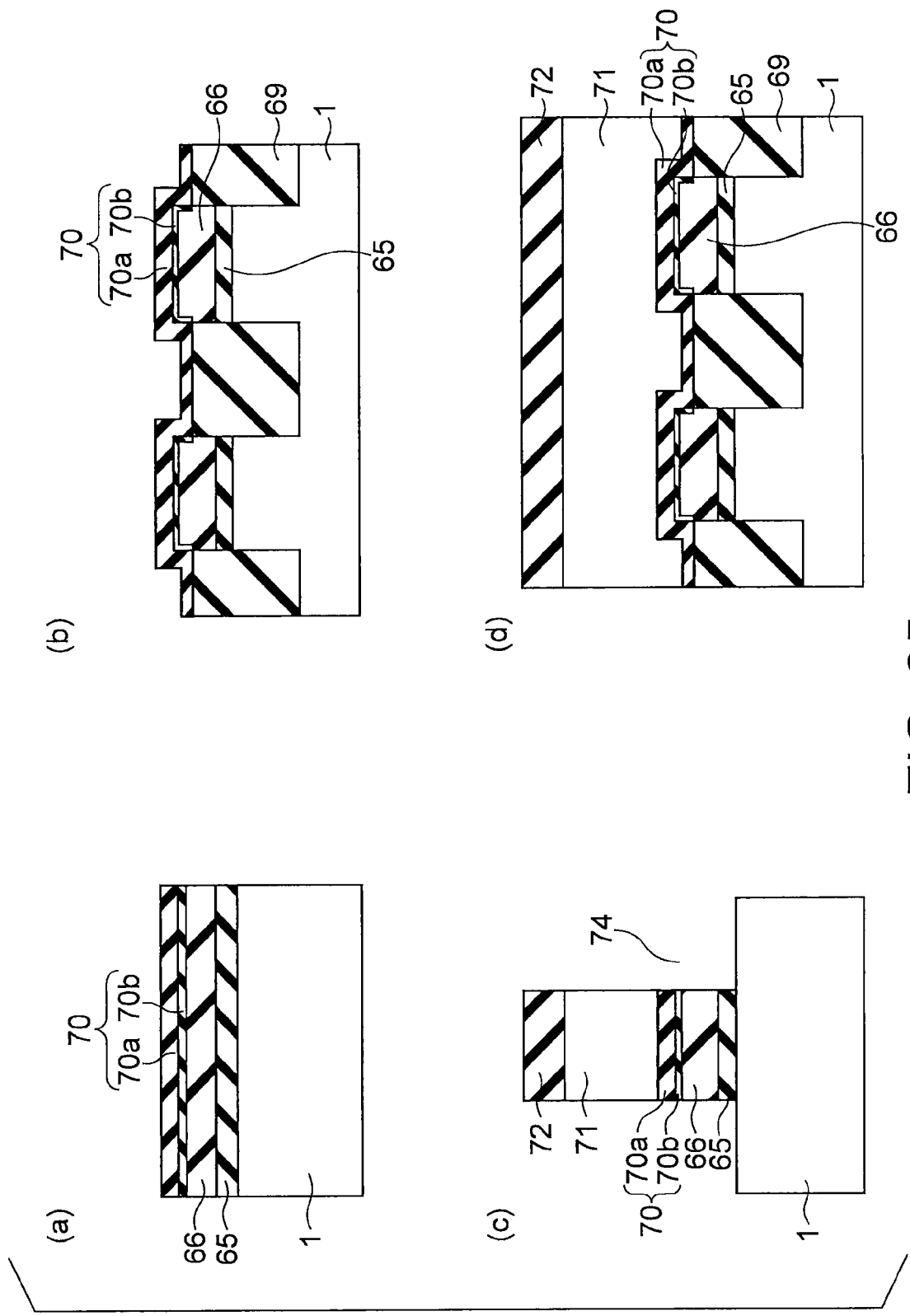
Figure 26:
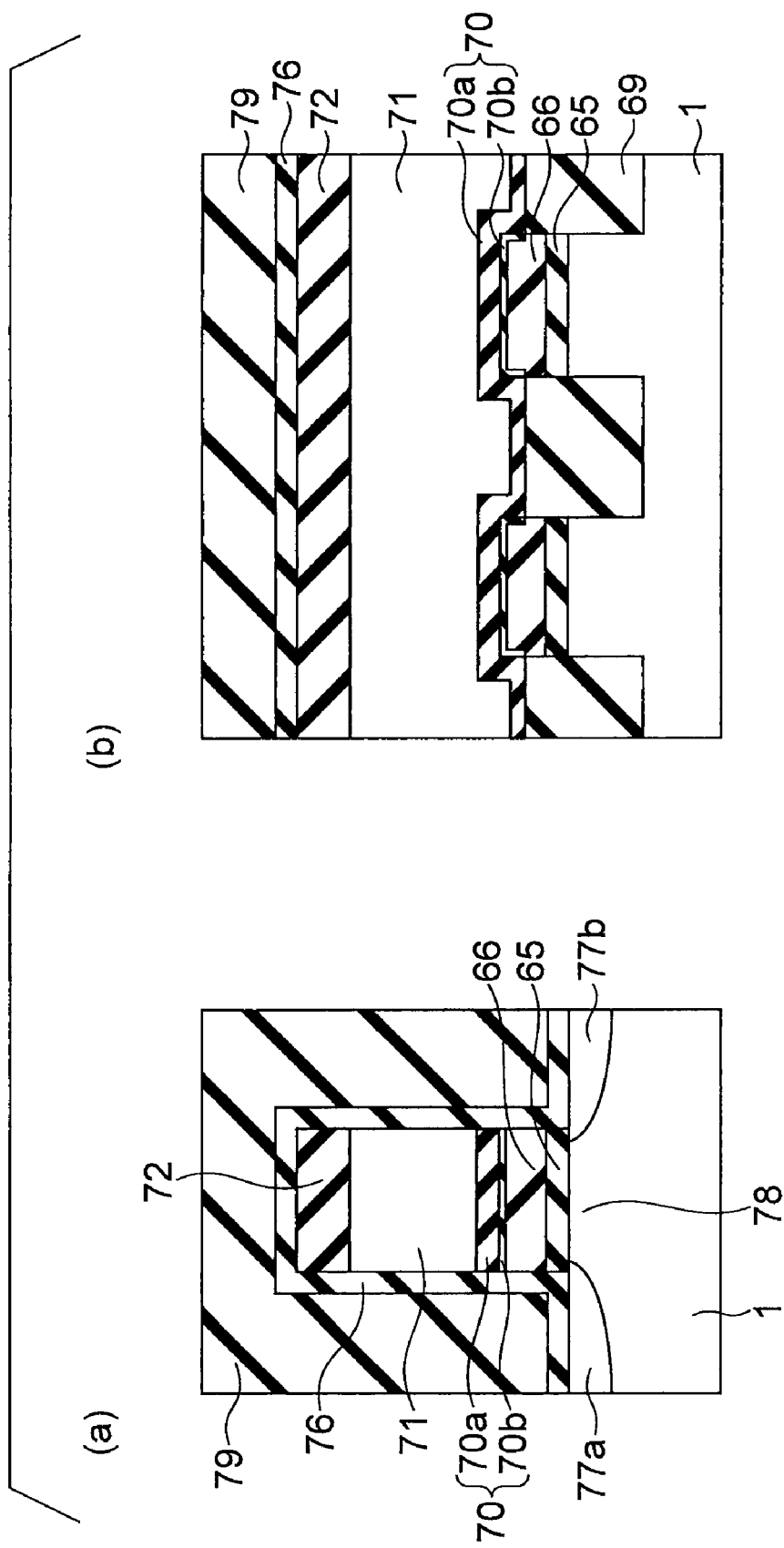

By carrying out a heat treatment in an oxidizing atmosphere after the amorphous silicon layer is nitrided in the above described manner, the reliability described in the first embodiment can be further increased. FIG. 22 shows the differences in SILC properties or reliability between a case where a heat treatment is carried out in an oxidizing atmosphere after the nitridation, and a case where the heat treatment is not carried out. As can be seen from FIG. 22, the SILC is reduced by carrying out the heat treatment in an oxidizing atmosphere after the amorphous silicon layer is nitrided. This is because Si—N—H in the silicon oxynitride layer 43 is oxidized, and the hydrogen radicals are reduced.

In this manner, a high-quality stacked structure formed with a $SiO_2$ layer, a SiON layer, and a $SiO_2$ layer can be realized by carrying out a heat treatment in an oxidizing atmosphere after the amorphous silicon layer is nitrided.

The silicon oxynitride layer 43 has a layer thickness of 1.5 nm to 2.5 nm, and nitrogen concentration of 20 atomic % to 47 atomic %. In other words, 10 atomic % to 30 atomic % of oxygen is contained in the silicon oxynitride layer 43, and at least one of the second nearest neighbor atoms of the silicon is nitrogen. This is because oxygen is added to the amorphous silicon layer. In the silicon oxide layer 42, a small amount of nitrogen is diffused when the amorphous silicon layer is nitrided. Therefore, an average of 10 atomic % of nitrogen is contained at a maximum.

In this embodiment, radical nitridation or plasma nitridation is performed on the surface of the silicon oxide layer 42. However, to prevent nitrogen from penetrating through the silicon oxide layer 42 and nitriding the silicon substrate, it is not necessary to perform radical nitridation or plasma nitridation, and $NH_3$ or NO may be used instead.

Although an $O_2$ gas is used when oxygen is added to the amorphous silicon layer in this embodiment, the gas used at the time of adding oxygen is not limited to an $O_2$ gas, and it is possible to use any oxidizing gas such as NO, $N_2O$, $O_3$, O radicals, or O plasma. However, those gases differ from $O_2$ in oxidation power. Therefore, when one of those gases is used, it is necessary to adjust the oxygen adding conditions in such a manner that the oxygen concentration in the silicon oxynitride layer 43 is in the range of 10 atomic % to 30 atomic %.

Although a $NH_3$ gas is used when the amorphous silicon layer is nitrided in this embodiment, the gas used at the time of nitridation is not limited to a $NH_3$ gas, and it is possible to use any nitriding gas such as NO, N radicals, NH radicals, $N_2$ radicals, N plasma, NH plasma, or $N_2$ plasma.

Although HTO is used in the process for forming the $SiO_2$ layer in this embodiment, some other technique such as CVD or ALD may be used, as long as the $SiO_2$ layer can be properly deposited.

As described so far, this embodiment can provide a semiconductor device that has a high-quality tunnel insulating film in which defects are not easily formed. This semiconductor device experiences less leakage current.

Fourth Embodiment

Referring now to FIGS. 23(a) to 26(b), a method for manufacturing a semiconductor device in accordance with a fourth embodiment of the present invention is described. FIGS. 23(a), 23(c), 23(e), 24(a), 24(c), 25(a), 25(c), and 26(a) are cross-sectional views that are taken perpendicularly to the cross-sectional views of FIGS. 23(b), 23(d), 23(f), 24(b), 24(d), 25(b), 25(d), and 26(b).

A semiconductor device in accordance with this embodiment is a MONOS nonvolatile semiconductor memory that includes memory cells arranged in a matrix fashion. As shown in FIGS. 26(a) and 26(b), each of the memory cells includes: source and drain regions 77a and 77b that are formed at a distance from each other on a silicon substrate 1; a tunnel insulating film 65 that is formed on a region 78 of the silicon substrate 1 located between the source region 77a and the drain region 77b; a charge storage film 66 that is formed on the tunnel insulating film 65 and is made of an insulating material in which charges can be stored; an interelectrode insulating film 70 that is formed on the charge storage film 66; and a control gate electrode 71 that is formed on the interelectrode insulating film 70.

Next, the method for manufacturing the semiconductor device in accordance with this embodiment is described. The manufacturing method in accordance with this embodiment differs from the manufacturing method in accordance with the third embodiment, in further including the procedure for oxidizing the tunnel insulating film including a silicon oxide layer, a silicon oxynitride layer, and a silicon oxide layer immediately after the formation of the silicon oxide layer on the silicon oxynitride layer.

First, as shown in FIGS. 23(a) and 23(b), the silicon substrate 1 doped with desired impurities is subjected to diluted HF treatment, so as to terminate the surface of the silicon substrate 1 with hydrogen. After that, the silicon substrate 1 is placed in the chamber of a film forming device. The chamber is filled only with a gas (such as a nitrogen gas) that does not react with or etch silicon during the manufacturing process. The temperature of the silicon substrate 1 is then heated to 700° C., so as to completely detach the hydrogen from the silicon substrate 1.

The chamber is then filled with a $N_2$ gas having a partial pressure of 30 Torr and an $O_2$ gas having a partial pressure of 3 Torr, for example. The surface of the silicon substrate 1 is heated to 1050° C., and is maintained at that temperature for ten seconds. In this manner, a silicon oxide layer 62a is formed on the silicon substrate 1, as shown in FIGS. 23(c) and 23(d). Radical nitridation or plasma nitridation is then performed on the surface of the silicon oxide layer 62a. By doing so, a nitrogen-containing layer 62b is formed on the surface of the silicon oxide layer 62a, and nitrogen is introduced into the silicon oxide layer 62a so that the peak concentration in the profile becomes 10 atomic % or lower (see FIGS. 23(c) and 23(d)). In the same manner as in the second embodiment, a nitrogen-added silicon oxide layer 62 having a two-layer structure consisting of the silicon oxide layer 62a and the nitrogen-containing layer 62b is formed. Through this nitriding procedure, the hole injecting efficiency in each memory cell is increased. It should be noted here that, in the drawings illustrating the manufacturing procedures carried out after this nitriding procedure, the silicon oxide layer 62 having the two-layer structure consisting of the silicon oxide layer 62a and the nitrogen-containing layer 62b is shown as a single-layer silicon oxide layer 62.

An amorphous silicon layer of 2 nm in thickness is then deposited on the silicon oxide layer 62 with the use of a disilane gas. It is preferable that the substrate temperature at this point is 550° C. or lower. The atmosphere at the time of deposition of the amorphous silicon layer may contain oxygen, NO, or $N_2O$. If the atmosphere contains NO or $N_2O$ in this case, the resultant amorphous silicon layer contains a small amount of nitrogen.

The temperature of the silicon substrate 1 is then set at 750° C., and the atmosphere in the chamber is changed to a $N_2$ gas having a partial pressure of 30 Torr and an $O_2$ gas having a partial pressure of 3 Torr, for example. These conditions are maintained for ten seconds. In this manner, a small amount of oxygen is added to the amorphous silicon layer, and an oxygen-added amorphous silicon layer is formed. As in the first embodiment, the oxidizing temperature at this point should preferably be 700° C. or higher, at which the hydrogen in the amorphous silicon layer is detached. However, the oxidizing temperature cannot be too high, and should preferably be 800° C. or lower. Furthermore, it is preferable to supply oxygen while the temperature is rising. Also, as in the first embodiment, the time required for the temperature to rise to a point between 700° C. and 800° C. should preferably be ten seconds or less. Ideally, while oxygen is being supplied, the heating-up time is ten seconds or less, and the oxidation time is ten seconds or less. After that, the atmosphere in the chamber is changed to a $N_2$ gas having a partial pressure of 30 Torr and a $NH_3$ gas having a partial pressure of 0.03 Torr, for example. The surface of the silicon substrate 1 is then set at 750° C., and is maintained at that temperature for 400 seconds. In this manner, the amorphous silicon layer is nitrided to form a silicon oxynitride layer 63 (see FIGS. 23(e) and 23(f)). As described in the first embodiment, the silicon oxynitride layer 63 formed by the manufacturing method in accordance with this embodiment is a high-quality silicon oxynitride layer having few defects.

The temperature of the silicon substrate 1 is then set at 800° C., and the atmosphere in the chamber is changed to a $N_2$ gas having a partial pressure of 30 Torr and an $O_2$ gas having a partial pressure of 0.03 Torr. These conditions are maintained for 100 seconds. As a result, the Si—N—H in the silicon oxynitride layer 63 is oxidized, and the hydrogen radicals are reduced. Thus, a high-quality silicon oxynitride layer 63 having high reliability can be formed.

The temperature of the silicon substrate 1 is then set at 750° C. or higher, and a 2.5-nm thick silicon oxide layer 64 is deposited on the silicon oxynitride layer 63 by HTO. By doing so, the tunnel insulating film 65 including the silicon oxide layer 62, the silicon oxynitride layer 63, and the silicon oxide layer 64 is formed as shown in FIGS. 23(e) and 23(f). The temperature of the silicon substrate 1 is then set at 950° C., and the atmosphere in the chamber is changed to a $N_2$ gas having a partial pressure of 760 Torr and an $O_2$ gas having a partial pressure of 3 Torr. These conditions are maintained for one hour. By doing so, the small amount of hydrogen radicals in the tunnel insulating film 65 is oxidized, and the defects in the film are oxygen-terminated. Thus, the tunnel insulating film 65 can have higher quality and reliability. It should be noted here that, in the drawings illustrating the manufacturing procedures carried out after this procedure, the tunnel insulating film 65 having the three-layer structure consisting of the silicon oxide layer 62, the silicon oxynitride layer 63, and the silicon oxide layer 64 is shown as a single-layer tunnel insulating film 65.

A 6-nm thick nitride film 66 to be the charge storage film such as a $Si_3N_4$ film is then deposited on the tunnel insulating film 65 by CVD, and a mask material 67 for device isolation is deposited by CVD. After that, etching is performed on the mask material 67, the nitride film (the charge storage film) 66, and the tunnel insulating film 65 in this order by RIE with the use of a resist mask (not shown). Etching is further performed on the exposed regions of the silicon substrate 1, so as to form device isolation grooves 68 of 100 nm in depth, as shown in FIGS. 24(a) and 24(b).

A silicon oxide film 69 for device isolation is then deposited on the entire surface, so as to completely fill the device isolation grooves 68. After that, the portion of the silicon oxide film 69 on the surface is removed by CMP, so that the surface is flattened. At this point, the mask material 67 is exposed (see FIGS. 24(c) and 24(d)).

The exposed mask material 67 is selectively removed by etching, and the exposed surface portions of the silicon oxide film 69 are removed by etching with the use of a diluted hydrofluoric acid solution. After that, a 15-nm thick alumina layer 70a to be the interelectrode insulating film is formed on the entire surface by ALD. Due to the oxidizing agent used in the film formation by ALD, a very thin silicon oxide layer 70b is formed at the interface between the alumina layer 70a and the nitride film 66. As a result, a 16-nm thick interelectrode insulating film 70 having a two-layer structure consisting of the silicon oxide layer 70b and the alumina layer 70a is formed (see FIGS. 25(a) and 25(b)).

A 100-nm thick conductive film 71 having a two-layer structure consisting of a polycrystalline silicon layer and a tungsten silicide layer is formed to be the control gate electrode on the interelectrode insulating film 70 in the same manner as in the first embodiment. Further, a mask material 72 for RIE is deposited by CVD. After that, etching is performed by RIE with the use of a resist mask (not shown) on the mask material 72, the conductive film 71, the interelectrode insulating film 70, the charge storage film 66, and the tunnel insulating film 65 in this order, so as to form the gate having a stacked structure. In this manner, the shape of the gate having the stacked structure is defined, and grooves 73 extending in the word-line direction (the direction in which the control gate electrode 71 extends) are formed on the side of this gate having the stacked structure (see FIGS. 25(c) and 25(d)).

As shown in FIGS. 26(a) and 26(b), a silicon oxide film 74 is then formed on the side faces and the upper face of the gate having the stacked structure by a thermal oxidation technique. After that, the source and drain regions 77a and 77b are formed by an ion injection technique. The region of the silicon substrate 1 located between the source region 77a and the drain region 77b is the channel region 78. Further, an interlayer insulating film 79 is formed to cover the entire surface by CVD (see FIGS. 26(a) and 26(b)). After that, a wiring layer and the likes are formed by known techniques, so as to complete the nonvolatile semiconductor memory.

By carrying out a heat treatment in an oxidizing atmosphere after the oxide layer is deposited by HTO in the above described manner, the reliability described in the first embodiment and the third embodiment can be further increased. However, just carrying out a heat treatment will not suffice. To achieve desired characteristics, it is essential that a heat treatment is carried out in an oxidizing atmosphere under certain heat treatment conditions.

Figure 27:
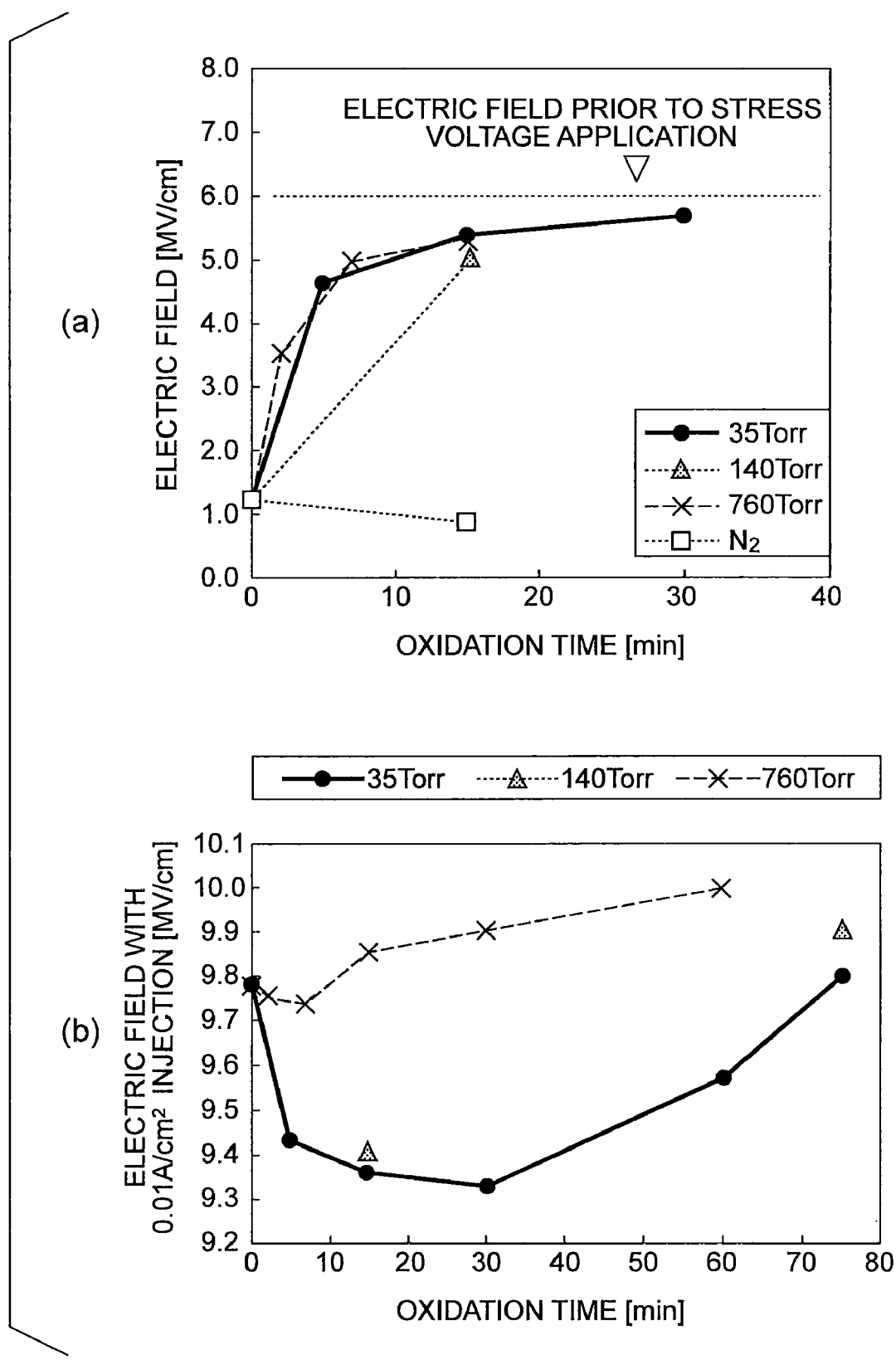
FIGS. 27(a) and 27(b) show the relationship between the heat treatment conditions in an oxidizing atmosphere and the reliability.

Referring now to FIGS. 27(a) and 27(b), the relationship between the heat treatment conditions in an oxidizing atmosphere and the reliability is described. FIGS. 27(a) and 27(b) show the SILC properties, with the oxygen partial pressure and the oxidation time being varied. More specifically, FIG. 27(a) shows the dependence of the electric field on the oxidation time observed when a leakage current of $10^{-7}$ A/cm$^2$ flows before and after the 0.01 C/cm$^2$ injection. FIG. 27(b) shows the electric field at the time of the 0.01 C/cm$^2$ injection. The oxidation temperature is 950° C. As can be seen from FIG. 27(a), no improvements are observed in a $N_2$ atmosphere, but the electric field, which is 1 MV/cm where the heat treatment is not carried out, is increased to approximately 5.5 MV/cm by the heat treatment in an oxidizing atmosphere. This indicates that the SILC properties are greatly improved by performing oxidation at 950° C. for ten minutes or longer, regardless of the pressure. This result confirms that the heat treatment in an oxidizing atmosphere for ten minutes or longer is essential in improving the reliability. As for the oxidation temperature, the same effects as above can be expected when the oxidation temperature is in the range of 900° C. to 950° C.

Figure 28:
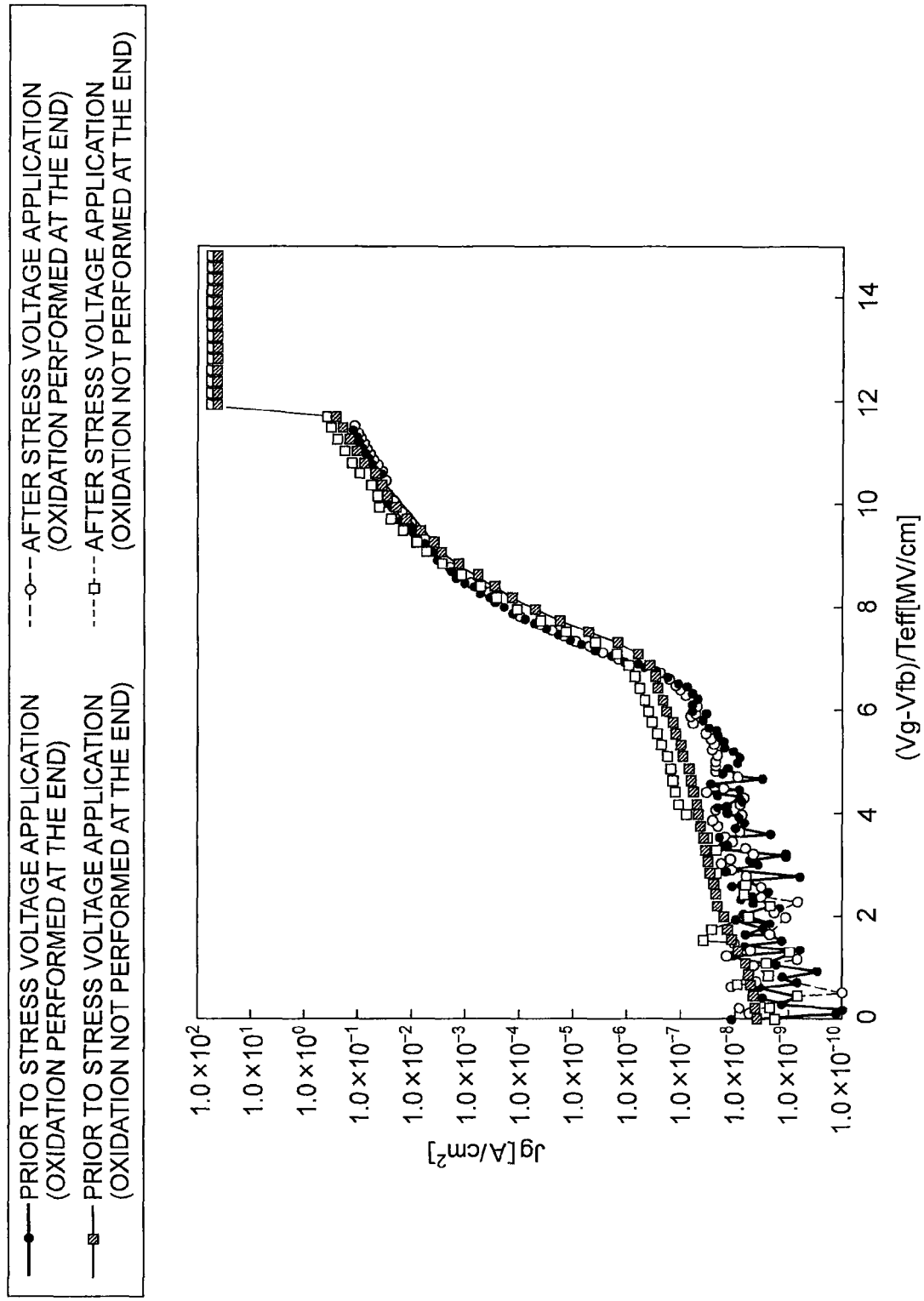
FIG. 28 shows the relationship between the oxidation time and the electric field required to inject 0.01 A/cm² of electrons.

However, excessive oxidation is not preferable to achieve high injection efficiency, even though the reliability becomes higher. FIG. 28 shows the relationship between the oxidation time and the electric field required to inject 0.01 A/cm$^2$ of electrons. As can be seen from FIG. 28, the induced electric field is increased by performing oxidation for one hour or longer. Also, the induced electric field is increased, if the oxygen partial pressure is too high. This is because the oxygen concentration in the oxide layer is reduced by the oxidation, and the electron injection efficiency becomes lower. Therefore, oxidation performed for ten minutes or longer, but not longer than one hour, is essential in increasing the reliability while maintaining high injection efficiency.

In this manner, a high-quality stacked structure formed with a $SiO_2$ layer, a SiON layer, and a $SiO_2$ layer can be realized by carrying out a heat treatment in an optimum oxidizing atmosphere after an oxide layer is deposited by HTO.

The silicon oxynitride layer 63 has a layer thickness of 1.5 nm to 2.5 nm, and nitrogen concentration of 20 atomic % to 47 atomic %. In other words, 10 atomic % to 30 atomic % of oxygen is contained in the silicon oxynitride layer 63, and at least one of the second nearest neighbor atoms of the silicon is nitrogen. This is because oxygen is added to the amorphous silicon layer. In the silicon oxide layer 62, a small amount of nitrogen is diffused when the amorphous silicon layer is nitrided. Therefore, an average of 10 atomic % of nitrogen is contained at a maximum.

In this embodiment, radical nitridation or plasma nitridation is performed on the surface of the silicon oxide layer. However, to prevent nitrogen from penetrating through the silicon oxide layer, it is not necessary to perform radical nitridation or plasma nitridation, and $NH_3$ or NO may be used instead.

Although an $O_2$ gas is used when oxygen is added to the amorphous silicon layer in this embodiment, the gas used at the time of adding oxygen is not limited to an $O_2$ gas, and it is possible to use any oxidizing gas such as NO, $N_2O$, $O_3$, O radicals, or O plasma. However, those gases differ from $O_2$ in oxidation power. Therefore, when one of those gases is used, it is necessary to adjust the oxygen adding conditions in such a manner that the oxygen concentration in the silicon oxynitride layer is in the range of 10 atomic % to 30 atomic %.

Although a $NH_3$ gas is used when the amorphous silicon layer is nitrided in this embodiment, the gas used at the time of nitridation is not limited to a $NH_3$ gas, and it is possible to use any nitriding gas such as NO, N radicals, NH radicals, $N_2$ radicals, N plasma, NH plasma, or $N_2$ plasma.

Although HTO is used in the process for forming the $SiO_2$ layer 64 in this embodiment, some other technique such as CVD or ALD may be used, as long as the $SiO_2$ layer 64 can be properly deposited.

In this embodiment, a heat treatment is carried out in an oxidizing atmosphere after the oxide layer 64 is deposited by HTO. This greatly reduces the hydrogen in the stacked structure formed with a $SiO_2$ layer, a SiON layer, and a $SiO_2$ layer. Accordingly, as long as a heat treatment is carried out in an oxidizing atmosphere after the oxide layer 64 is deposited by HTO, the temperature at which oxygen is added to the amorphous silicon layer and the temperature at which nitridation is performed on the amorphous silicon layer may not be very high, and may be 400° C. or higher.

As described so far, this embodiment can provide a semiconductor device that has a high-quality tunnel insulating film in which defects are not easily formed. This semiconductor device experiences less leakage current.

Fifth Embodiment

Figure 29:
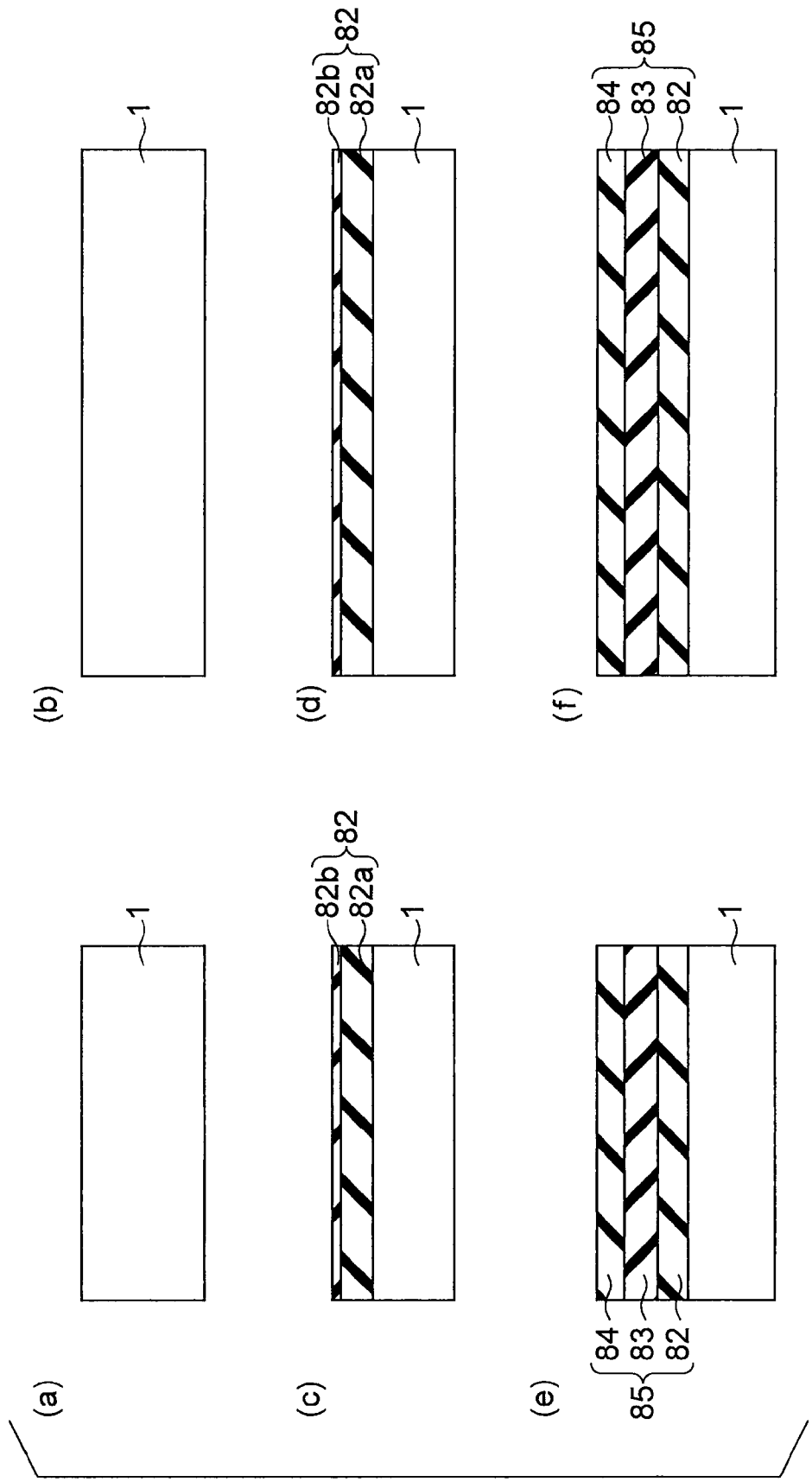

Referring now to FIGS. 29(*a*) to 32(*b*), a method for manufacturing a semiconductor device in accordance with a fifth embodiment of the present invention is described. FIGS. 29(*a*), 29(*c*), 29(*e*), 30(*a*), 30(*c*), 31(*a*), 31(*c*), and 32(*a*) are cross-sectional views that are taken perpendicularly to the cross-sectional views of FIGS. 29(*b*), 29(*d*), 29(*f*), 30(*b*), 30(*d*), 31(*b*), 31(*d*), and 32(*b*).

Figure 32:
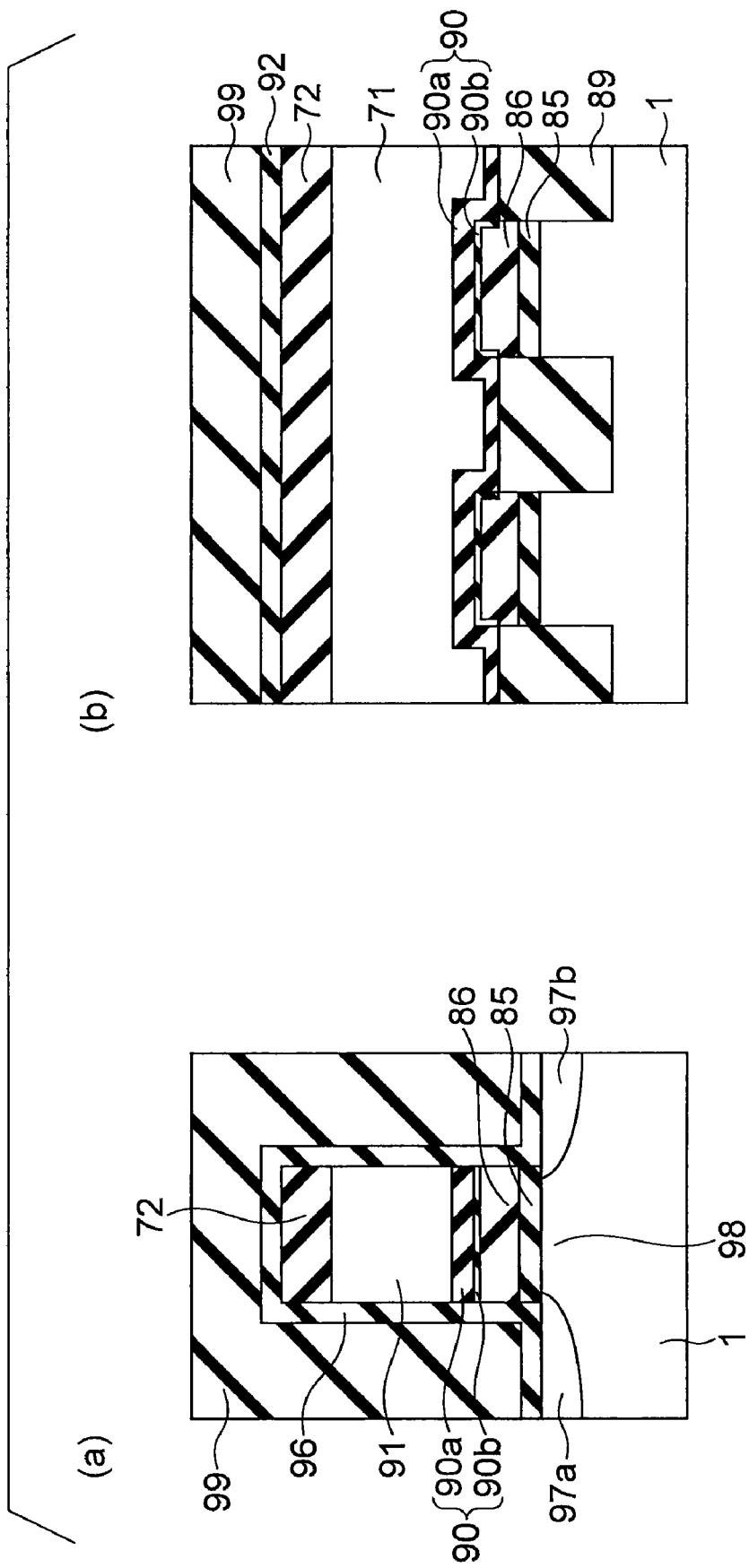

A semiconductor device in accordance with this embodiment is a MONOS nonvolatile semiconductor memory that includes memory cells arranged in a matrix fashion. As shown in FIGS. 32(*a*) and 32(*b*), each of the memory cells includes: source and drain regions 97*a* and 97*b* that are formed at a distance from each other on a silicon substrate 1; a tunnel insulating film 85 that is formed on a region 98 of the silicon substrate 1 located between the source region 97*a* and the drain region 97*b* to be channel; a charge storage film 86 that is formed on the tunnel insulating film 85 and is made of an insulating material in which charges can be stored; an interelectrode insulating film 90 that is formed on the charge storage film 86; and a control gate electrode 91 that is formed on the interelectrode insulating film 90.

Next, the method for manufacturing the semiconductor device in accordance with this embodiment is described. The manufacturing method in accordance with this embodiment differs from the manufacturing method in accordance with the fourth embodiment, in further including the procedure for introducing Ge into the silicon oxide layer formed below the silicon oxynitride layer, before nitriding the surface.

First, as shown in FIGS. 29(*a*) and 29(*b*), the silicon substrate 1 doped with desired impurities is subjected to diluted HF treatment, so as to terminate the surface of the silicon substrate 1 with hydrogen. After that, the silicon substrate 1 is placed in the chamber of a film forming device. The chamber is filled only with a gas (such as a nitrogen gas) that does not react with or etch silicon during the manufacturing process. The temperature of the silicon substrate 1 is then heated to 700° C., so as to completely detach the hydrogen from the silicon substrate 1.

The chamber is then filled with a $N_2$ gas having a partial pressure of 30 Torr and an $O_2$ gas having a partial pressure of 3 Torr, for example. The surface of the silicon substrate 1 is heated to 1050° C., and is maintained at that temperature for ten seconds. In this manner, a silicon oxide layer is formed on the silicon substrate 1, as shown in FIGS. 29(*c*) and 29(*d*). After that, Ge is diffused in the silicon oxide layer by a technique such as implantation or a heat treatment, so as to form a silicon oxide layer 82*a* having a Ge distribution with a peak of $1 \times 10^{13}$ $cm^{-2}$ in the silicon oxide layer. The atmosphere in the chamber is then changed to an $O_2$ gas having a partial pressure of 3 Torr, for example, and the surface of the silicon substrate 1 is heated to 750° C. and is maintained at that temperature for ten seconds. By doing so, the Ge in the silicon oxide layer 82*a* is oxidized, and a Ge level having an energy level approximately 0.7 eV below the conduction band of $SiO_2$ is formed in the silicon oxide layer 82*a*. Radical nitridation or plasma nitridation is then performed on the surface of the silicon oxide layer 82*a*. By doing so, a nitrogen-containing layer 82*b* is formed on the surface of the silicon oxide layer 82*a*, and 10 atomic % or less of nitrogen is introduced into the silicon oxide layer 82*a*. Through this nitriding procedure, the hole injecting efficiency in each memory cell is increased. It should be noted here that, in the drawings illustrating the manufacturing procedures carried out after this procedure, the silicon oxide layer 82 having the two-layer structure consisting of the silicon oxide layer 82*a* and the nitrogen-containing layer 82*b* is shown as a single-layer silicon oxide layer 82.

An amorphous silicon layer of 2 nm in thickness is then deposited on the silicon oxide layer 82 with the use of a disilane gas. It is preferable that the temperature of the silicon substrate 1 at this point is 550° C. or lower. The temperature of the silicon substrate 1 is then set at 750° C., and the atmosphere in the chamber is changed to a $N_2$ gas having a partial pressure of 30 Torr and an $O_2$ gas having a partial pressure of 3 Torr, for example. These conditions are maintained for ten seconds. In this manner, a small amount of oxygen is added to the amorphous silicon layer, and an oxygen-added amorphous silicon layer is formed. The oxidizing temperature at this point should preferably be 700° C. or higher, at which the hydrogen in the amorphous silicon layer is detached. However, the oxidizing temperature cannot be too high, and should preferably be 800° C. or lower. Furthermore, it is preferable to supply oxygen while the temperature is rising. Also, the time required for the temperature to rise to a point between 700° C. and 800° C. should preferably be ten seconds or less. Ideally, while oxygen is being supplied, the heating-up time is ten seconds or less, and the oxidation time is ten seconds or less. After that, the atmosphere in the chamber is changed to a $N_2$ gas having a partial pressure of 30 Torr and a $NH_3$ gas having a partial pressure of 0.03 Torr, for example. The surface of the silicon substrate 1 is then set at 750° C., and is maintained at that temperature for 400 seconds. In this manner, the amorphous silicon layer is nitrided to form a silicon oxynitride layer 83 (see FIGS. 29(*e*) and 29(*f*)). The temperature of the silicon substrate 1 is then set at 800° C., and the atmosphere in the chamber is changed to a $N_2$ gas having a partial pressure of 30 Torr and an $O_2$ gas having a partial pressure of 0.03 Torr. These conditions are maintained for 100 seconds. As a result, the Si—N—H in the silicon oxynitride layer 83 is oxidized, and the hydrogen radicals are reduced. Thus, a high-quality silicon oxynitride layer 83 having high reliability can be formed.

The temperature of the silicon substrate 1 is then set at 750° C. or higher, and a 2.5-nm thick silicon oxide layer 84 is deposited by HTO. By doing so, the tunnel insulating film 85 including the silicon oxide layer 82, the silicon oxynitride layer 83, and the silicon oxide layer 84 is formed as shown in FIGS. 29(e) and 29(f). The temperature of the silicon substrate 1 is then set at 950° C., and the atmosphere in the chamber is changed to a $N_2$ gas having a partial pressure of 760 Torr and an $O_2$ gas having a partial pressure of 3 Torr. These conditions are maintained for one hour. By doing so, the small amount of hydrogen radicals in the tunnel insulating film 85 is oxidized, and the defects in the tunnel insulating film 85 are oxygen-terminated. Thus, the tunnel insulating film 85 can have higher quality and reliability.

Figure 30:
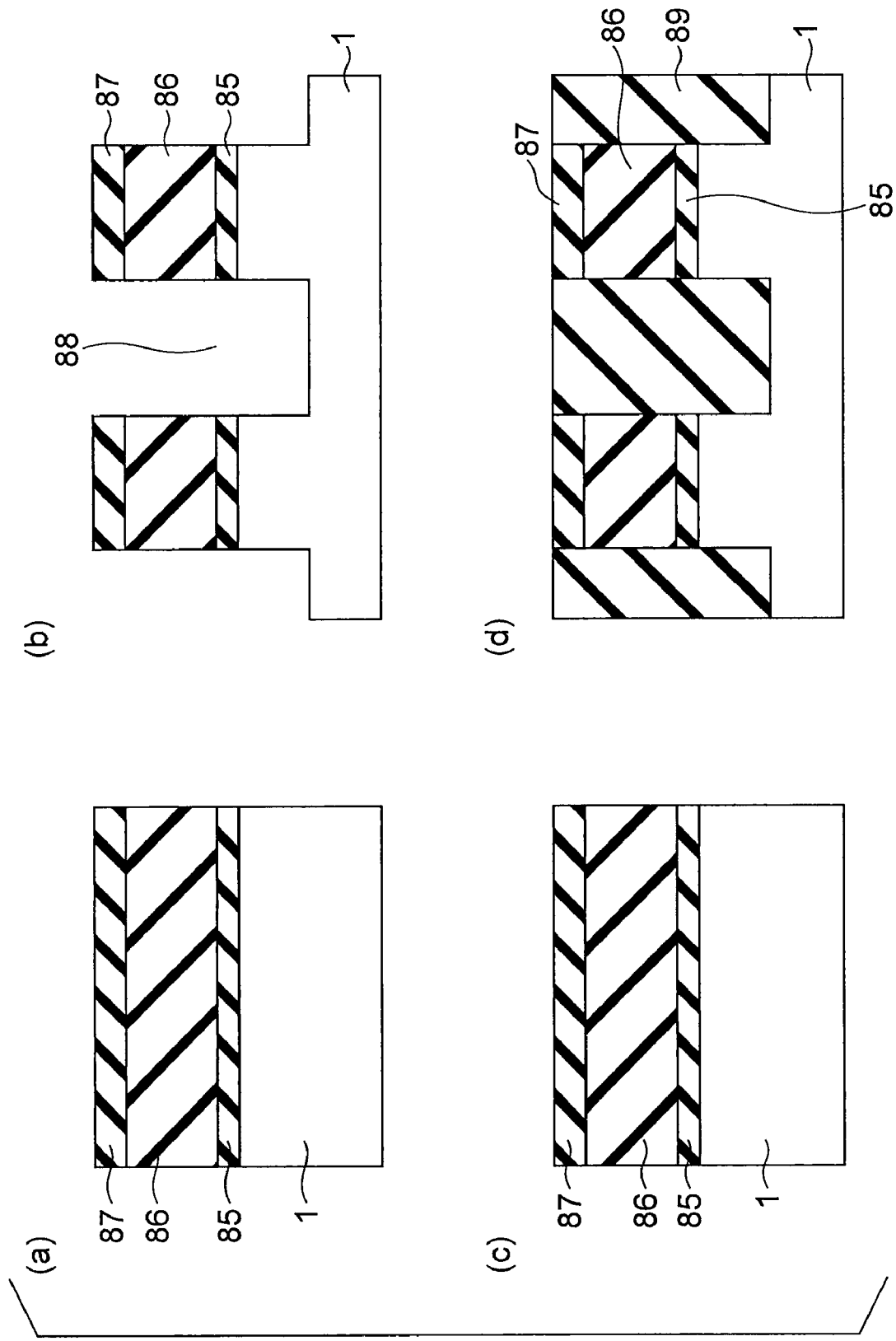

A 6-nm thick nitride film to be the charge storage film 86 is then deposited on the tunnel insulating film 85 by CVD, and a mask material 87 for device isolation is deposited by CVD. After that, etching is performed on the mask material 87, the nitride film (the charge storage film) 86, and the tunnel insulating film 85 in this order by RIE with the use of a resist mask (not shown). Etching is further performed on the exposed regions of the silicon substrate 1, so as to form device isolation grooves 88 of 100 nm in depth, as shown in FIGS. 30(a) and 30(b).

A silicon oxide film 89 for device isolation is then deposited on the entire surface, so as to completely fill the device isolation grooves 88. After that, the portion of the silicon oxide film 89 on the surface is removed by CMP, so that the surface is flattened. At this point, the mask material 87 is exposed (see FIGS. 30(c) and 30(d)).

Figure 31:
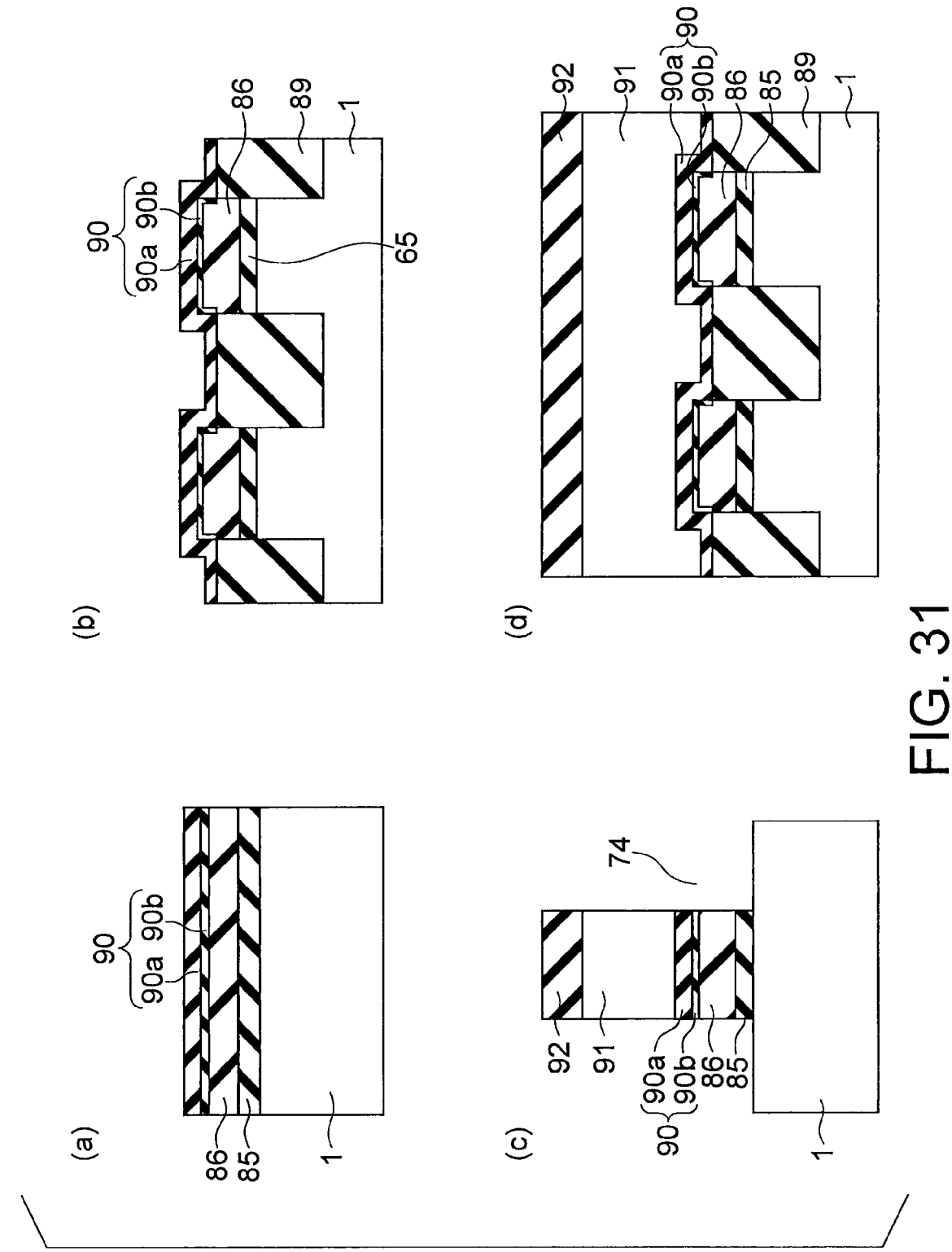

The exposed mask material 87 is selectively removed by etching, and the exposed surface portions of the silicon oxide film 89 are removed by etching with the use of a diluted hydrofluoric acid solution. After that, a 15-nm thick alumina layer 90a to be the interelectrode insulating film is formed on the entire surface by ALD. Due to the oxidizing agent used in the film formation by ALD, a very thin silicon oxide layer 90b is formed at the interface between the alumina layer 90a and the charge storage film 86. As a result, a 16-nm thick interelectrode insulating film 90 having a two-layer structure consisting of the alumina layer 90a and the silicon oxide layer 90b is formed (see FIGS. 31(a) and 31(b)).

A 100-nm thick conductive film 91 having a two-layer structure consisting of a polycrystalline silicon layer and a tungsten silicide layer is formed to be the control gate electrode in the same manner as in the first embodiment. Further, a mask material 92 for RIE is deposited by CVD. After that, etching is performed by RIE with the use of a resist mask (not shown) on the mask material 92, the conductive film 91, the interelectrode insulating film 90, the charge storage film 86, and the tunnel insulating film 85 in this order, so as to form the gate having a stacked structure. In this manner, the shape of the gate having the stacked structure is defined, and grooves 94 extending in the word-line direction are formed on the side of this gate having the stacked structure (see FIGS. 31(c) and 31(d)).

As shown in FIGS. 32(a) and 32(b), a silicon oxide film 96 is then formed on the side faces and the upper face of the gate having the stacked structure by a thermal oxidation technique. After that, the source and drain regions 97a and 97b are formed by an ion injection technique. The region of the silicon substrate 1 located between the source region 97a and the drain region 97b is the channel region 98. Further, an interlayer insulating film 99 is formed to cover the entire surface by CVD (see FIGS. 32(a) and 32(b)). After that, a wiring layer and the likes are formed by known techniques, so as to complete the nonvolatile semiconductor memory.

Figure 33:
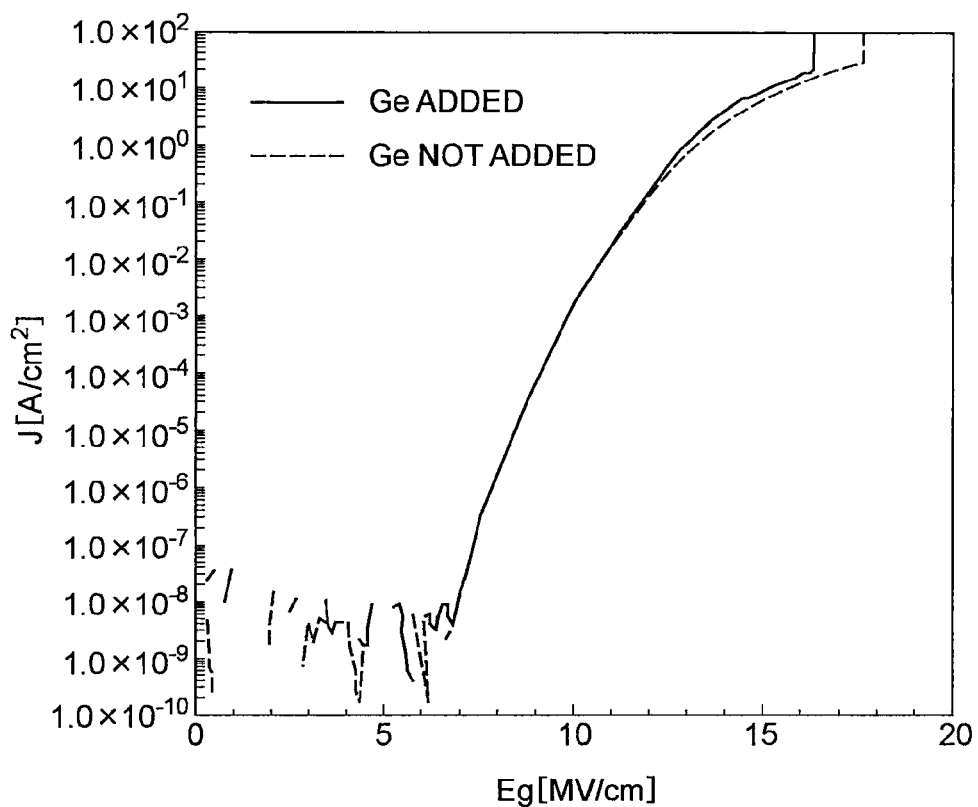
FIG. 33 illustrates the effects of adding Ge to the silicon oxide layer.
Figure 34:
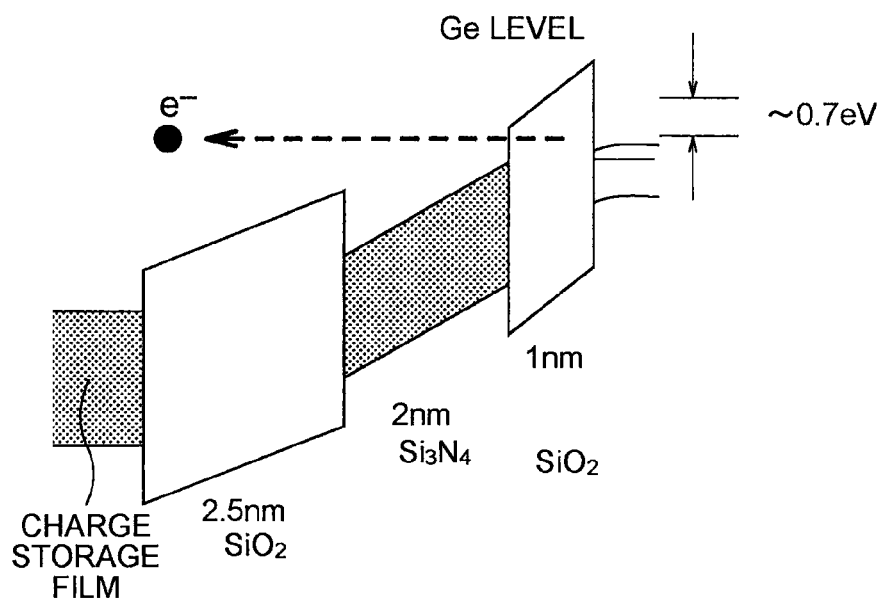
FIG. 34 is an energy band diagram of a case where Ge is added to the silicon oxide layer.

Referring now to FIGS. 33 and 34, the effect of adding Ge to the silicon oxide layer 82 is described. FIG. 33 shows the variations in the electric field required to generate 0.1 A/cm² of leakage current, with respect to a case where Ge is added to the silicon oxide layer, and a case where Ge is not added. As can be seen from FIG. 33, the induced electric field is reduced by 1 MV/cm or more through the Ge addition. This is because, as an electric field is induced, the energy level of the Ge level in the $SiO_2$ layer 82 becomes lower than the Fermi level on the substrate side, and the electron tunneling probability becomes higher. In this manner, a high-quality stacked structure that has excellent electron injection efficiency and is formed with a $SiO_2$ layer, a SiON layer, and a $SiO_2$ layer can be realized by adding Ge to the silicon oxide layer 82.

The silicon oxynitride layer 83 has a layer thickness of 1.5 nm to 2.5 nm, and nitrogen concentration of 20 atomic % to 47 atomic %. In other words, 10 atomic % to 30 atomic % of oxygen is contained in the silicon oxynitride layer 83, and at least one of the second nearest neighbor atoms of the silicon is nitrogen. This is because oxygen is added to the amorphous silicon layer. In the silicon oxide layer 82, a small amount of nitrogen is diffused when the amorphous silicon layer is nitrided. Therefore, an average of 10 atomic % of nitrogen is contained at a maximum.

In this embodiment, radical nitridation or plasma nitridation is performed on the surface of the silicon oxide layer. However, to prevent nitrogen from penetrating through the silicon oxide layer, it is not necessary to perform radical nitridation or plasma nitridation, and $NH_3$ or NO may be used instead.

Although an $O_2$ gas is used when oxygen is added to the amorphous silicon layer in this embodiment, the gas used at the time of adding oxygen is not limited to an $O_2$ gas, and it is possible to use any oxidizing gas such as NO, $N_2O$, $O_3$, O radicals, or O plasma. However, those gases differ from $O_2$ in oxidation power. Therefore, when one of those gases is used, it is necessary to adjust the oxygen adding conditions in such a manner that the oxygen concentration in the silicon oxynitride layer 83 is in the range of 10 atomic % to 30 atomic %.

Although a $NH_3$ gas is used when the amorphous silicon layer is nitrided in this embodiment, the gas used at the time of nitridation is not limited to a $NH_3$ gas, and it is possible to use any nitriding gas such as NO, N radicals, NH radicals, $N_2$ radicals, N plasma, NH plasma, or $N_2$ plasma.

Although HTO is used in the process for forming the silicon oxide layer 84 in this embodiment, some other technique such as CVD or ALD may be used, as long as the silicon oxide layer 84 can be properly deposited.

In this embodiment, a heat treatment is carried out in an oxidizing atmosphere after the oxide layer is deposited by HTO. This greatly reduces the hydrogen in the stacked structure formed with a $SiO_2$ layer, a SiON layer, and a $SiO_2$ layer. Accordingly, as long as a heat treatment is carried out in an oxidizing atmosphere after the oxide layer is deposited by HTO, the temperature at which oxygen is added to the amorphous silicon layer and the temperature at which nitridation is performed on the amorphous silicon layer may not be very high, and may be 400° C. or higher.

As described so far, this embodiment can provide a semiconductor device that has a high-quality tunnel insulating film in which defects are not easily formed. This semiconductor device experiences less leakage current.

In the first to fifth embodiments, it is preferable that the amorphous silicon layer is thinner than 2.5 nm. If the layer thickness of the amorphous silicon layer is 2.5 nm or greater, the following two adverse effects appear. 1) Sufficient nitridation cannot be performed on the amorphous silicon in the later nitriding procedure, and Si atoms that are not bonded to nitrogen remains as defects in the film. As a result, the characteristics of the insulating film are degraded. 2) Since the Si defects are easily oxidized in the later oxidizing procedure, the oxygen concentration in the oxynitride layer, and the high injection efficiency as a feature of the insulating film of the $SiO_2/SiON/SiO_2$ stacked structure becomes lower.

Figure 35:
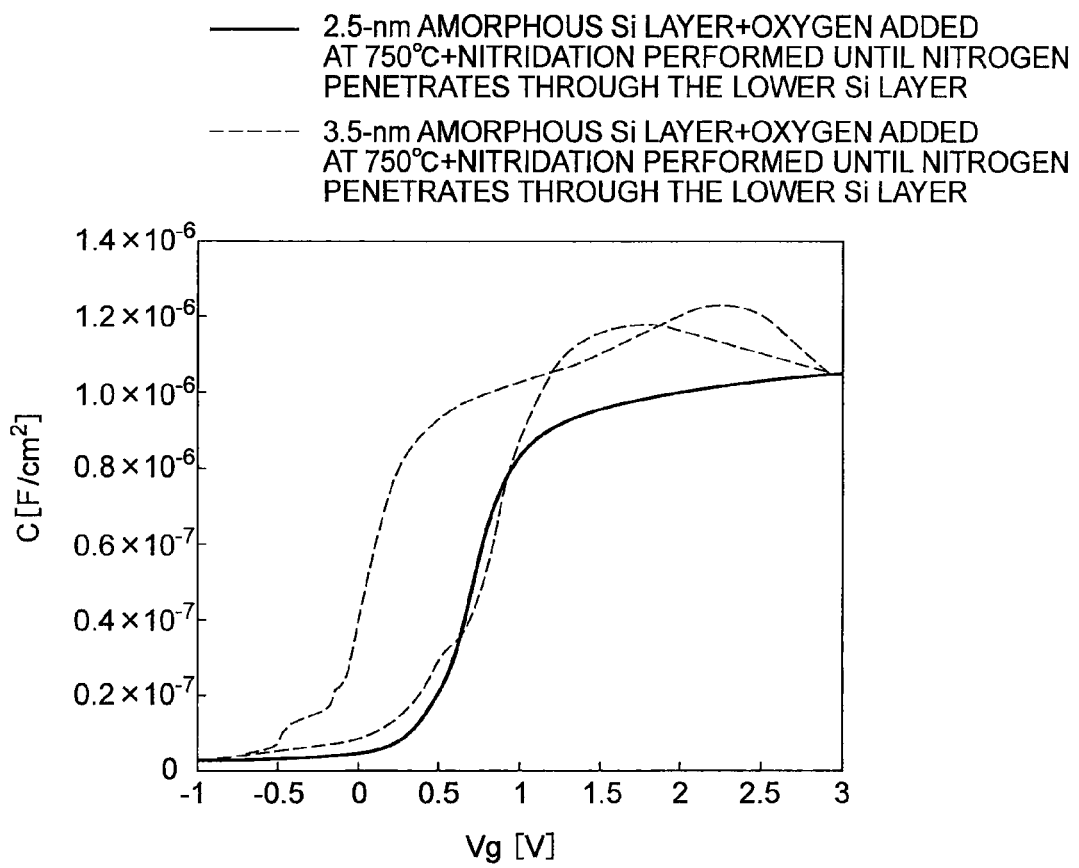
FIG. 35 illustrates the reason to define the layer thickness of the amorphous silicon layer.

FIG. 35 shows the C-V characteristics observed in a case where samples each formed by depositing an amorphous silicon layer on a $SiO_2$ layer on a silicon substrate are prepared, oxygen is added to each of the samples at 750° C. for ten seconds, and nitridation is performed on each of the samples until nitrogen penetrates through the $SiO_2$ layer. In a case where the layer thickness of the amorphous silicon layer is 2.5 nm, the interface state is formed as the interface between the $SiO_2$ layer and the silicon substrate is nitrided, but hysteresis is not observed in the C-V characteristics. This indicates that the amorphous silicon layer of 2.5 nm in layer thickness is nitrided, with only a very small number of defects being formed.

In a case where the layer thickness of the amorphous silicon layer is 3.5 nm, not only the interface state is formed, but also large hysteresis occurs in the C-V characteristics. The existence of hysteresis means that a Si structure is locally formed in the nitride layer (or a Si bandgap exists locally in the bandgap of the nitride layer), and the Si structure functions as the charge storage source. This indicates that, if the layer thickness of the amorphous silicon layer is larger than 2.5 nm, nitrogen is diffused into the base layer while the amorphous silicon layer remains not completely nitrided.

Accordingly, it is preferable that the layer thickness of the amorphous silicon layer is smaller than 2.5 nm, as shown in each embodiment of the present invention.

Figure 36:
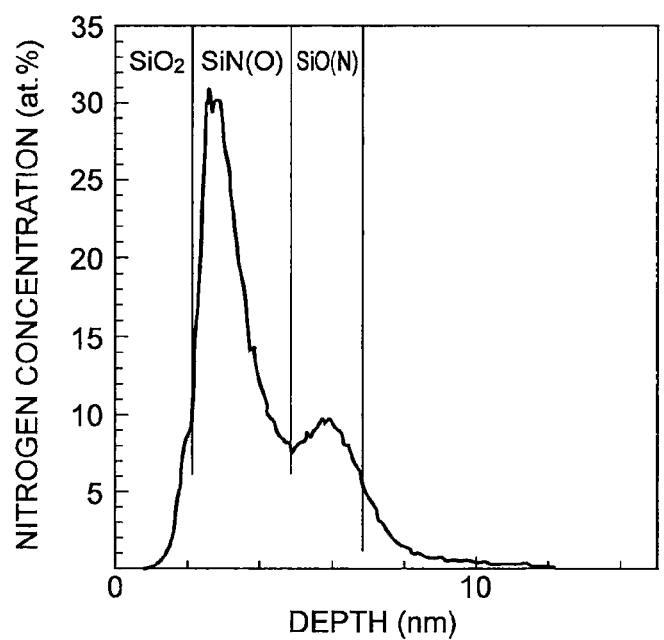
FIG. 36 illustrates the defined distribution of the nitrogen concentration in the tunnel insulating film having a three-layer stacked structure.
Figure 37:
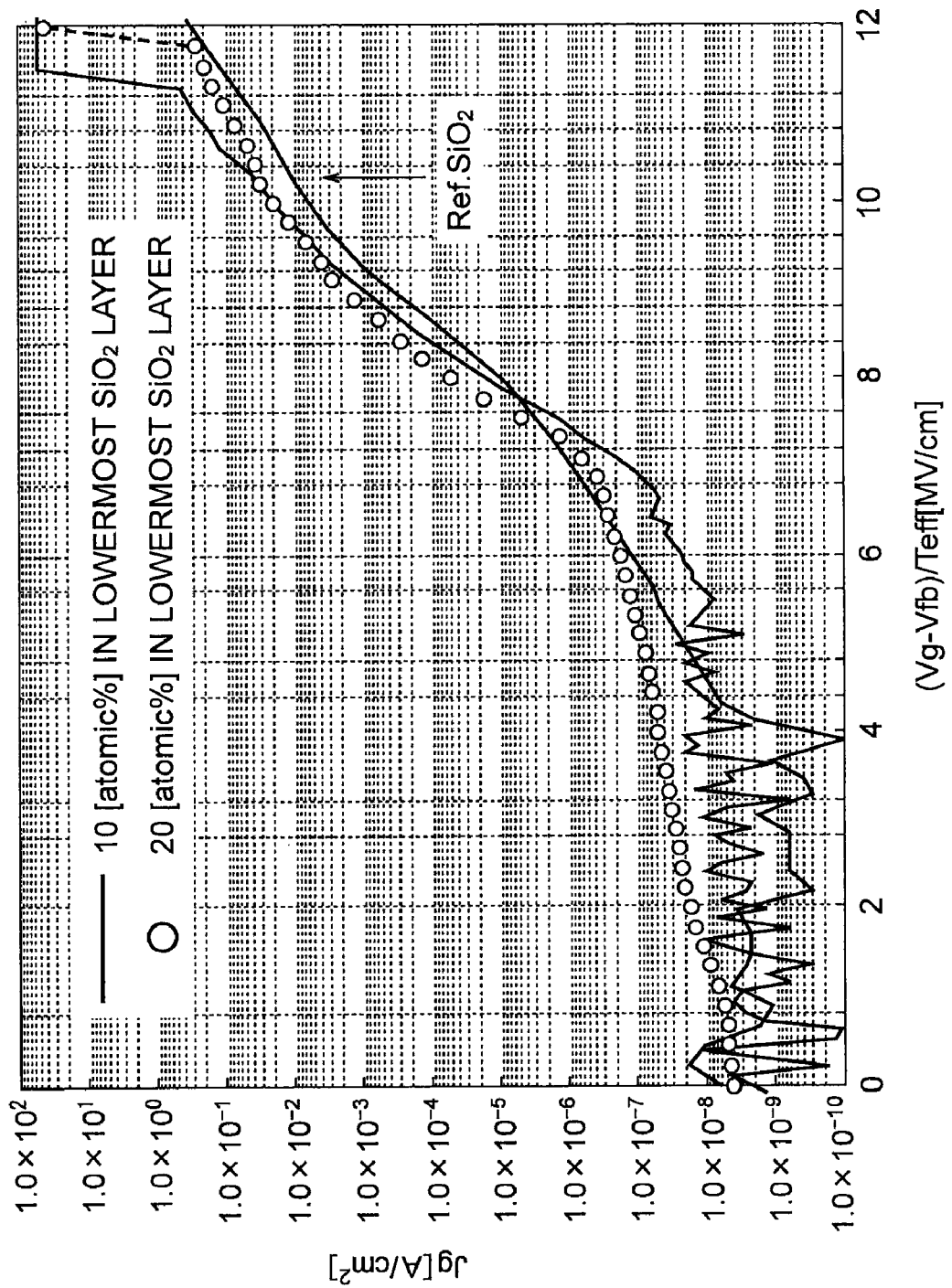
FIG. 37 also illustrates the defined distribution of the nitrogen concentration in the tunnel insulating film having a three-layer stacked structure.

In the tunnel insulating film having the $SiO_2/SiON/SiO_2$ stacked structure of each embodiment of the present invention, nitrogen shows the following distribution characteristics. As shown in FIG. 36, there is a continuous region having nitrogen concentration of 20 atomic % or higher in a region 5 nm or less from the surface of the $SiO_2/SiON/SiO_2$ stacked structure. This continuous region has a physical film thickness of 1 nm or more. In the lowermost $SiO_2$ layer, a nitrogen distribution with concentration of 10 atomic % or less exists between the lower interface and the upper interface. Here, it is preferable that the nitrogen concentration in the lowermost $SiO_2$ layer is 10 atomic % or less, because the leakage current on the low-and-medium field side increases as the nitrogen concentration becomes higher, as shown in FIG. 37.

In the first to fifth embodiments, each semiconductor device is a nonvolatile semiconductor memory. However, the tunnel insulating film having the three-layer stacked structure formed with a silicon oxide layer, a silicon oxynitride layer, and a silicon oxide layer may be used as the gate insulating film of a MOS transistor. The tunnel insulating film may also be used as the interelectrode insulating film in each of the first to fifth embodiments. In any of those cases, a layer made of a high-k material (such as Hf, La, or a silicate of Hf or La) may be used in place of the silicon oxide layer as the insulating layer serving as the base layer on which the amorphous silicon layer to be the silicon oxynitride layer is formed.

As described so far, each embodiment of the present invention can provide a semiconductor device that has a high-quality insulating film in which defects are not easily formed, and experiences less leakage current. Each embodiment can also provide a method for manufacturing such a semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A method for manufacturing a semiconductor device, comprising:
    forming a first silicon oxide layer on a silicon substrate;
    forming a first silicon oxynitride layer by nitriding the first silicon oxide layer;
    forming an amorphous silicon layer on the first silicon oxynitride layer;
    introducing oxygen into the amorphous silicon layer;
    forming a second silicon oxynitride layer by nitriding the amorphous silicon layer having oxygen introduced thereinto; and
    forming a second silicon oxide layer on the second silicon oxynitride layer, thereby forming a three-layer structure including the first silicon oxynitride layer having an average nitrogen concentration higher than 0 atomic % but not higher than 10 atomic %, the second silicon oxynitride layer having an average oxygen concentration in the range of 10 atomic % to 30 atomic %, and the second silicon oxide layer.

2. The method according to claim 1, further comprising nitriding a surface of the first silicon oxide layer before forming the amorphous silicon layer on the first silicon oxide layer.

3. The method according to claim 2, further comprising introducing Ge into the first silicon oxide layer before nitriding the surface of the first silicon oxide layer.

4. The method according to claim 1, further comprising oxidizing the second silicon oxynitride layer before forming the second silicon oxide layer.

5. The method according to claim 1, further comprising performing oxidation to the three-layer structure in an oxidizing atmosphere at a temperature between 900° C. and 950° C. for ten minutes or longer, after forming the three-layer structure including the first silicon oxynitride layer, the second silicon oxynitride layer, and the second silicon oxide layer.

6. The method according to claim 1, wherein the introducing oxygen into the amorphous silicon layer includes introducing oxygen into the amorphous silicon layer in an atmosphere of an oxidizing gas at a temperature between 700° C. and 800° C. for ten seconds or shorter.

7. The method according to claim 6, wherein the oxidizing gas contains $O_2$, NO, $N_2O$, $O_3$, O radicals, or O plasma.

8. The method according to claim 1, wherein the forming the second silicon oxynitride layer by nitriding the amorphous silicon layer includes nitriding the amorphous silicon layer at a temperature between 600° C. and 750° C.

9. A semiconductor device comprising an insulating film, the insulating film including:
    a first silicon oxynitride layer formed on a silicon substrate and having average nitrogen concentration higher than 0 atomic % but not higher than 10 atomic %;
    a second silicon oxynitride layer formed on the first silicon oxynitride layer and having average oxygen concentration in the range of 10 atomic % to 30 atomic %; and
    a silicon oxide layer formed on the second silicon oxynitride layer.

10. The device according to claim 9, wherein the second silicon oxynitride layer has average nitrogen concentration in the range of 20 atomic % to 47 atomic %.

11. The device according to claim 9, wherein the first silicon oxynitride layer contains Ge.

* * * * *